US012765052B2

(12) United States Patent
Kim et al.

(10) Patent No.: US 12,765,052 B2
(45) Date of Patent: Oct. 13, 2026

(54) SEMICONDUCTOR DEVICE AND METHOD OF FABRICATING THE SAME

(71) Applicant: Samsung Electronics Co., Ltd., Suwon-si (KR)

(72) Inventors: Munhyeon Kim, Hwaseong-si (KR); Mingyu Kim, Hwaseong-si (KR); Doyoung Choi, Hwaseong-si (KR); Daewon Ha, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 272 days.

(21) Appl. No.: 18/430,902

(22) Filed: Feb. 2, 2024

(65) Prior Publication Data

US 2024/0178229 A1 May 30, 2024

Related U.S. Application Data

(63) Continuation of application No. 17/394,580, filed on Aug. 5, 2021, now Pat. No. 11,908,861.

(30) Foreign Application Priority Data

Dec. 4, 2020 (KR) ........................ 10-2020-0168315

(51) Int. Cl.
*H10D 84/85* (2025.01)

(52) U.S. Cl.
CPC ................................ *H10D 84/856* (2025.01)

(58) Field of Classification Search
CPC .... H10D 84/856; H10D 30/014; H10D 30/43; H10D 62/364; H10D 62/116; H10D 62/121; H10D 62/151; H10D 84/85; H10D 84/017; H10D 84/038; H10D 84/0184; H10D 84/83; H10D 30/6735; H10D 84/0172; H10D 30/6757; H10D 84/0167; H10D 84/0181; B82Y 10/00; H10W 20/42; H10W 20/435
See application file for complete search history.

(56) References Cited

U.S. PATENT DOCUMENTS

| | | | |
|---|---|---|---|
| 9,406,682 | B2 | 8/2016 | Basker et al. |
| 9,991,165 | B1 | 6/2018 | Huang |
| 10,008,417 | B1 | 6/2018 | Bao et al. |

(Continued)

FOREIGN PATENT DOCUMENTS

| | | | |
|---|---|---|---|
| CN | 106549059 | A | 3/2017 |
| CN | 107068537 | A | 8/2017 |

(Continued)

*Primary Examiner* — Fernando L Toledo
*Assistant Examiner* — Adam S Bowen
(74) *Attorney, Agent, or Firm* — Wolf, Greenfield & Sacks, P.C.

(57) ABSTRACT

A semiconductor device is disclosed. The semiconductor device may include an active pattern on a substrate, source/drain patterns on the active pattern, a fence spacer on side surfaces of each of the source/drain patterns, a channel pattern interposed between the source/drain patterns, a gate electrode crossing the channel pattern and extending in a first direction, and a gate spacer on a side surface of the gate electrode. A first thickness of an upper portion of the fence spacer in the first direction may be greater than a second thickness of the gate spacer in a second direction crossing the first direction.

20 Claims, 47 Drawing Sheets

(56) References Cited

U.S. PATENT DOCUMENTS

| | | | | |
|---|---|---|---|---|
| 10,079,305 | B2 | 9/2018 | Lee et al. | |
| 10,431,473 | B2 | 10/2019 | Ching et al. | |
| 10,453,838 | B2 | 10/2019 | Jun et al. | |
| 10,553,484 | B2 | 2/2020 | Gwak et al. | |
| 10,763,335 | B2 | 9/2020 | Chung et al. | |
| 2017/0148914 | A1 | 5/2017 | Lee et al. | |
| 2018/0130796 | A1 | 5/2018 | Jun et al. | |
| 2018/0212029 | A1 | 7/2018 | Xu et al. | |
| 2019/0067125 | A1 | 2/2019 | Chiang et al. | |
| 2019/0131394 | A1 | 5/2019 | Reznicek et al. | |
| 2019/0252493 | A1 | 8/2019 | Chao et al. | |
| 2019/0304984 | A1 | 10/2019 | Chang et al. | |
| 2020/0105620 | A1 | 4/2020 | Tan et al. | |
| 2020/0105902 | A1 | 4/2020 | Ching et al. | |
| 2020/0266060 | A1 | 8/2020 | Cheng et al. | |
| 2020/0273964 | A1 | 8/2020 | Lin et al. | |
| 2020/0365690 | A1 | 11/2020 | Jeong et al. | |
| 2021/0226020 | A1* | 7/2021 | Lin .................... | H10D 30/6757 |
| 2021/0359091 | A1 | 11/2021 | Hsu et al. | |
| 2021/0376095 | A1 | 12/2021 | Chen et al. | |
| 2022/0037340 | A1 | 2/2022 | Yang et al. | |

FOREIGN PATENT DOCUMENTS

| | | | |
|---|---|---|---|
| JP | 2020-523783 | A | 8/2020 |
| KR | 10-2018-0052169 | A | 5/2018 |
| KR | 10-2020-0000720 | A | 1/2020 |
| WO | WO 2018/229606 | A1 | 12/2018 |

* cited by examiner

SEMICONDUCTOR DEVICE AND METHOD OF FABRICATING THE SAME

CROSS-REFERENCE TO RELATED APPLICATIONS

The present application is a continuation of and claims priority to U.S. patent application Ser. No. 17/394,580, filed Aug. 5, 2021, which claims priority under 35 U.S.C. § 119 to Korean Patent Application No. 10-2020-0168315, filed on Dec. 4, 2020, the entire contents of which are hereby incorporated by reference.

FIELD

The present disclosure relates to a semiconductor device and a method of fabricating the same, and in particular, to a semiconductor device including a field effect transistor and a method of fabricating the same.

BACKGROUND

A semiconductor device includes integrated circuits, such as metal-oxide-semiconductor field-effect transistors (MOSFETs). To meet increasing demand for a semiconductor device with a small pattern size and a reduced design rule, MOSFETs may be aggressively scaled down. The scale-down of the MOSFETs may lead to deterioration in operational properties of the semiconductor device. Research is being conducted to overcome technical limitations associated with the scale-down of the semiconductor device and to realize higher performance semiconductor devices.

SUMMARY

An embodiment of the inventive concept provides a semiconductor device with an increased integration density.

An embodiment of the inventive concept provides a method of fabricating a highly-integrated semiconductor device.

According to an embodiment of the inventive concept, a semiconductor device may include an active pattern on a substrate, a pair of source/drain patterns on the active pattern, a fence spacer on opposing side surfaces of each of the pair of source/drain patterns, a channel pattern extending between the pair of source/drain patterns, a gate electrode crossing the channel pattern and extending in a first direction, and a gate spacer on a side surface of the gate electrode. A first thickness of an upper portion of the fence spacer in the first direction may be greater than a second thickness of the gate spacer in a second direction crossing the first direction.

According to an embodiment of the inventive concept, a semiconductor device may include a first active pattern on a first region of a substrate, a pair of first source/drain patterns on the first active pattern, a first fence spacer on opposing side surfaces of each of the pair of first source/drain patterns, a first channel pattern extending between the pair of first source/drain patterns, a first gate electrode crossing the first channel pattern and extending in a first direction, and a first gate spacer on a side surface of the first gate electrode. A first thickness of an upper portion of the first fence spacer in the first direction may be greater than a third thickness of a lower portion of the first fence spacer in the first direction.

According to an embodiment of the inventive concept, a semiconductor device may include an active pattern on a substrate, a pair of source/drain patterns on the active pattern, a fence spacer on opposing side surfaces of each of the pair of source/drain patterns, a channel pattern extending between the pair of source/drain patterns, a gate electrode crossing the channel pattern and extending in a first direction, a gate insulating layer between the gate electrode and the channel pattern, a gate spacer on a side surface of the gate electrode, a gate capping pattern provided on a top surface of the gate electrode, a first interlayer insulating layer on the gate capping pattern, active contacts extending through the first interlayer insulating layer and contacting the source/drain patterns, a second interlayer insulating layer on the first interlayer insulating layer, gate contacts extending through the first interlayer insulating layer and contacting the gate electrode, a second interlayer insulating layer on the first interlayer insulating layer, a first metal layer provided in the second interlayer insulating layer, the first metal layer including first interconnection lines, which are electrically and respectively connected to the active contacts and the gate contacts and extend in a second direction crossing the first direction to be parallel to each other, a third interlayer insulating layer on the second interlayer insulating layer, and a second metal layer provided in the third interlayer insulating layer. The second metal layer may include second interconnection lines, which are electrically and respectively connected to the first interconnection lines and extend in the first direction to be parallel to each other. A first thickness of an upper portion of the fence spacer in the first direction may be greater than a second thickness of the gate spacer in the second direction.

According to an embodiment of the inventive concept, a method of fabricating a semiconductor device may include forming active patterns extending in a second direction on a substrate, forming sacrificial gate patterns crossing the active patterns and extending in a first direction, forming a first spacer layer on side surfaces of the active patterns and side surfaces of the sacrificial gate patterns, performing a first directional deposition process on the first spacer layer in the first direction and in a direction opposite to the first direction to form a second spacer layer on the first spacer layer, removing portions of the active patterns that are exposed between the sacrificial gate patterns to form recesses between the sacrificial gate patterns, forming source/drain patterns in the recesses, and replacing the sacrificial gate patterns with gate electrodes.

DETAILED DESCRIPTION

Figure 1:
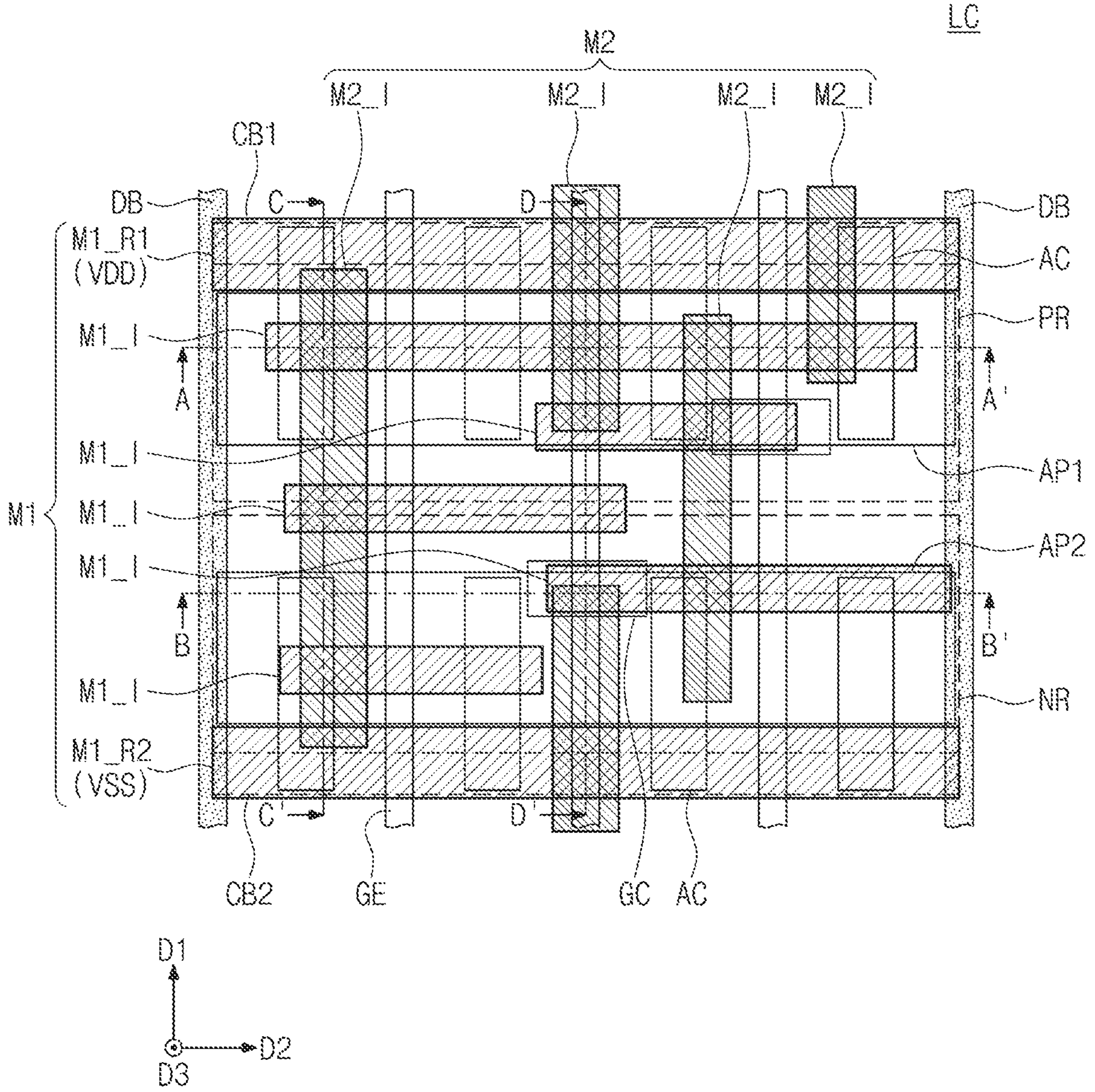
FIG. 1 is a plan view illustrating a semiconductor device according to an embodiment of the inventive concept.
Figure 2A:
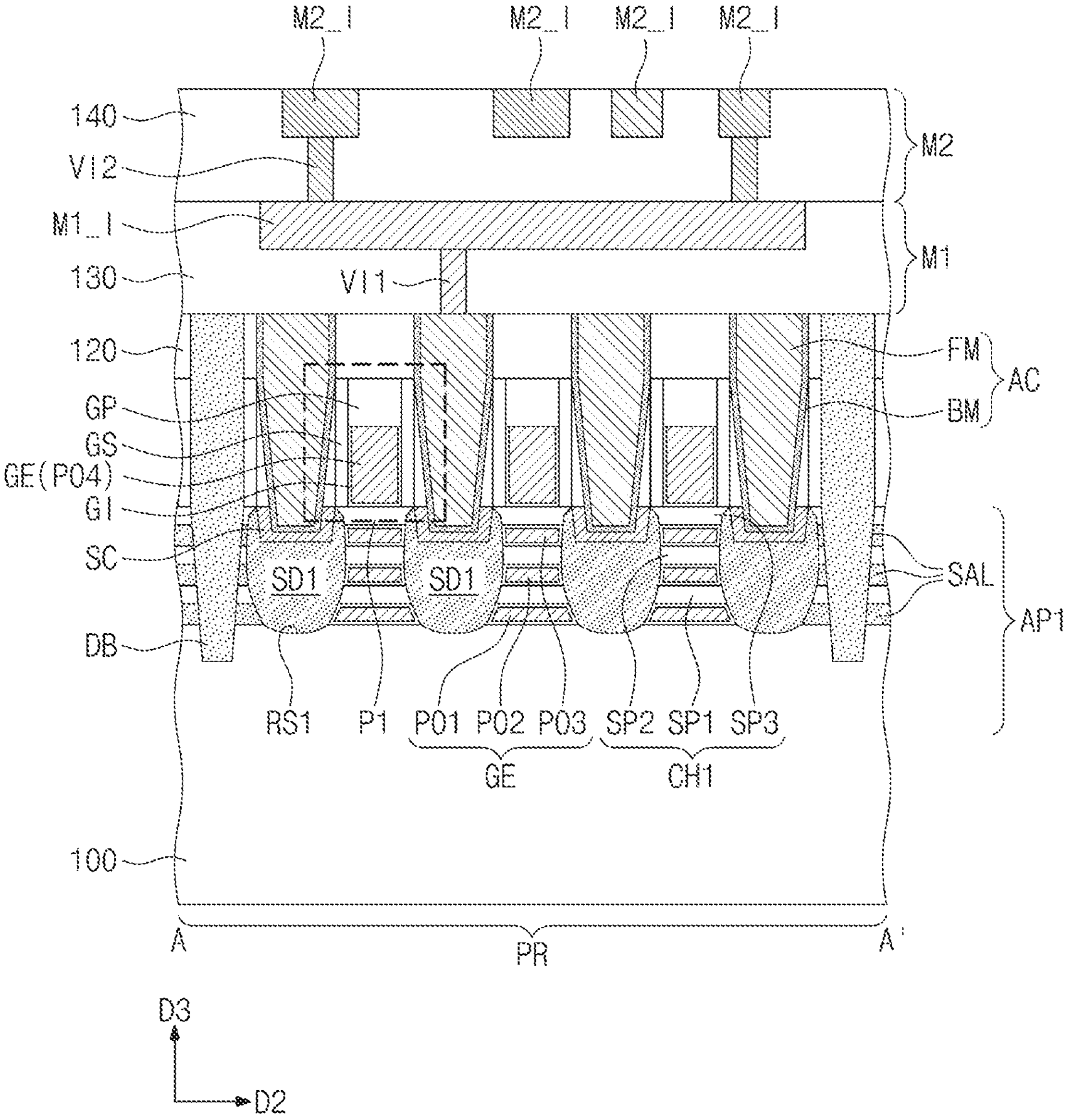
FIGS. 2A, 2B, 2C, and 2D are sectional views taken along lines A-A', B-B', C-C', and D-D' of FIG. 1, respectively.
Figure 2B:
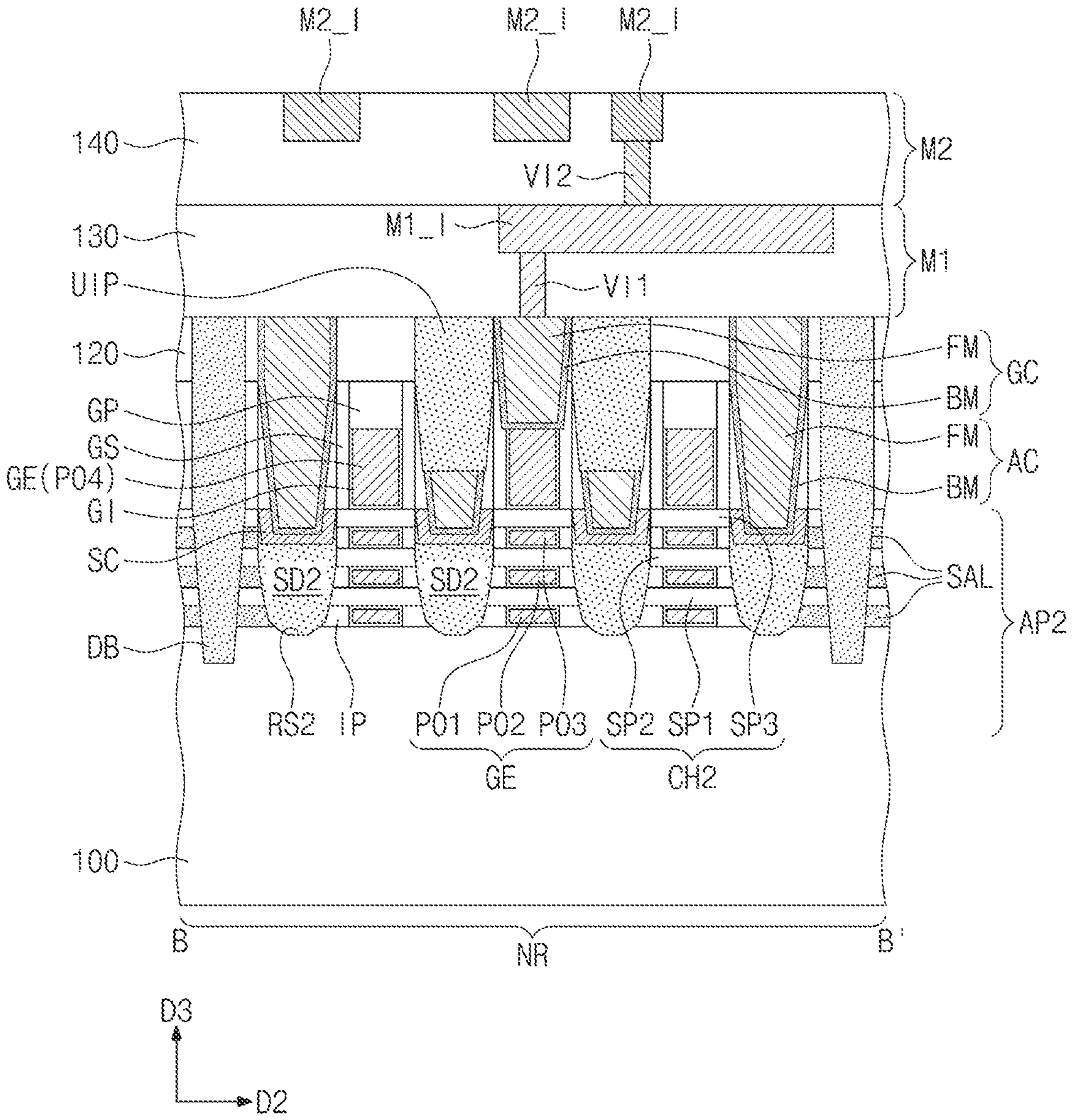

FIG. 1 is a plan view illustrating a semiconductor device according to an embodiment of the inventive concept. FIGS. 2A to 2D are sectional views taken along lines A-A', B-B', C-C', and D-D' of FIG. 1, respectively. FIG. 3A is an enlarged sectional view of a portion P1 of FIG. 2A. FIG. 3B is an enlarged sectional view of a portion P2 of FIG. 2C. FIG. 3C is an enlarged sectional view of a portion P3 of FIG. 2C.

Referring to FIGS. 1 and 2A to 2D, a semiconductor device may be integrated on a substrate 100. In an embodiment, the semiconductor device may be a logic cell, but the inventive concept is not limited to this example. For example, the semiconductor device may be a memory device, such as a static random access memory (SRAM). The description that follows will refer to an example, in which the semiconductor device is the logic cell.

A logic cell LC may be provided on a substrate 100. Logic transistors constituting a logic circuit may be disposed on the logic cell LC. The substrate 100 may be a semiconductor substrate, which is formed of or includes silicon, germanium, silicon-germanium, or the like, or a compound semiconductor substrate. As an example, the substrate 100 may be a silicon wafer.

The logic cell LC may include a PMOSFET region PR and an NMOSFET region NR. The PMOSFET and NMOSFET regions PR and NR may be defined by a second trench TR2, which is formed in an upper portion of the substrate 100. In other words, the second trench TR2 may be placed between the PMOSFET and NMOSFET regions PR and NR. The terms “first,” “second,” etc. may be used herein merely to distinguish one element or layer from another. The PMOSFET and NMOSFET regions PR and NR may be spaced apart from each other, in a first direction D1, with the second trench TR2 interposed therebetween.

A first active pattern AP1 and a second active pattern AP2 may be defined by a first trench TR1, which is formed in an upper portion of the substrate 100. The first and second active patterns AP1 and AP2 may be provided on the PMOSFET and NMOSFET regions PR and NR, respectively. The first trench TR1 may be shallower than the second trench TR2. The first and second active patterns AP1 and AP2 may extend in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude above the device isolation layer ST. The device isolation layer ST may not cover the upper portions of the first and second active patterns AP1 and AP2. The device isolation layer ST may cover lower side surfaces of the first and second active patterns AP1 and AP2.

At the same level as the top surface of the device isolation layer ST, a side surface of the second active pattern AP2 may be gently sloped or inclined. For example, the second active pattern AP2 may have a third side surface SW3, which is covered with the device isolation layer ST, and a fourth side surface SW4, which is covered with a gate insulating layer GI. The second active pattern AP2 may further have a flat surface or lip portion PLP between the third and fourth side surfaces SW3 and SW4. The flat surface PLP may be provided at the same level as the top surface of the device isolation layer ST. A slope of the flat surface PLP may be gentler than that of each of the third and fourth side surfaces SW3 and SW4.

Referring back to FIGS. 1 and 2A to 2D, the first active pattern AP1 may include an upper portion serving as a first channel pattern CH1. The second active pattern AP2 may include an upper portion serving as a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include silicon (Si), germanium (Ge), or silicon-germanium (SiGe). In an embodiment, each of the first to third semiconductor patterns SP1, SP2, and SP3 may be formed of or include silicon (Si).

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between pairs or adjacent ones of the first source/drain patterns SD1. In other words, pairs of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between pairs or adjacent ones of the second source/drain patterns SD2. In other words, pairs of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which are formed by a selective epitaxial growth process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may have a largest width WM1 at a level that is higher than a top surface of a first fence spacer SS1, which will be described below. In addition, the second source/drain patterns SD2 may have a largest width WM2 at a level that is higher than a top surface of a second fence spacer SS2, which will be described below.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. Each of the first source/drain patterns SD1 may have a plurality of regions having different germanium concentrations from each other. For example, a germanium concentration of each of the first source/drain patterns SD1 may be lower at its lower portion than at its upper portion. The second source/drain patterns SD2 may be formed of or include the same semiconductor material (e.g., Si) as the substrate 100. As an example, the second source/drain patterns SD2 may not contain germanium. The first source/drain patterns SD1 may contain p-type impurities (e.g., boron). The second source/drain patterns SD2 may contain n-type impurities.

Gate electrodes GE may be provided to cross the first and second active patterns AP1 and AP2 and to extend in the first direction D1. The gate electrodes GE may be arranged with a first pitch in the second direction D2. Each of the gate electrodes GE may be overlapped with the first and second channel patterns CH1 and CH2 when viewed in a plan view.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the PMOSFET region PR may have different widths from each other. For example, the largest width of the third portion PO3 in the second direction D2 may be less than the largest width of the second portion PO2 in the second direction D2. The largest width of the first portion PO1 in the second direction D2 may be greater than the largest width of the third portion PO3 in the second direction D2.

Referring back to FIG. 2D, the gate electrode GE may be provided on a top surface TS, a bottom surface BS, and opposite side surfaces SW of each of the first to third semiconductor patterns SP1, SP2, and SP3. In other words, the logic transistor according to the present embodiment may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, SiON, or SiN. In an embodiment, the gate spacers GS may have a multi-layered structure including at least two layers, each of which is made of SiCN, SiCON, SiON, or SiN.

A gate capping pattern GP may be provided on the gate electrode GE. The gate capping pattern GP may extend along the gate electrode GE and in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

The gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D). The gate insulating layer GI may be formed of or include at least one of high-k dielectric materials (e.g., hafnium oxide) and/or silicon oxide. For example, the gate insulating layer GI may include a dipole element, and in this case, the gate insulating layer GI may be used to adjust a threshold voltage of a transistor. The dipole element may include lanthanum (La), aluminum (Al), or combinations thereof. In other words, the gate insulating layer GI may contain lanthanum (La), aluminum (Al), or combinations thereof as its impurity.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work function metal.

The first metal pattern may include a metal nitride layer. For example, the first metal pattern may include at least one of titanium (Ti), tantalum (Ta), aluminum (Al), tungsten (W) and molybdenum (Mo), or nitrogen (N). In an embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one of tungsten (W), aluminum (Al), titanium (Ti), or tantalum (Ta). For example, the fourth portion PO4 of the gate electrode GE may include the first metal pattern and the second metal pattern on the first metal pattern.

Figure 2C:
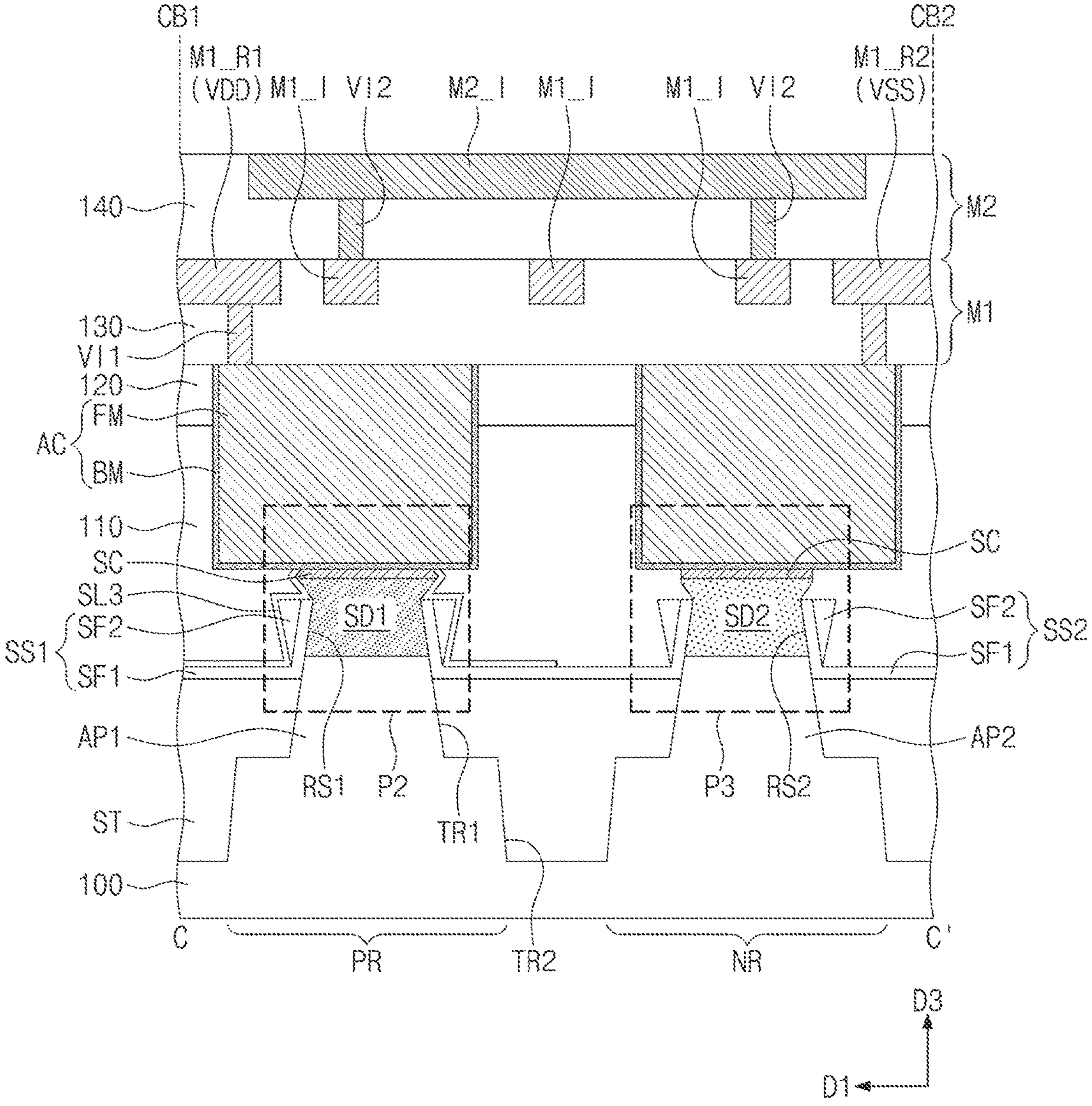
Figure 2D:
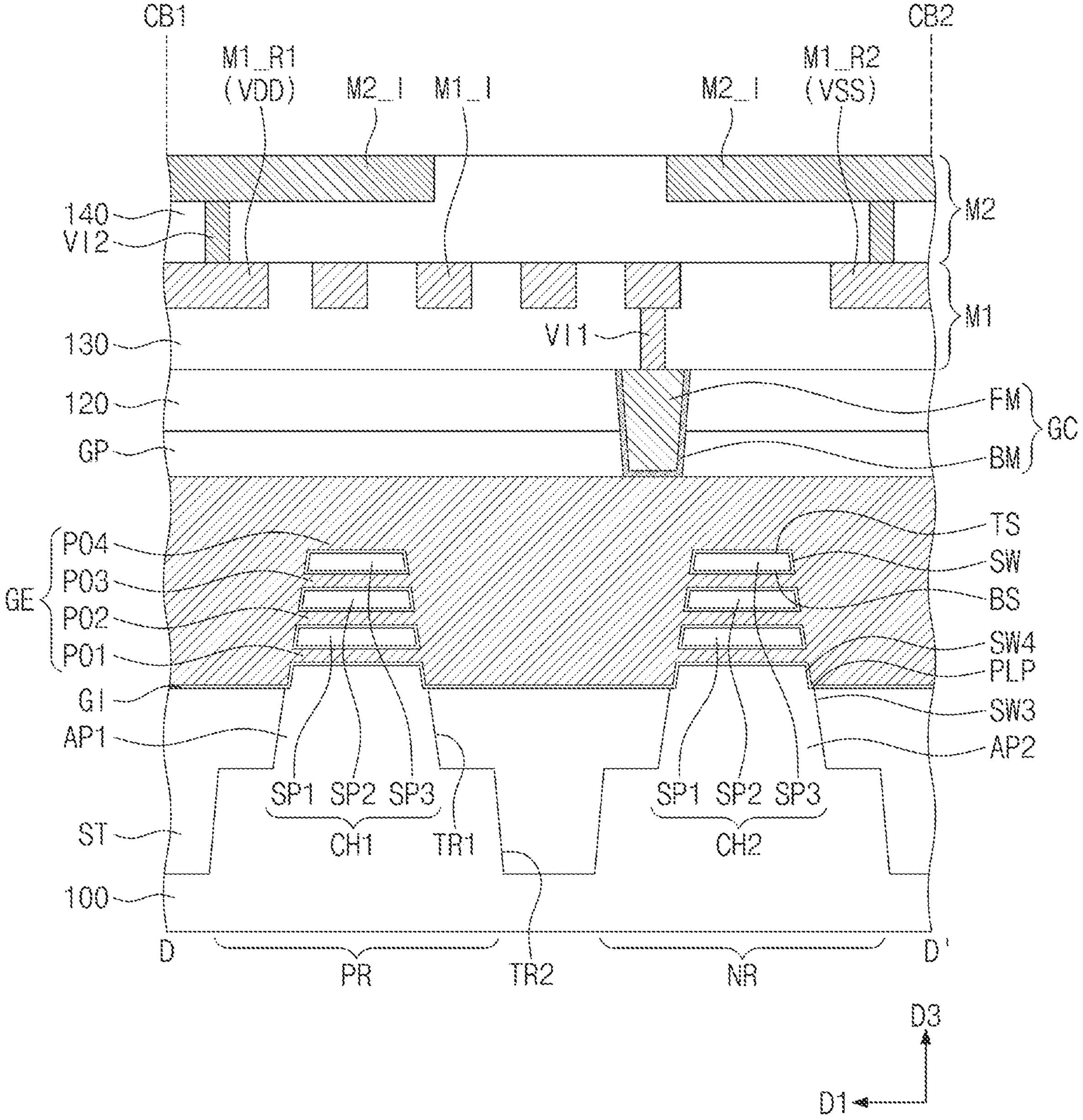
Figure 3A:
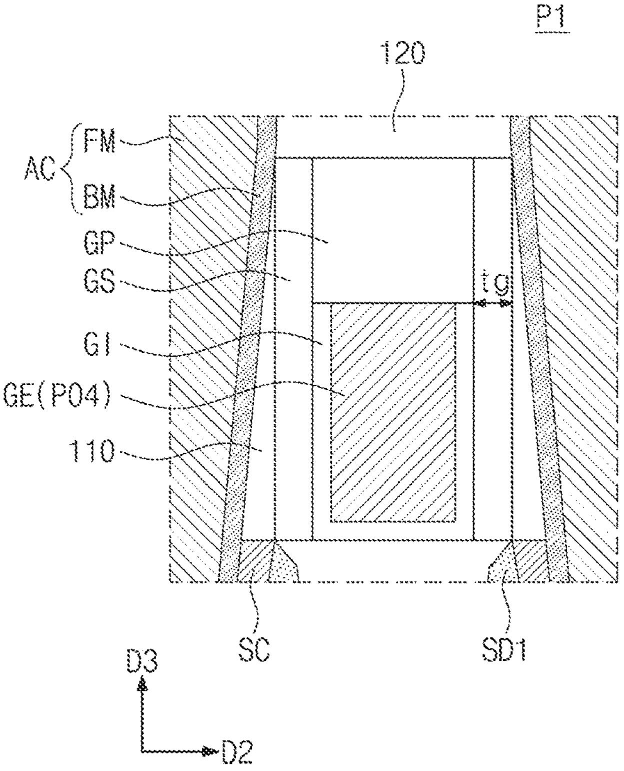
FIG. 3A is an enlarged sectional view of a portion P1 of FIG. 2A.
Figure 3B:
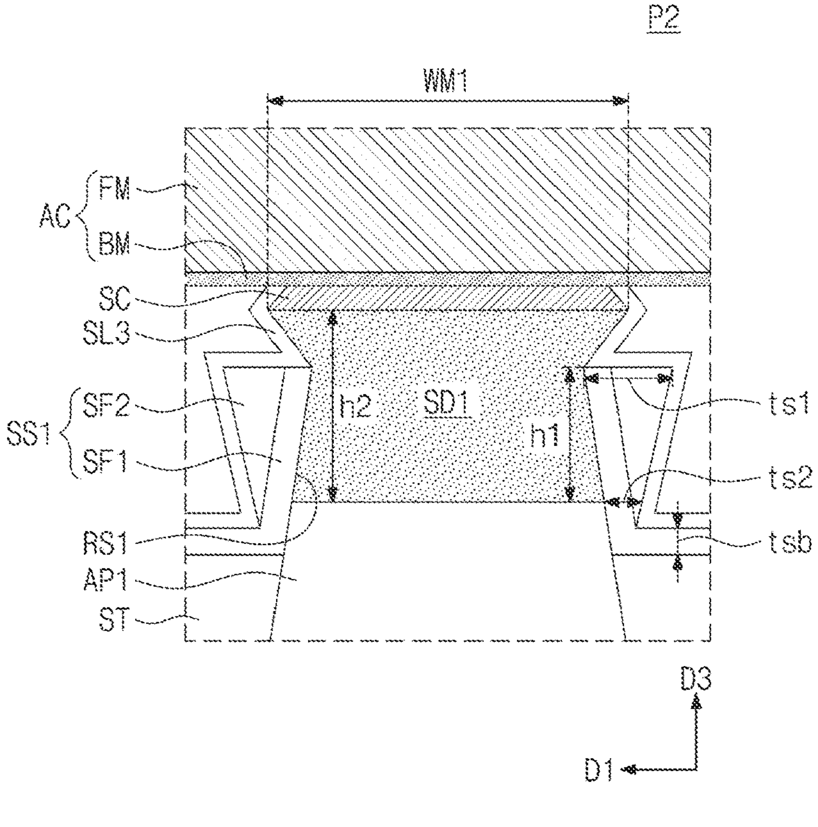
FIG. 3B is an enlarged sectional view of a portion P2 of FIG. 2C.
Figure 3C:
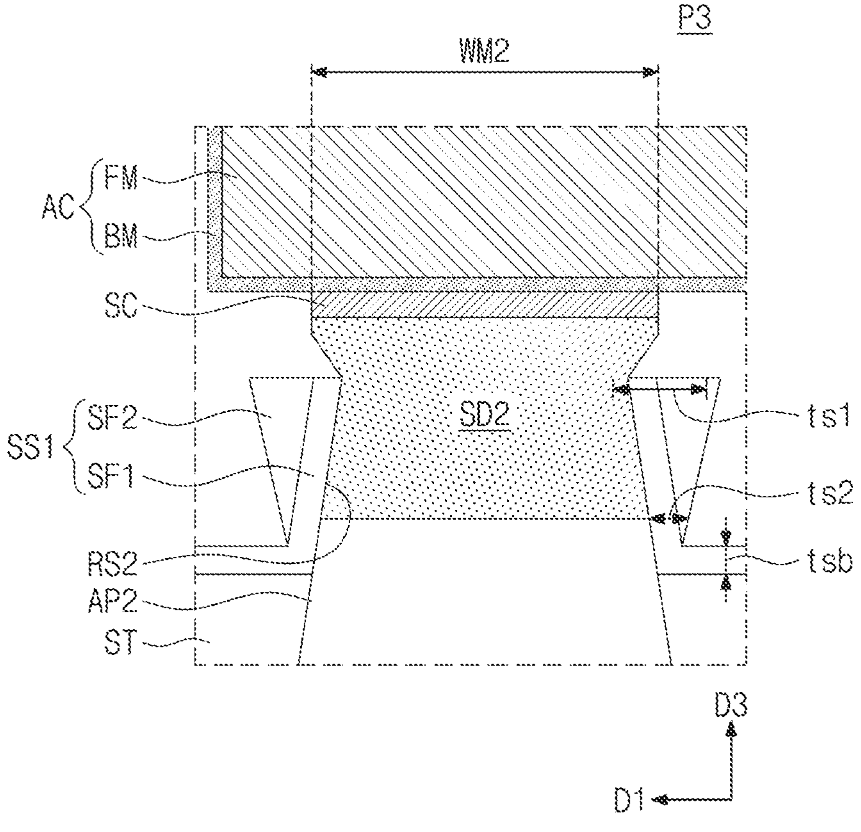
FIG. 3C is an enlarged sectional view of a portion P3 of FIG. 2C.

Referring to FIG. 2C, first fence spacers SS1 may be provided on side surfaces of the first source/drain patterns SD1, and second fence spacers SS2 may be provided on side surfaces of the second source/drain patterns SD2. The first and second fence spacers SS1 and SS2 will be described in more detail with reference to FIGS. 3A to 3C.

Referring back to FIG. 2B, insulating patterns IP may be provided on the NMOSFET region NR. Each of the insulating patterns IP may be interposed between the second source/drain pattern SD2 and a corresponding one of the first to third portions PO1, PO2, and PO3 of the gate electrode GE. The insulating patterns IP may be in direct contact with the second source/drain pattern SD2. As used herein, when elements or patterns are described as being in "direct contact" or "directly on" one another, no intervening elements or patterns are present. Each of the first to third portions PO1, PO2, and PO3 of the gate electrode GE may be spaced apart from the second source/drain pattern SD2 by the insulating pattern IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In an embodiment, at least one of the first and second interlayer insulating layers 110 and 120 may include a silicon oxide layer.

A pair of dividing structures DB, which are opposite to each other in the second direction D2, may be provided at both sides of the logic cell LC. The dividing structure DB may extend in the first direction D1 and parallel to the gate electrodes GE. A pitch between the dividing structure DB and the gate electrode GE adjacent to each other may be equal to the first pitch.

The dividing structure DB may be provided to penetrate the first and second interlayer insulating layers 110 and 120 and may extend into the first and second active patterns AP1 and AP2. The dividing structure DB may penetrate an upper portion of each of the first and second active patterns AP1 and AP2. The dividing structure DB may separate the PMOSFET and NMOSFET regions PR and NR of the logic cell LC from an active region of another logic cell adjacent thereto.

The upper portion of each of the first and second active patterns AP1 and AP2 may further include sacrificial layers SAL adjacent to the dividing structure DB. The sacrificial layers SAL may be stacked to be spaced apart from each other. Each of the sacrificial layers SAL may be located at the same level as a corresponding one of the first to third portions PO1, PO2, and PO3 of the gate electrode GE. The dividing structure DB may be provided to penetrate the sacrificial layers SAL. The sacrificial layers SAL may be formed of or include silicon-germanium (SiGe). A germanium concentration of each of the sacrificial layers SAL may range from 10 at % to 30 at %.

Active contacts AC may be provided to penetrate the first and second interlayer insulating layers 110 and 120 and may be electrically connected to the first and second source/drain patterns SD1 and SD2, respectively. The active contacts AC may be respectively provided at opposing sides of the gate electrode GE. When viewed in a plan view, the active contact AC may have a bar shape elongated in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include one or more metal silicide materials (e.g., titanium silicide, tantalum silicide, tungsten silicide, nickel silicide, and/or cobalt silicide).

A gate contact GC, which is electrically connected to the gate electrode GE, may be provided to penetrate the second interlayer insulating layer 120 and the gate capping pattern GP. Referring to FIG. 2B, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM around or enclosing the conductive pattern FM. For example, the conductive pattern FM may be formed of or include at least one metal of aluminum, copper, tungsten, molybdenum, or cobalt. The barrier pattern BM may be provided to cover side and bottom surfaces of the conductive pattern FM. In an embodiment, the barrier pattern BM may include a metal layer and/or a metal nitride layer. The metal layer may be formed of or include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CON), or platinum nitride (PtN).

A first metal layer M1 may be provided in a third interlayer insulating layer 130. The first metal layer M1 may include a first lower power line M1_R1, a second lower power line M1_R2, and lower interconnection lines M1_I.

Each of the first and second lower power lines M1_R1 and M1_R2 may extend in the second direction D2 to cross the logic cell LC. In detail, a first cell border CB1 extending in the second direction D2 may be defined in the logic cell LC. A second cell border CB2 may be defined in a region of the logic cell LC opposite to the first cell border CB1. The first lower power line M1_R1 may be disposed on the first cell border CB1. The first lower power line M1_R1 may extend along the first cell border CB1 and in the second direction D2. The second lower power line M1_R2 may be disposed on the second cell border CB2. The second lower power line M1_R2 may extend along the second cell border CB2 and in the second direction D2.

The lower interconnection lines M1_I may be disposed between the first and second lower power lines M1_R1 and M1_R2. The lower interconnection lines M1_I may be line- or bar-shaped patterns extending in the second direction D2. The lower interconnection lines M1_I may be arranged with a second pitch in the first direction D1. The second pitch may be smaller than the first pitch.

The first metal layer M1 may further include lower vias VI1. The lower vias VI1 may be provided below the interconnection lines M1_R1, M1_R2, and M1_I of the first metal layer M1. The lower vias VI1 may be respectively interposed between the active contacts AC and the interconnection lines M1_R1, M1_R2, and M1_I of the first metal layer M1. In addition, the lower vias VI1 may be respectively interposed between the gate contacts GC and the interconnection lines M1_R1, M1_R2, and M1_I of the first metal layer M1.

The interconnection line M1_R1, M1_R2, or M1_I of the first metal layer M1 and the lower via VI1 thereunder may be formed by separate processes. In other words, each of the interconnection line M1_R1, M1_R2, or M1_I and the lower via VI1 may be formed by a single damascene process. The semiconductor device according to the present embodiment may be fabricated using a sub-20 nm process.

A second metal layer M2 may be provided in a fourth interlayer insulating layer 140. The second metal layer M2 may include upper interconnection lines M2_I. Each of the upper interconnection lines M2_I of the second metal layer M2 may be a line- or bar-shaped pattern extending in the first direction D1. In other words, the upper interconnection lines M2_I may extend in the first direction D1 to be parallel to each other. When viewed in a plan view, the upper interconnection lines M2_I may be parallel to the gate electrodes GE. The upper interconnection lines M2_I may be arranged with a third pitch in the second direction D2. The third pitch may be smaller than the first pitch. The third pitch may be greater than the second pitch.

The second metal layer M2 may further include upper vias VI2. The upper vias VI2 may be provided below the upper interconnection lines M2_I. The upper vias VI2 may be respectively interposed between the upper interconnection lines M2_I and the interconnection lines M1_R1, M1_R2, and M1_I of the first metal layer M1.

The upper interconnection line M2_I of the second metal layer M2 and the upper via VI2 thereunder may be a single pattern that is formed by the same process. For example, the upper interconnection line M2_I and the upper via VI2 may be formed concurrently by a dual damascene process.

The interconnection lines of the first metal layer M1 may be formed of or include a conductive material that is the same as or different from that of the second metal layer M2. For example, the interconnection lines of the first and second metal layers M1 and M2 may be formed of or include at least one of aluminum, copper, tungsten, molybdenum, or cobalt. Although not shown, a plurality of stacked metal layers (e.g., M3, M4, M5, and so forth) may be further disposed on the fourth interlayer insulating layer 140. Each of the stacked metal layers may include routing lines.

The gate spacer GS and the first and second fence spacers SS1 and SS2 will be described in more detail with reference to FIGS. 3A, 3B, and 3C.

The gate spacer GS may cover a side surface of the gate insulating layer GI and a side surface of the gate capping pattern GP. The gate spacer GS in the second direction D2 is illustrated to have the same thickness, regardless of its height, but the thickness of the gate spacer GS may vary depending on its height. For example, the thickness of the gate spacer GS may be larger at a lower level (e.g., closer to the substrate 100) than at an upper level (e.g., farther from the substrate 100). Hereinafter, a thickness tg of the gate spacer GS may be defined as a thickness that is measured at a level of the top surface of the gate electrode GE (e.g., at a level of the top surface of the fourth portion PO4).

A thickness of each of the first and second fence spacers SS1 and SS2 in the first direction D1 may be greater than the thickness tg of the gate spacer GS.

An upper thickness ts1 of the first fence spacer SS1 may be greater than the thickness tg of the gate spacer GS. The upper thickness ts1 of the first fence spacer SS1 may be the largest thickness of the first fence spacer SS1. For example, the upper thickness ts1 may be a thickness of the first fence spacer SS1 at a level of a neck portion where the first source/drain pattern SD1 transitions from an upward decreasing width to an upward increasing width. The upper thickness ts1 of the first fence spacer SS1 may be about 1.5 to 3 times the thickness tg of the gate spacer GS. As an example, the upper thickness ts1 of the first fence spacer SS1 may range from about 3 nm to about 12 nm, and the thickness tg of the gate spacer GS may range from about 2 nm to about 6 nm.

A top surface height h1 of the first fence spacer SS1 may be 50% to 100% of a top surface height h2 of the first source/drain pattern SD1. The top surface height h2 of the first source/drain pattern SD1 and the top surface height h1 of the first fence spacer SS1 may be defined as a distance from or relative to a bottom surface of the first source/drain pattern SD1 in contact with the first active pattern AP1.

The upper thickness ts1 of the first fence spacer SS1 may be greater than a lower thickness ts2. The lower thickness ts2 may be a thickness of the first fence spacer SS1, which is measured at a height of the bottom surface of the first source/drain pattern SD1 in contact with the first active pattern AP1. The upper thickness ts1 of the first fence spacer SS1 may be about 1.5 to 3 times the lower thickness ts2. In an embodiment, the lower thickness ts2 of the first fence spacer SS1 may range from 2 nm to 7 nm. The second fence spacer SS2 may have substantially the same structure as the first fence spacer SS1.

Each of the first and second fence spacers SS1 and SS2 may include a first fence portion SF1 and a second fence portion SF2. The first fence portion SF1 may be in contact with a side surface of the first or second source/drain pattern SD1 or SD2. The first fence portion SF1 may cover an upper side surface of the active pattern AP1 or AP2. In some embodiments, the first fence portion SF1 may extend to the top surface of the device isolation layer ST but, in other embodiments, the first fence portion SF1 may not extend to the top surface of the device isolation layer ST. As an example, the first fence portion SF1 may include a sidewall portion covering the side surface of the first or second source/drain pattern SD1 or SD2 and the upper side surface of the active pattern AP1 or AP2 and a bottom portion extending to the top surface of the device isolation layer ST. Alternatively, the first fence portion SF1 may include only the sidewall portion, but not the bottom portion.

A thickness of the first fence portion SF1 may be substantially equal to the thickness tg of the gate spacer GS. As an example, a thickness of the sidewall portion of the first fence portion SF1 may be substantially equal to the thickness tg of the gate spacer GS. The thickness of the sidewall portion of the first fence portion SF1 may be substantially equal to a thickness tsb of the bottom portion of the first fence portion SF1.

An upper portion of the first fence portion SF1 may have substantially the same thickness as a lower portion thereof. In contrast, an upper portion of the second fence portion SF2 may be thicker than a lower portion thereof. The second fence portion SF2 may be provided to have a downward decreasing thickness. For example, the second fence portion SF2 may have an inverted triangle shape.

The first fence portion SF1 may be formed of or include at least one of SiCN, SiCON, SiON, or SiN. The first fence portion SF1 and the gate spacer GS may be formed from the same layer, and in this case, they may include substantially the same material and may have the same composition. The second fence portion SF2 may be formed of or include at least one of SiCN, SiCON, SiON, or SiN. The second fence portion SF2 may differ from the first fence portion SF1 and the gate spacer GS in their materials or compositions. The second fence portion SF2 may be formed of or include a material, which has higher etch resistivity than the first fence portion SF1 and the gate spacer GS in an etching process to form recesses. As an example, the second fence portion SF2 may have a higher density than the first fence portion SF1 and the gate spacer GS. For example, a nitrogen concentration of the second fence portion SF2 may be higher than nitrogen concentrations of the first fence portion SF1 and the gate spacer GS. In an embodiment, an oxygen concentration of the second fence portion SF2 may be higher than oxygen concentrations of the first fence portion SF1 and the gate spacer GS.

According to an embodiment of the inventive concept, the fence spacers SS1 and SS2, which are thicker than the gate spacer GS, may extend to a greater height along side surfaces SW1, SW2 of the active regions AP1, AP2 as compared to some conventional spacers, which may be largely removed by etching processes for forming recesses RS1, RS2 to grow the source/drain patterns SD1, SD2. As will be described with reference to a fabrication method below, the largest or maximum widths WM1 and WM2 of the first and second source/drain patterns SD1 and SD2 may be reduced or restricted due to the thickness and shape of the fence spacers SS1 and SS2. As a result, adjacent ones of the source/drain patterns may be prevented from excessive growth in a lateral direction and from being unintentionally connected to each other, and thereby an integration density of a semiconductor device may be increased.

In addition, the gate spacer GS may be maintained to a thickness that is smaller than the thicknesses of the fence spacers SS1 and SS2, and it may be possible to secure a space for growth of the first and second source/drain patterns SD1 and SD2 and to increase an integration density of the semiconductor device.

Figure 4:
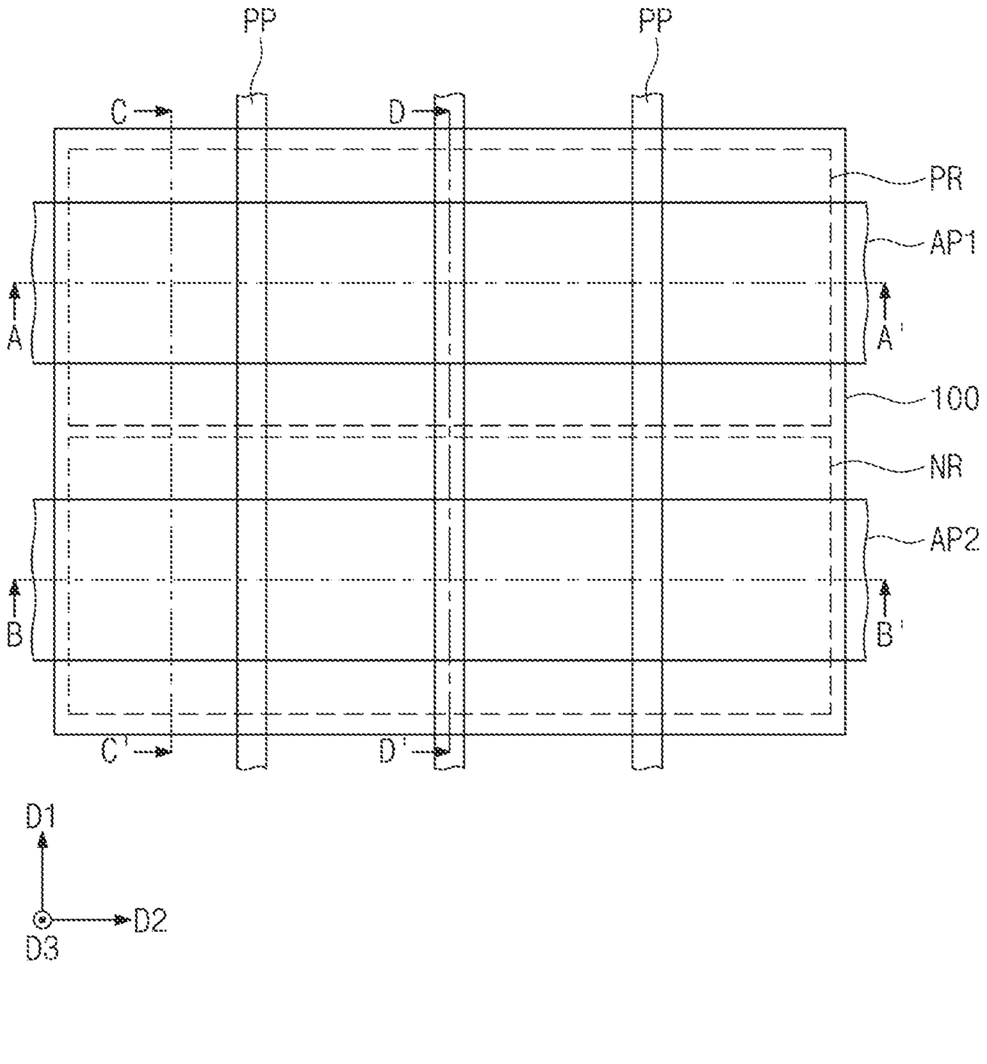
FIGS. 4, 5A, 5B, 6A, 6B, 7A, 7B, 8, 9A, 9B, 9C, 10A, 10B, 10C, 10D, 11A, 11B, 12A, 12B, 12C, 12D, 13A, 13B, 14A, 14B, 14C, 14D, 15A, 15B, 15C, 15D, 16A, 16B, 16C, and 16D are diagrams illustrating a method of fabricating a semiconductor device, according to an embodiment of the inventive concept.

FIGS. 4 to 16D are diagrams illustrating a method of fabricating a semiconductor device, according to an embodiment of the inventive concept. In detail, FIGS. 4 and 8 are plan views illustrating a method of fabricating a semiconductor device, according to an embodiment of the inventive concept. FIGS. 5A, 6A, 7A, 9A, 10A, 11A, 12A, 14A, 15A, and 16A are sectional views taken along a line A-A' of FIG. 1, 4, or 8. FIGS. 9B, 10B, 12B, 13A, 14B, 15B, and 16B are sectional views taken along a line B-B' of FIGS. 1, 4, or FIG. 8. FIGS. 7B, 9C, 10C, 11B, 12C, 13B, 14C, 15C, and 16C are sectional views taken along a line C-C' of FIG. 1, 4, or 8. FIGS. 5B, 6B, 10D, 12D, 14D, 15D, and 16D are sectional views taken along a line D-D' of FIG. 1, 4, or 8.

Figure 5A:
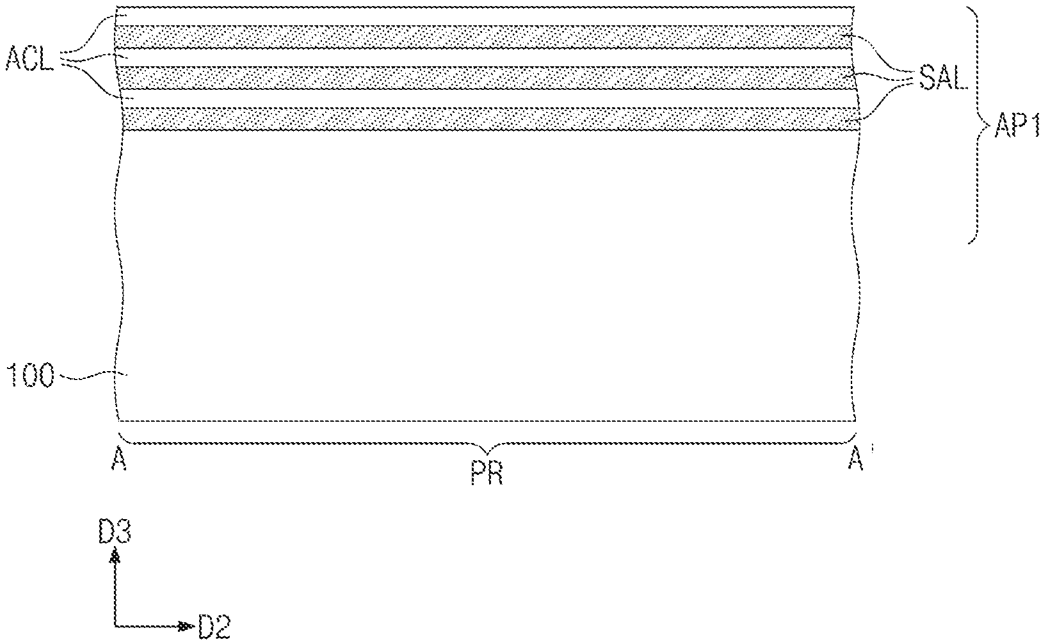
Figure 5B:
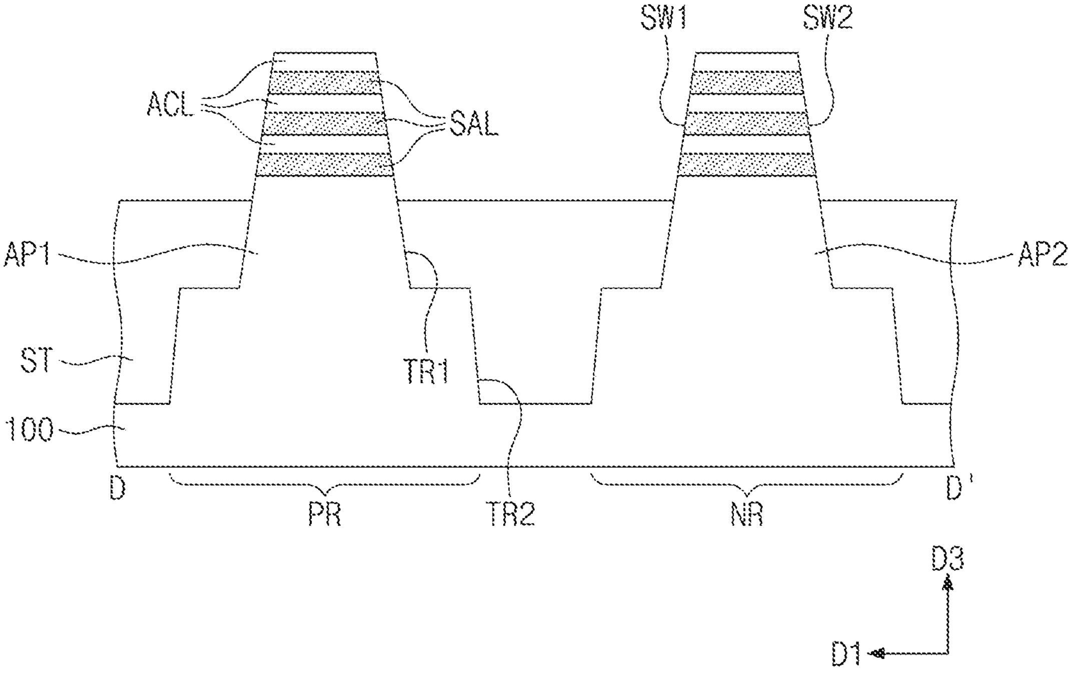

Referring to FIGS. 4, 5A, and 5B, the substrate 100 including the PMOSFET and NMOSFET regions PR and NR may be provided. The sacrificial layers SAL and active layers ACL may be alternately formed on the substrate 100. The sacrificial layers SAL may be formed of or include one of silicon (Si), germanium (Ge), and/or silicon-germanium (SiGe), and the active layers ACL may be formed of or include another one of silicon (Si), germanium (Ge) and/or silicon-germanium (SiGe). For example, the sacrificial layers SAL may be formed of or include silicon-germanium (SiGe), and the active layers ACL may be formed of or include silicon (Si). A germanium concentration of each of the sacrificial layers SAL may range from 10 at % to 30 at %.

A mask pattern may be formed on each of the PMOSFET and NMOSFET regions PR and NR of the substrate 100. The mask pattern may be a line- or bar-shaped pattern extending in the second direction D2. For example, the mask pattern may include a silicon nitride layer. A first patterning process using the mask pattern as an etch mask may be performed to form the first trench TR1 defining the first and second active patterns AP1 and AP2. The first and second active patterns AP1 and AP2 may be formed on the PMOSFET and NMOSFET regions PR and NR, respectively. Each of the first and second active patterns AP1 and AP2 may include the sacrificial layers SAL and the active layers ACL, which are alternately stacked and constitutes its upper portion.

A second patterning process may be performed on the substrate 100 to form the second trench TR2 defining the PMOSFET and NMOSFET regions PR and NR. The second trench TR2 may be formed to be deeper than the first trench TR1.

The device isolation layer ST may be formed on the substrate 100 to fill the first and second trenches TR1 and TR2. In detail, an insulating layer may be formed on the substrate 100 to cover the first and second active patterns AP1 and AP2, and then, a planarization process may be performed on the insulating layer. After the planarization process, the device isolation layer ST may be formed by recessing the insulating layer. The device isolation layer ST may be formed of or include at least one of insulating materials (e.g., silicon oxide). Each of the first and second active patterns AP1 and AP2 may have a first side surface SW1 and a second side surface SW2, which are opposite to each other in the first direction D1.

Figure 6A:
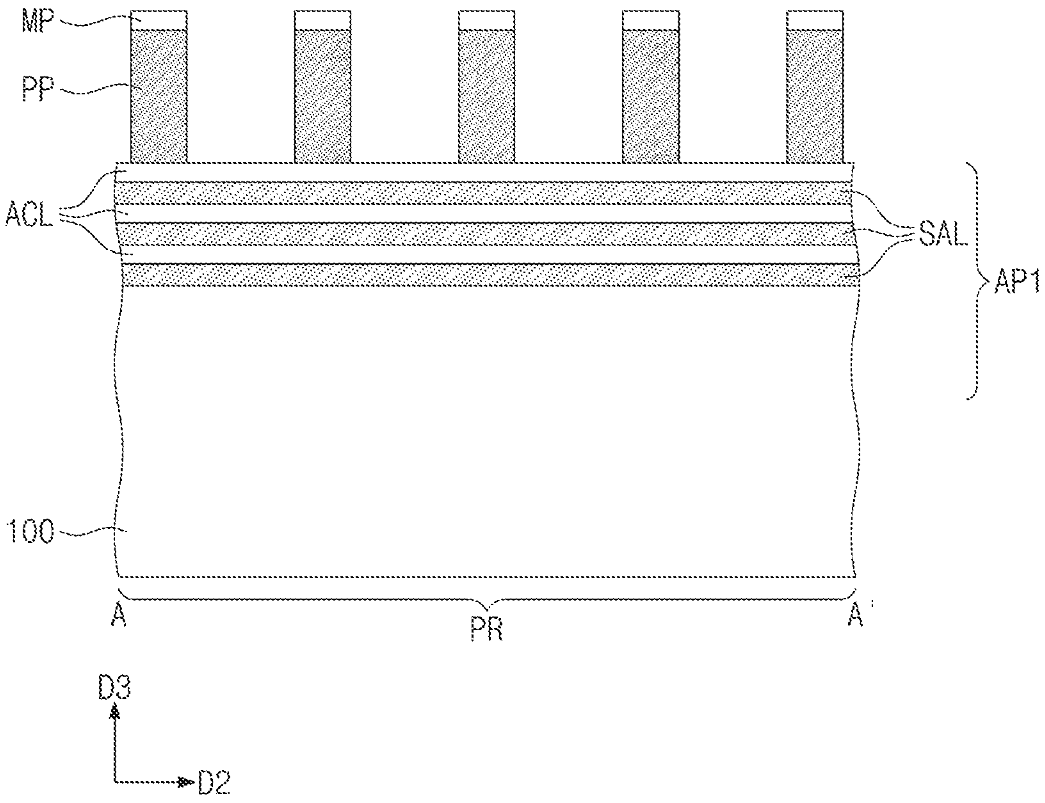
Figure 6B:
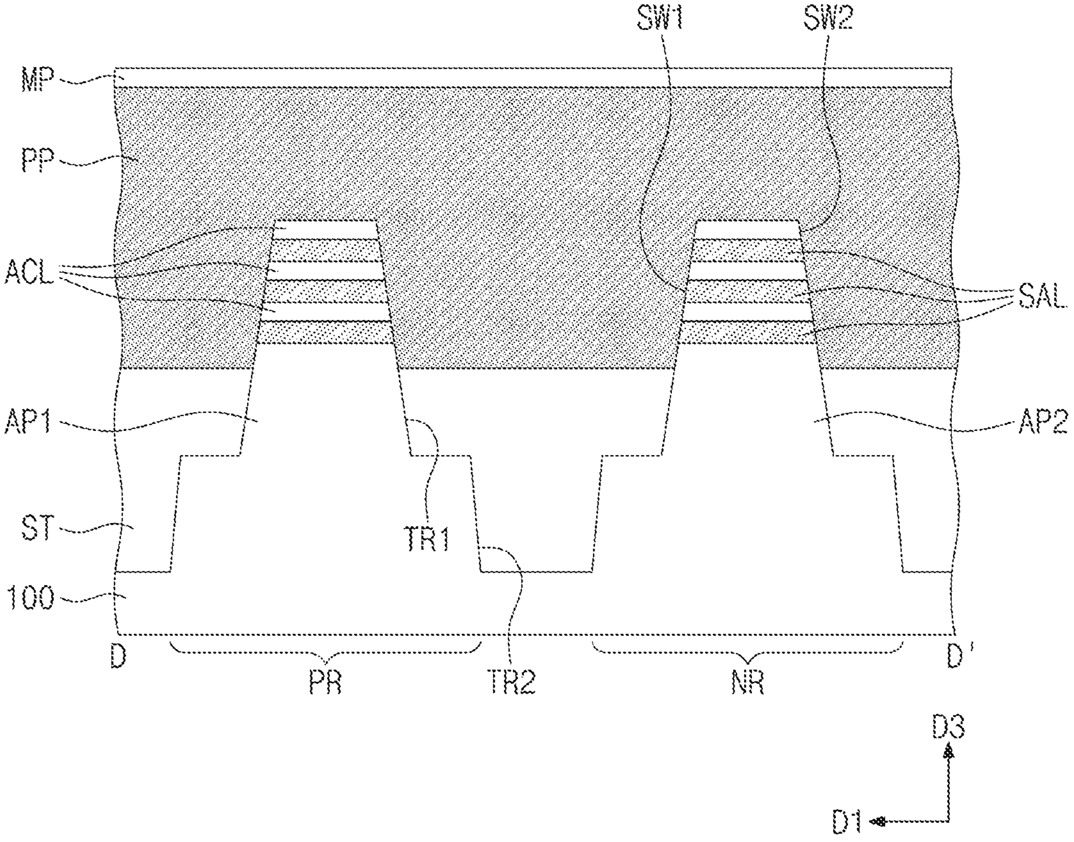

Referring to FIGS. 4, 6A, and 6B, sacrificial gate patterns PP may be formed on the substrate 100 to cross the first and second active patterns AP1 and AP2. Each of the sacrificial gate patterns PP may be formed to have a line or bar shape extending in the first direction D1. The sacrificial gate patterns PP may be arranged with a specific pitch in the second direction D2.

In an embodiment, the formation of the sacrificial gate patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include poly silicon.

Figure 7A:
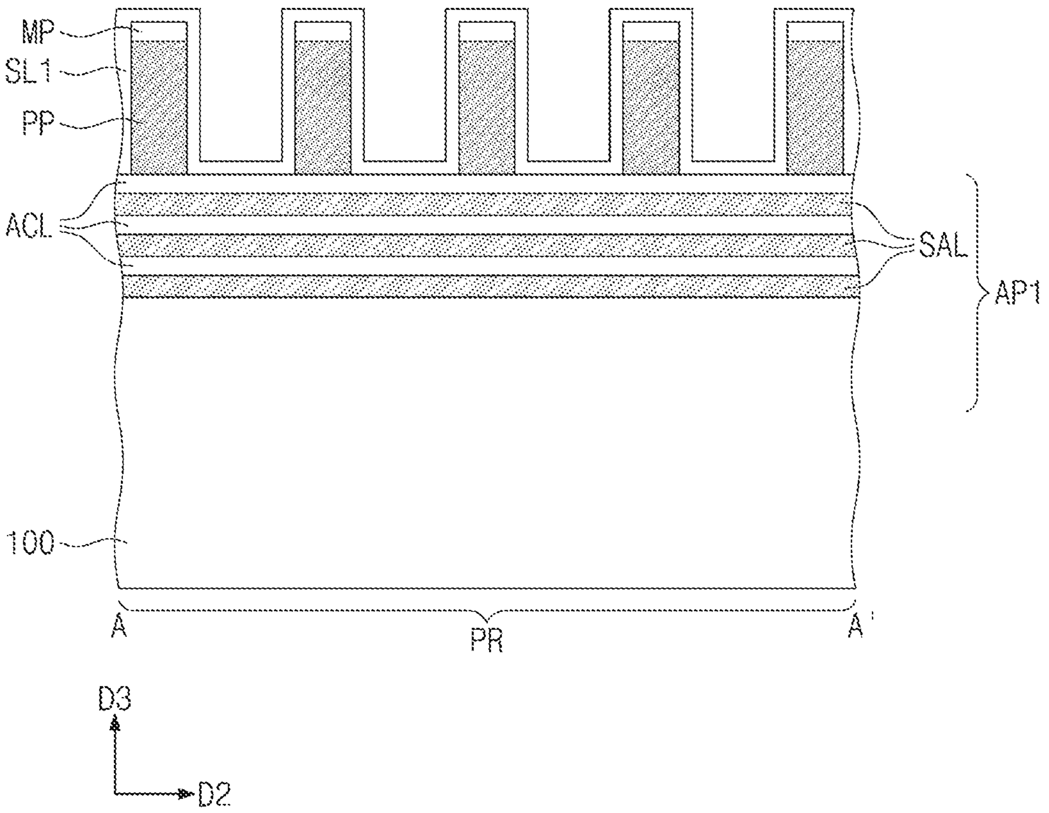
Figure 7B:
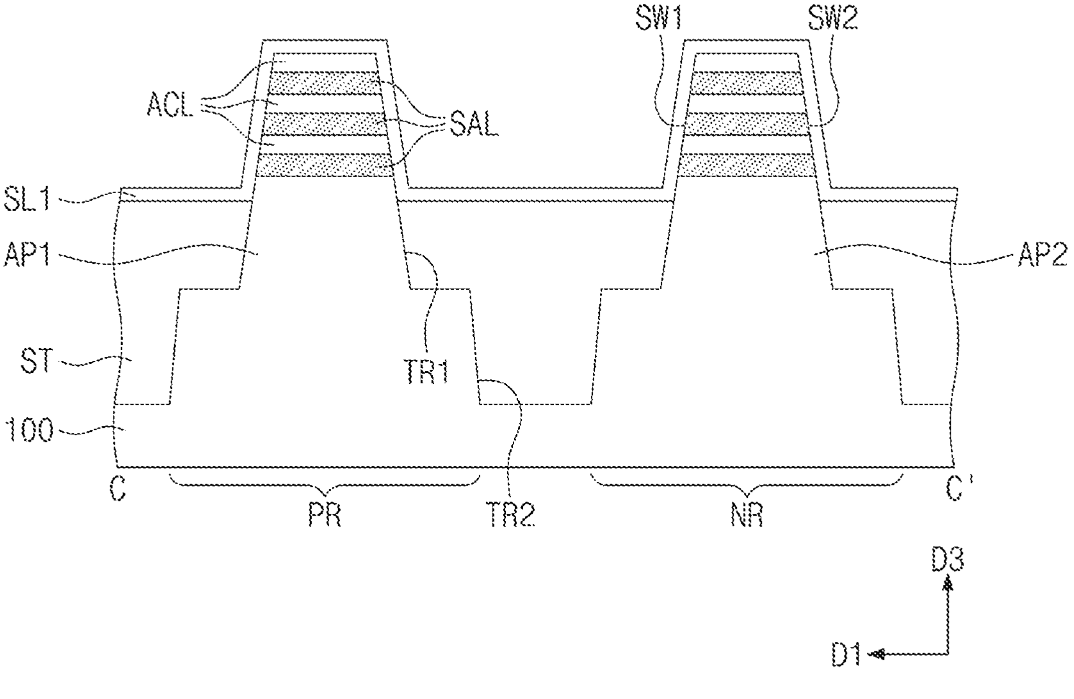
Figure 8:
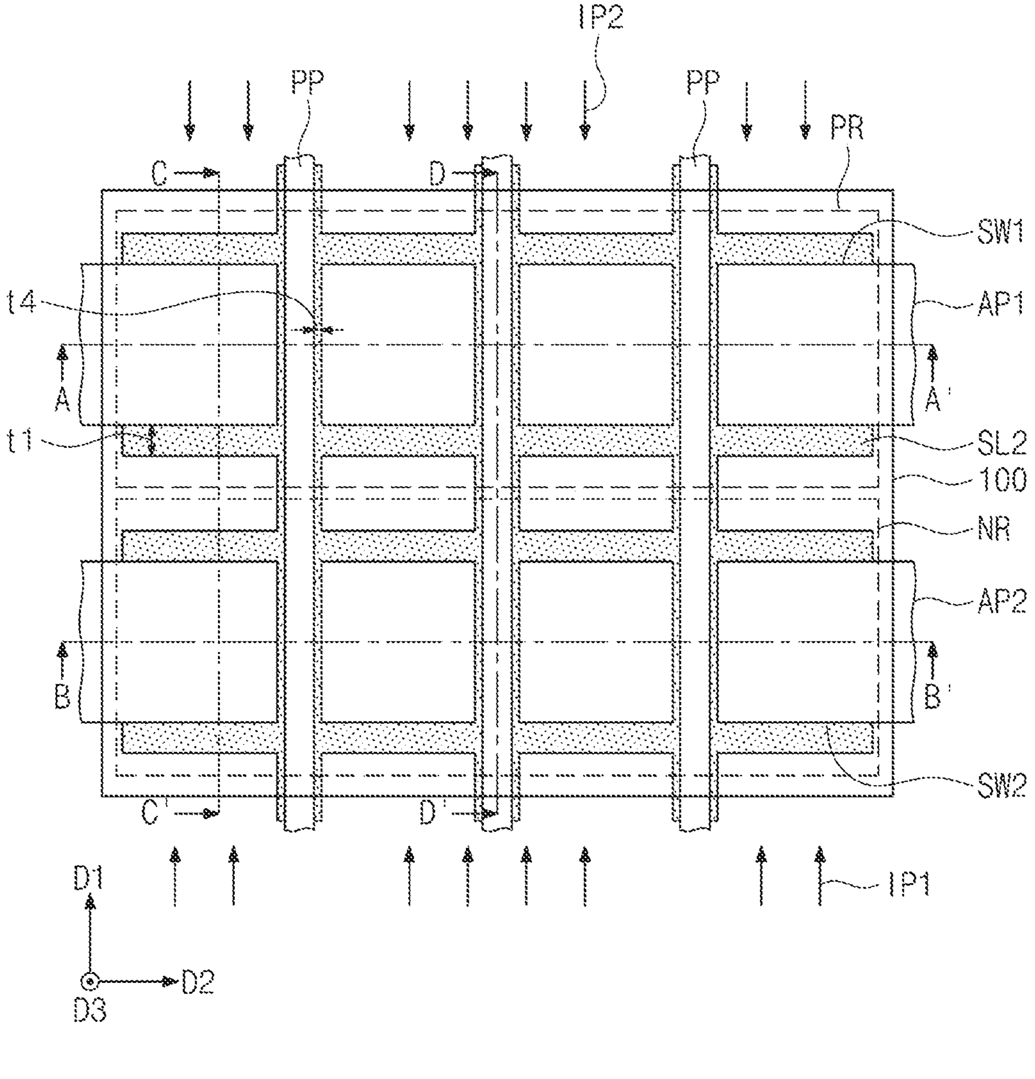

Referring to FIGS. 4, 7A, and 7B, a first spacer layer SL1 may be formed to cover the entire top surface of the substrate 100. The first spacer layer SL1 may cover top surfaces of the hard mask patterns MP, side surfaces of the sacrificial gate patterns PP, side surfaces of the active layer ACL, side surfaces of the sacrificial layers SAL, and the top surface of the device isolation layer ST. The first spacer layer SL1 may be formed of or include at least one of SiCN, SiCON, SiON, or SiN. In an embodiment, the first spacer layer SL1 may be formed by an atomic layer deposition process and/or a chemical vapor deposition process. The first spacer layer SL1 may be conformally formed to have substantially the same or uniform thickness.

Figure 9A:
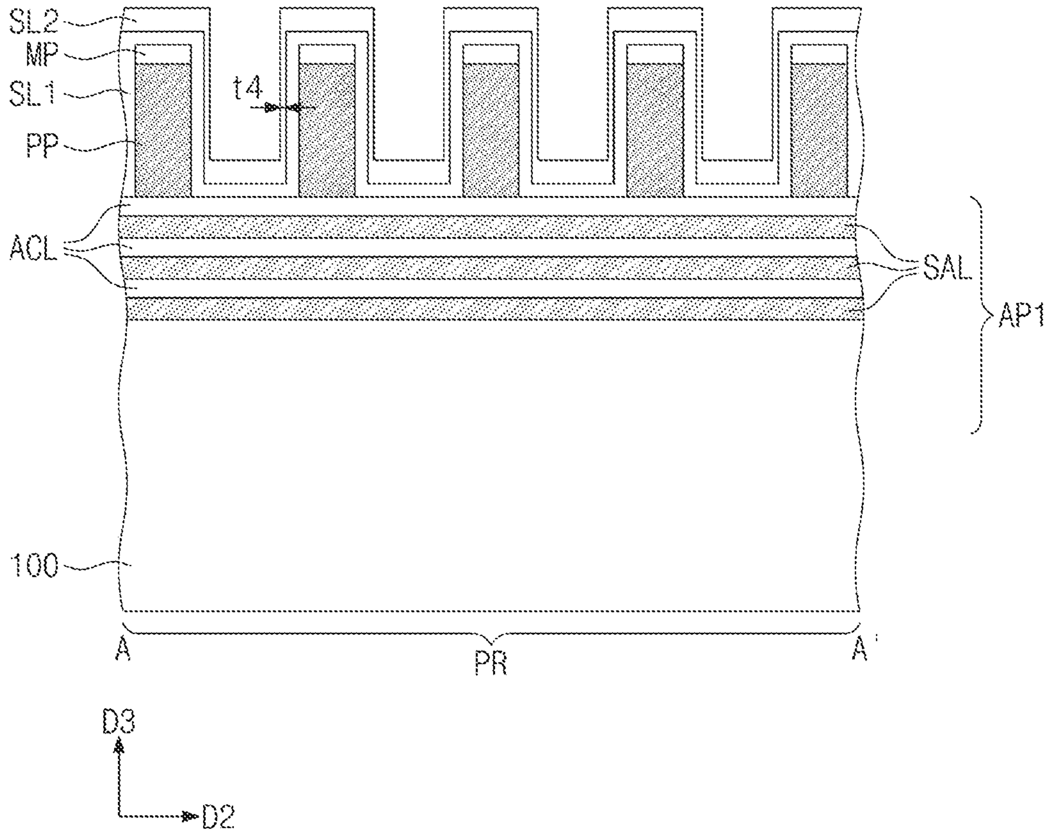
Figure 9B:
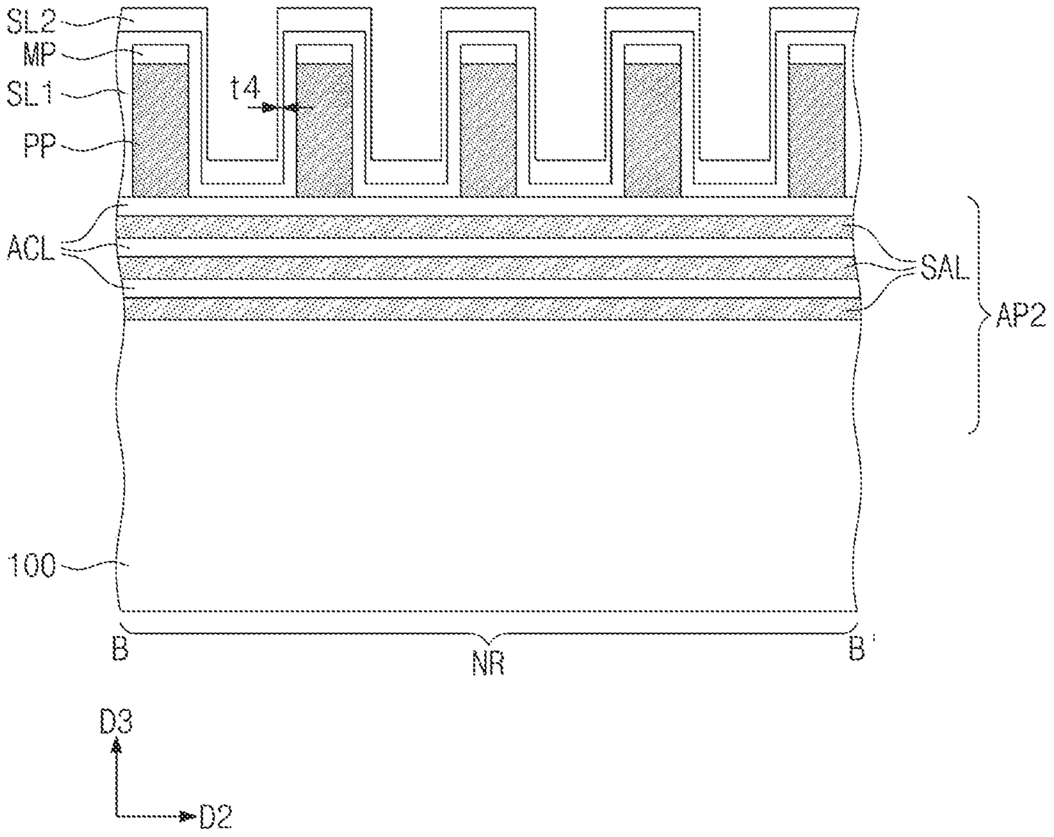

Referring to FIGS. 8, 9A, and 9B, a second spacer layer SL2 may be formed on the first spacer layer SL1. The second spacer layer SL2 may be formed to cover the entire top surface of the substrate 100. Unlike the first spacer layer SL1, the second spacer layer SL2 may not be formed to have substantially the same or uniform thickness. For example, the second spacer layer SL2 may be thinly formed on the side surfaces of the sacrificial gate patterns PP and may be thickly formed on the side surfaces of the first and second active patterns AP1 and AP2 (e.g., the side surfaces of the active and sacrificial layers ACL and SAL), so as to have a non-uniform thickness.

In an embodiment, the second spacer layer SL2 may be formed by a directional deposition process. The directional deposition process may be an ion implantation directional deposition process. The ion implantation directional deposition process may include injecting source radicals or ions in a specific direction, when viewed in a plan view, and at a specific angle relative to a top surface of a substrate. As an example, radicals of carbon, silicon, oxygen, and/or ammonia may be injected into the top surface of the substrate 100 in a specific direction and at a specific angle.

As shown in FIG. 8, the directional deposition process may be performed in a direction, which is parallel to an extension direction of the sacrificial gate patterns PP, when viewed in a plan view. For example, the directional deposition process may include a first deposition process IP1, which is performed in the first direction D1, and a second deposition process IP2, which is performed in the second direction D2. The first and second deposition processes IP1 and IP2 may be sequentially performed in a listed order or in a reversed order.

Figure 9C:
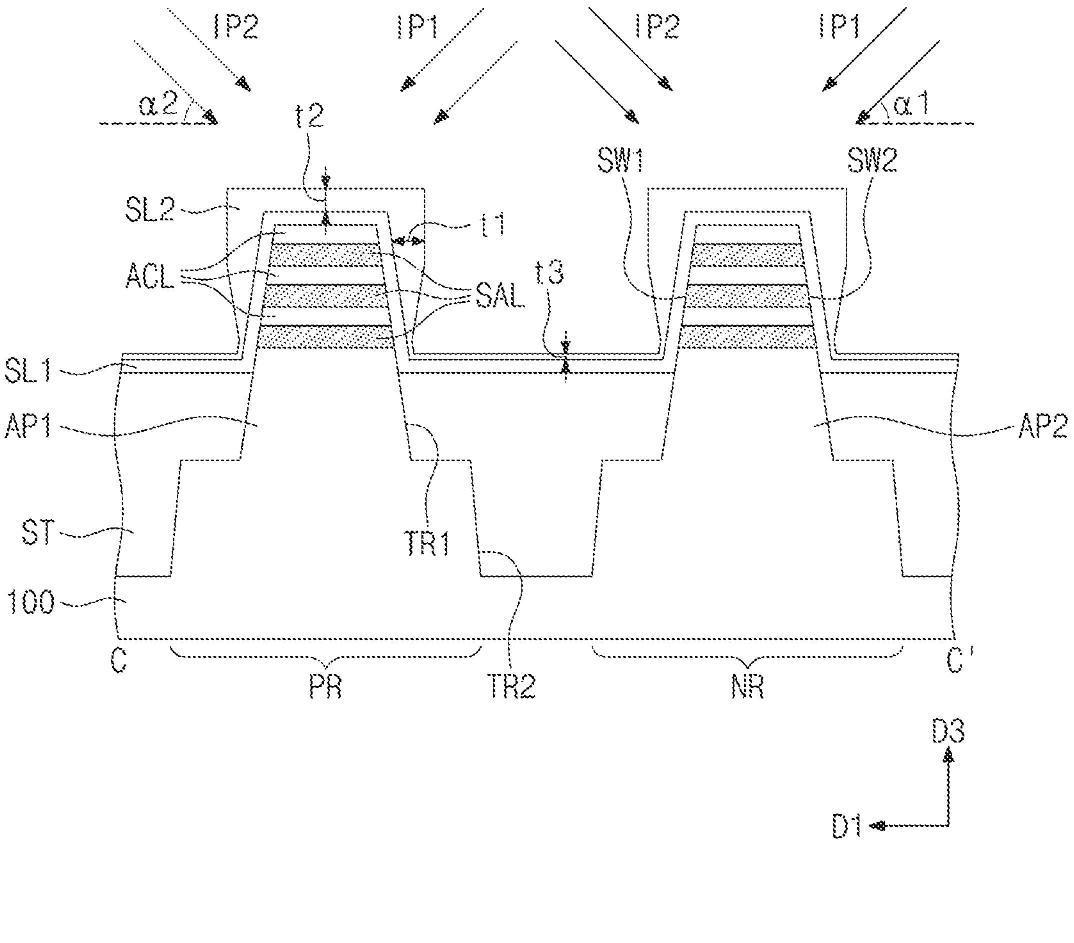
Figure 10A:
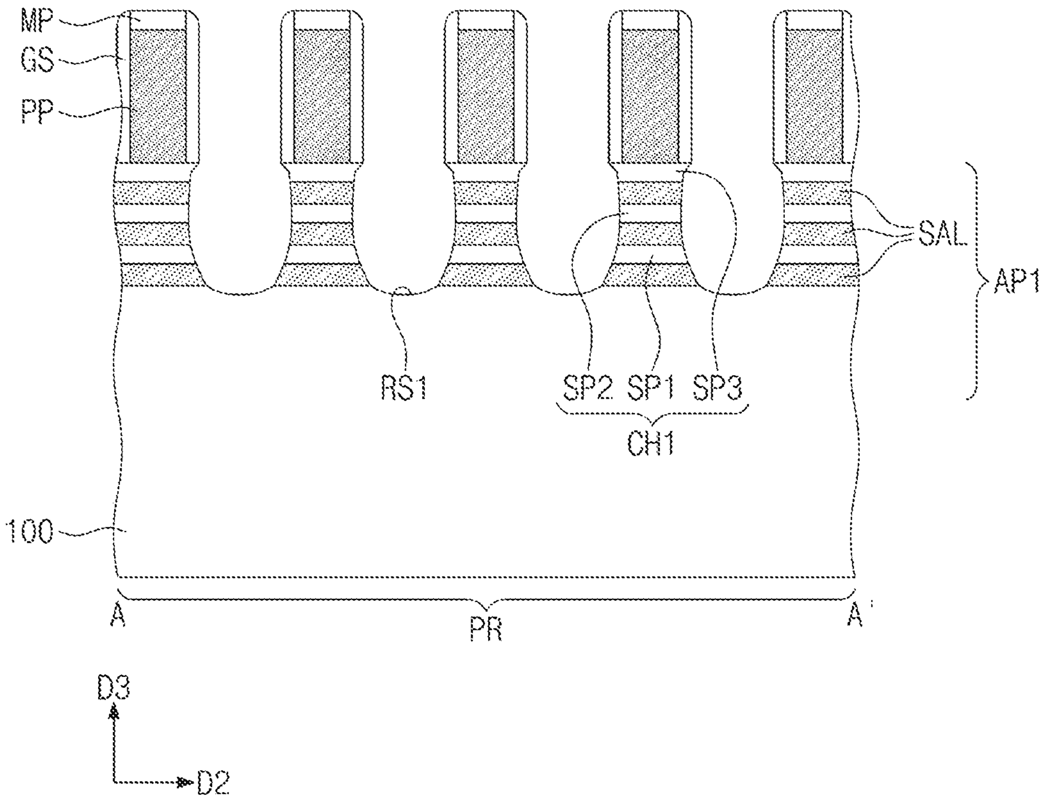
Figure 10B:
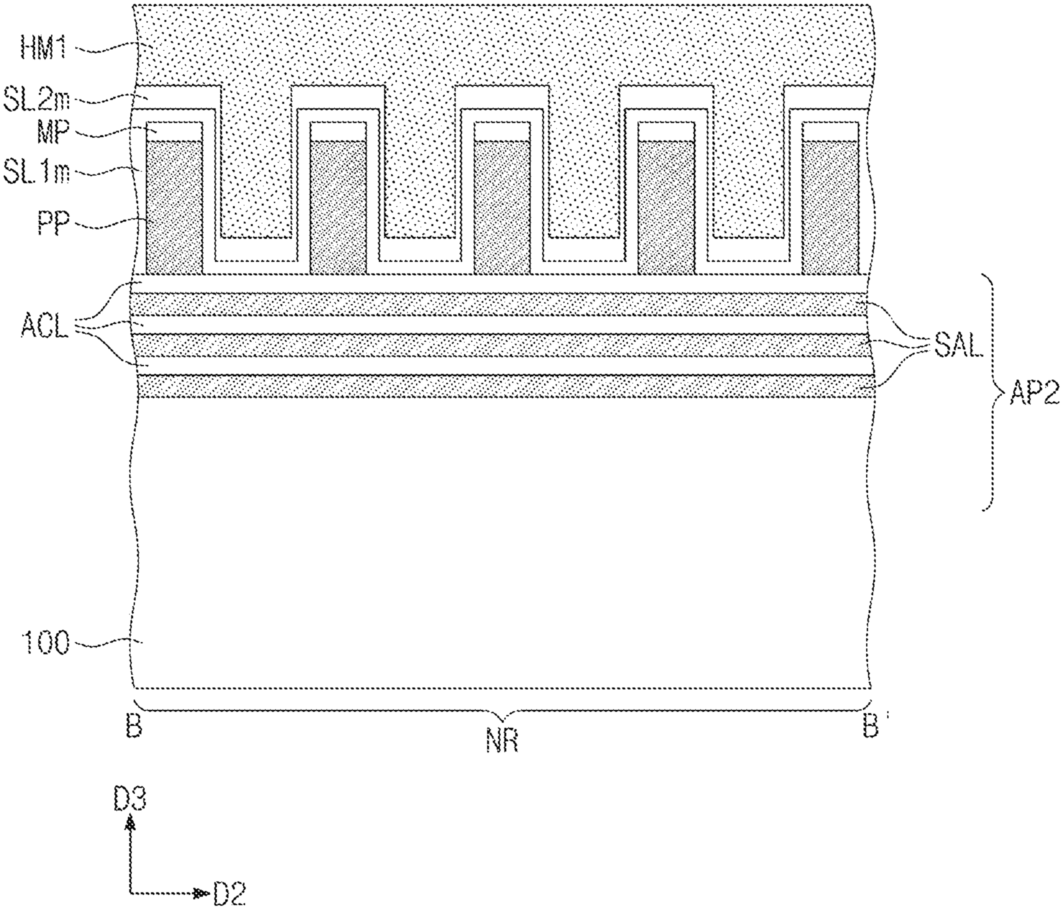
Figure 10C:
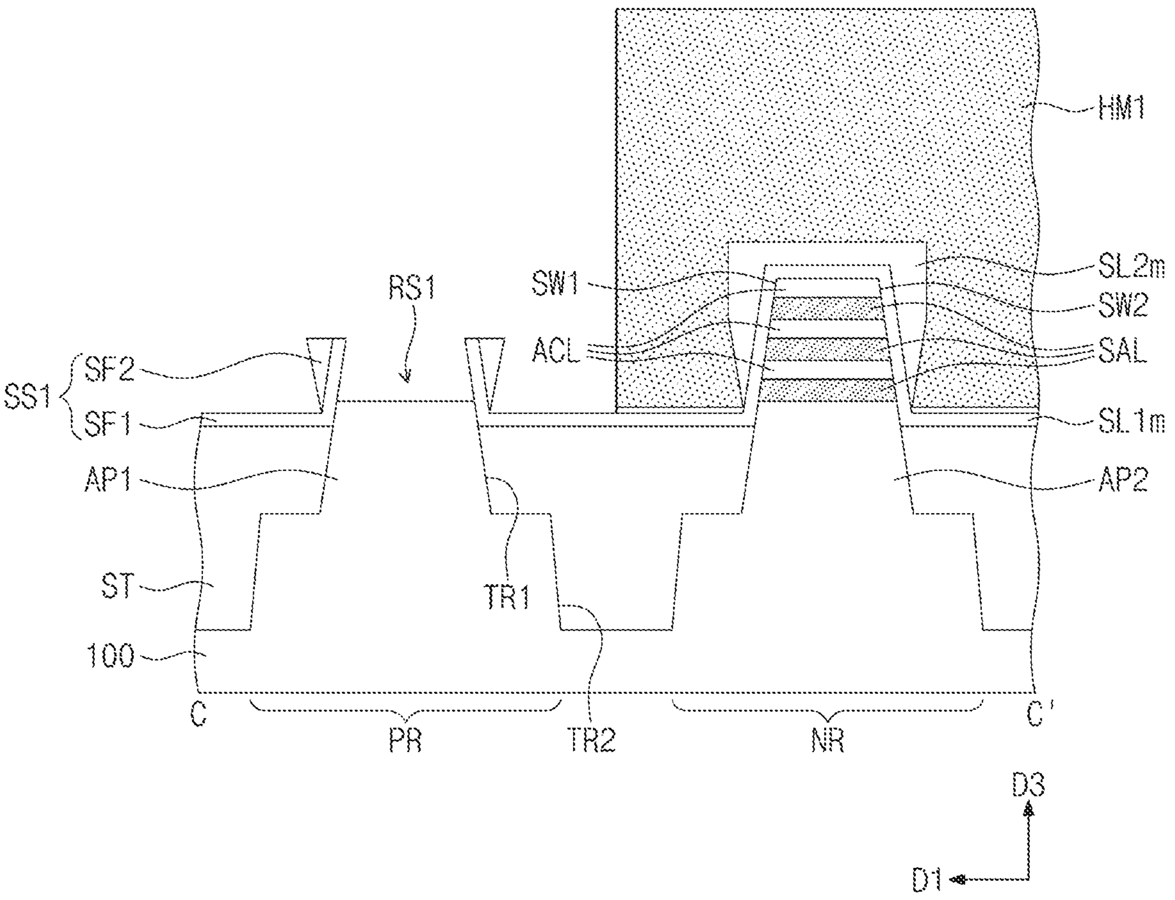
Figure 10D:
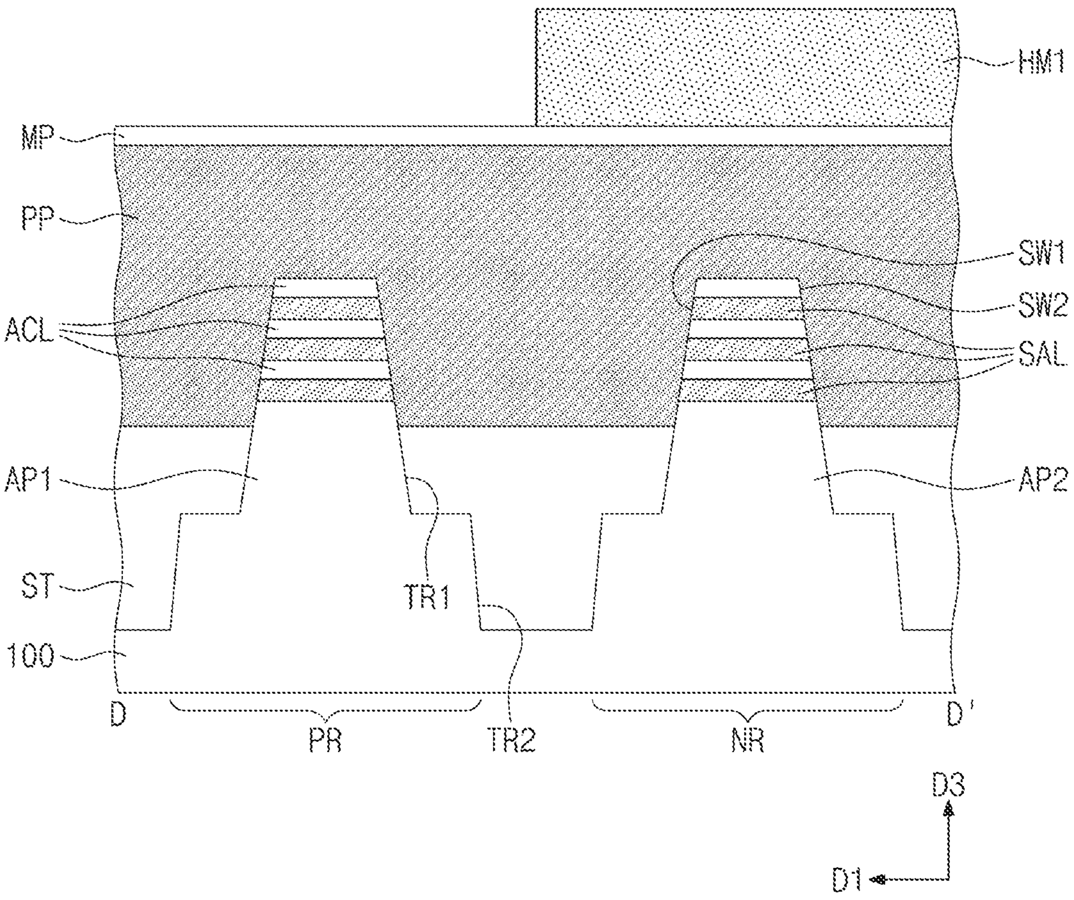

As shown in FIG. 9C, the first deposition process IP1 may be performed at a first angle α1 relative to the top surface of the substrate 100, and the second deposition process IP2 may be performed at a second angle α2 relative to the top surface of the substrate 100. In some embodiments, the first angle α1 and the second angle α2 may be equal to each other, but in other embodiments, they may be different from each other. As a result of the first deposition process IP1, an insulating layer may be formed on the second side surface SW2 to have a relatively large thickness. In other words, since the deposition process is performed in an anisotropic manner, the insulating layer may be formed on the first side surface SW1, the side surfaces of the sacrificial gate patterns PP, and the device isolation layer ST to have a relatively small thickness. As a result of the second deposition process IP2, an insulating layer may be formed on the first side surface SW1 to have a relatively large thickness. In other words, since the deposition process is performed in an anisotropic manner, the insulating layer may be formed on the second side surface SW2, the side surfaces of the sacrificial gate patterns PP, and the device isolation layer ST to have a relatively small thickness.

The second spacer layer SL2, which are formed by the first and second deposition processes IP1 and IP2, may have a first thickness t1 on the first and second side surfaces SW1 and SW2, a second thickness t2 on the uppermost layer of the active layers ACL, a third thickness t3 on the device isolation layer ST, and a fourth thickness t4 on the side surfaces of the sacrificial gate patterns PP. The first thickness t1 may be thicker than the fourth thickness t4. In other words, the insulating layer may be thinly formed on the side surfaces of the sacrificial gate patterns PP, which extend substantially parallel to the first direction D1. As an example, the first thickness t1 may be about 1.5 to 3 times the fourth thickness t4. In an embodiment, the first thickness t1 may range from about 3 nm to about 12 nm and the fourth thickness t4 may range from about 2 nm to about 6 nm. The second thickness t2 may be equal to or thicker than the first thickness t1. The third thickness t3 may be smaller than the first thickness t1, because the injected radicals are shielded by the neighboring active patterns. As an example, the third thickness t3 may be greater than the fourth thickness t4, but the inventive concept is not limited to this example. The second spacer layer SL2 may be formed to be thicker on upper portions of the first and second side surfaces SW1 and SW2 than on lower portions. This is because the number of radicals, which are incident into the lower portion of the first and second side surfaces SW1 and SW2, are reduced due to the shielding effect caused by the neighboring active patterns. The process to form the second spacer layer SL2 may not be limited to the directional deposition process and may be performed by a deposition process having a poor step coverage property.

Referring to FIGS. 10A to 10D, a first mask pattern HM1 may be formed to cover the NMOSFET region NR, and then, an etching process may be performed to form the first recesses RS1 in an upper portion of the first active pattern AP1. The etching process may include a plurality of anisotropic etching steps and/or a plurality of isotropic etching steps. The first recess RS1 may be formed between a pair of the sacrificial gate patterns PP. As a result of the etching process, the gate spacers GS may be formed on the side surfaces of the sacrificial gate patterns PP on the PMOSFET region PR. The second spacer layer SL2 may be removed from the side surfaces of the sacrificial gate patterns PP and the top surfaces of the hard mask patterns MP by this etching process, and a portion of the first spacer layer SL1 may be left or may remain to form the gate spacer GS. In the PMOSFET region PR, the second spacer layer SL2 on the first and second side surfaces SW1 and SW2 may be left or may remain to form the second fence portion SF2, because the second spacer layer SL2 is not fully removed, due to its relatively large thickness. In the PMOSFET region PR, a portion of the first spacer layer SL1 on the first and second side surfaces SW1 and SW2 may also be left or may remain to form the first fence portion SF1. Accordingly, the first fence spacer SS1 including the first and second fence portions SF1 and SF2 may be formed. In the NMOSFET region NR, which is veiled or covered by the first mask pattern HM1, the first spacer layer SL1 and the second spacer layer SL2 may be partially left to form a first residual spacer layer SL1*m* and a second residual spacer layer SL2*m*, respectively.

Figure 11A:
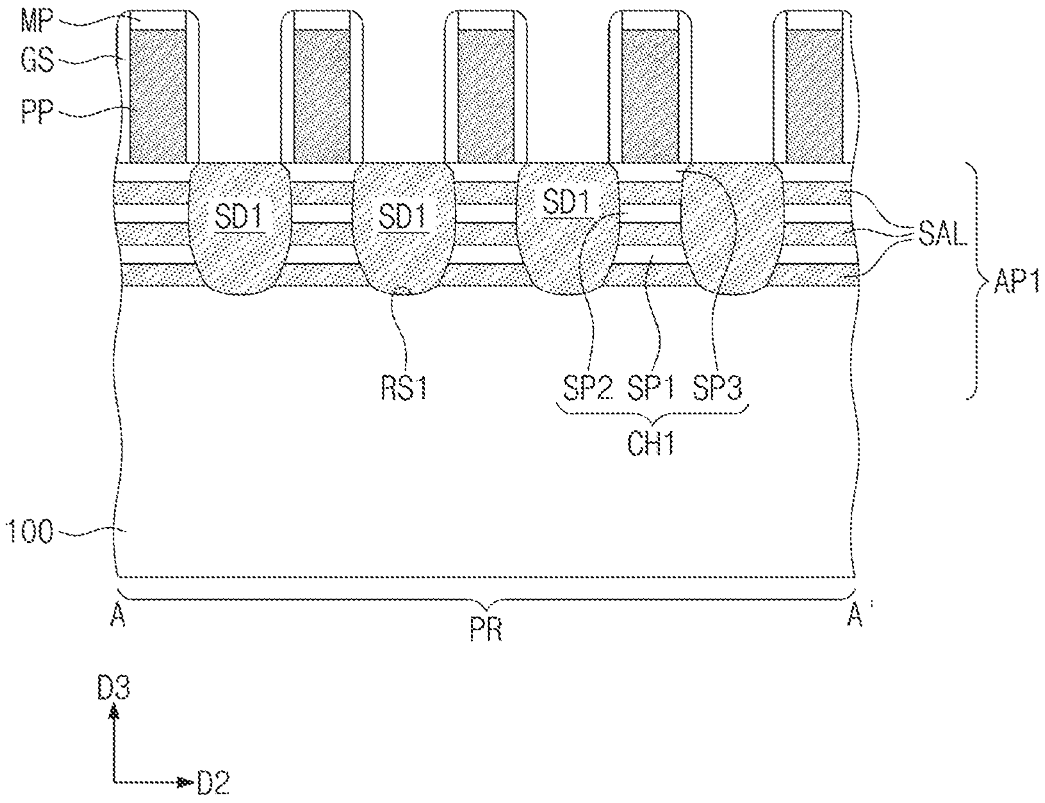
Figure 11B:
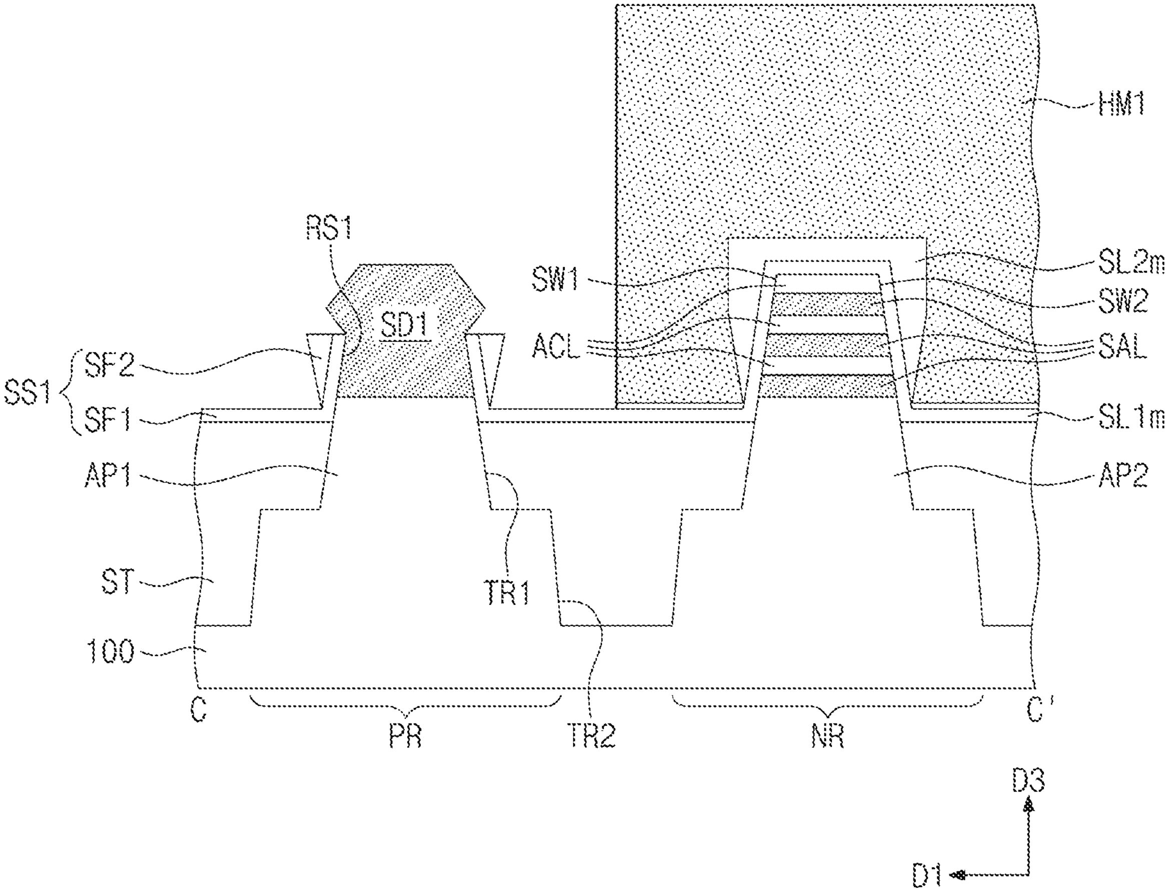

Referring to FIGS. 11A and 11B, the first source/drain patterns SD1 may be formed in the first recesses RS1. In detail, the first source/drain patterns SD1 may be formed by a first selective epitaxial growth process, in which an inner surface of the first recess RS1 is used as a seed layer. As an example, the first selective epitaxial growth process may include a chemical vapor deposition (CVD) process or a molecular beam epitaxy (MBE) process. The first source/drain patterns SD1 may be formed of a material (e.g., SiGe) whose lattice constant is greater than a lattice constant of the semiconductor material of the substrate 100. Since the first source/drain patterns SD1 are formed by the epitaxial process, side surfaces of the first source/drain patterns SD1 may be grown to have a crystalline structure or crystalline facets. The first source/drain patterns SD1 may be formed to occupy a region above the top surface of the first fence spacer SS1, but the inventive concept is not limited to this example. In an embodiment, the first source/drain patterns SD1 may be doped with impurities in situ during the selective epitaxial growth process for forming the first source/drain patterns SD1. Alternatively, the first source/drain pattern SD1 may be doped with impurities, after the formation of the first source/drain pattern SD1. The first source/drain pattern SD1 may be doped to have a first conductivity type (e.g., p-type).

The lateral growth of the first source/drain pattern SD1 may be restricted by the first fence spacer SS1 in the first recesses RS1. However, the lateral growth of the first source/drain pattern SD1 may not be restricted in a region above the top surface of the first fence spacer SS1, and thus, the first source/drain pattern SD1 may have an increased width in the first direction D1.

Figure 12A:
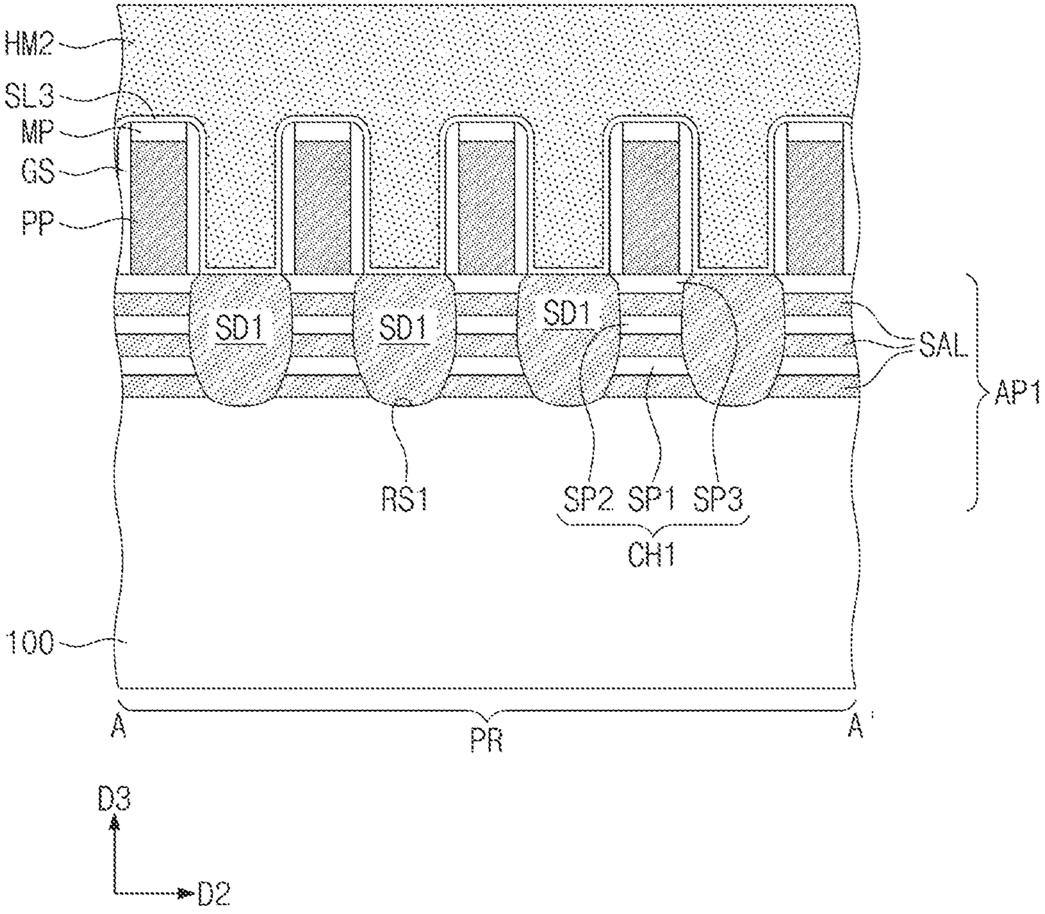
Figure 12B:
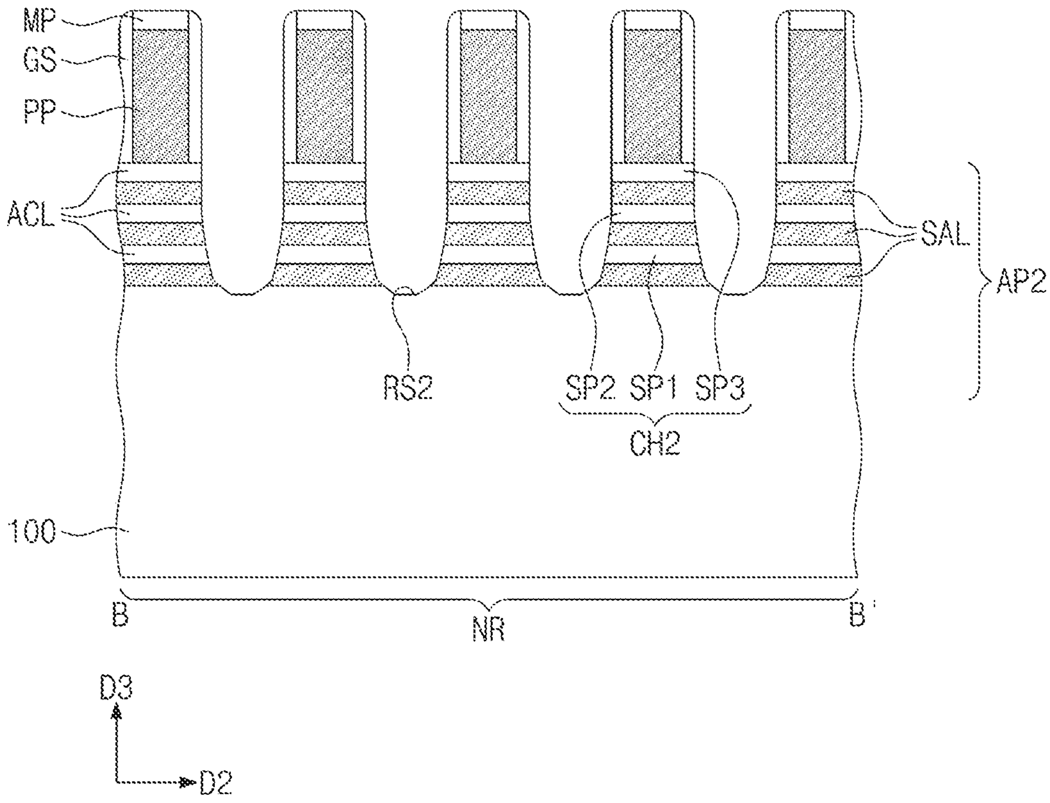
Figure 12C:
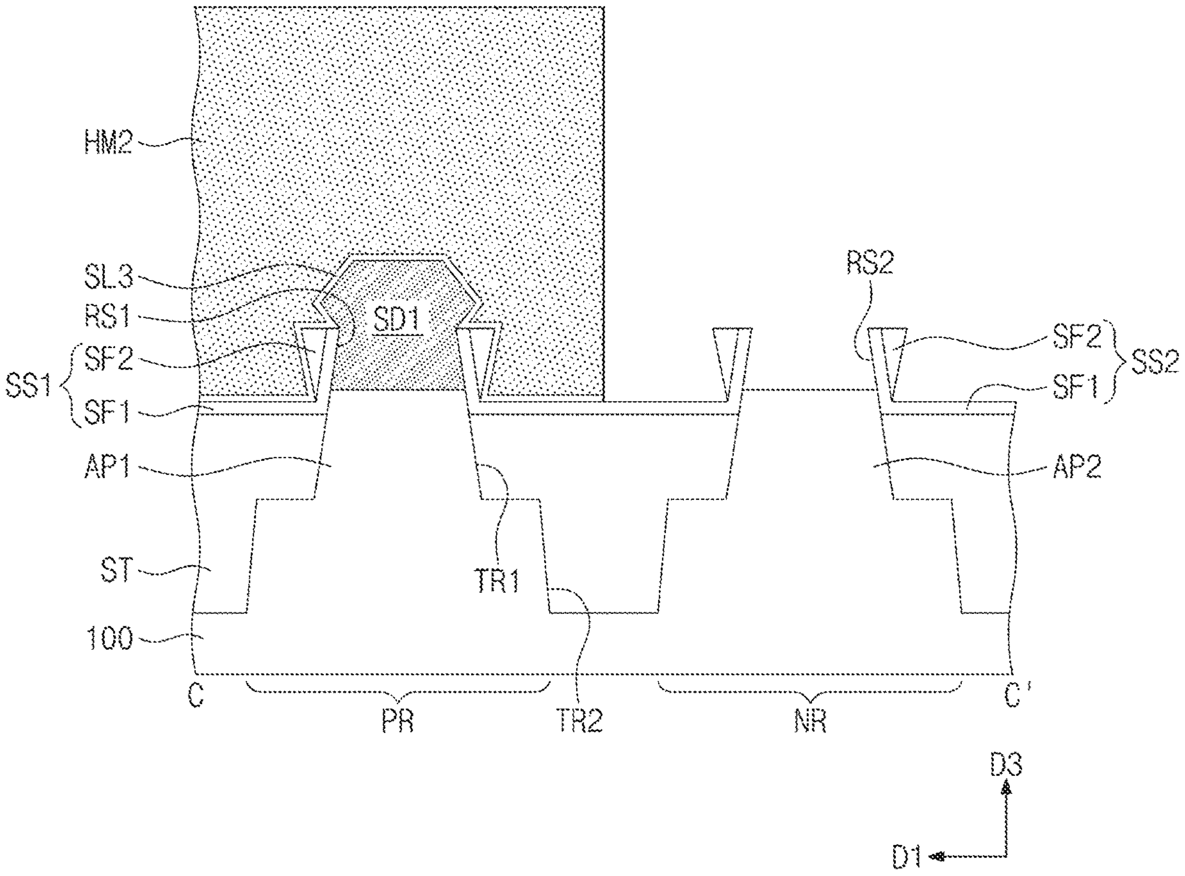
Figure 12D:
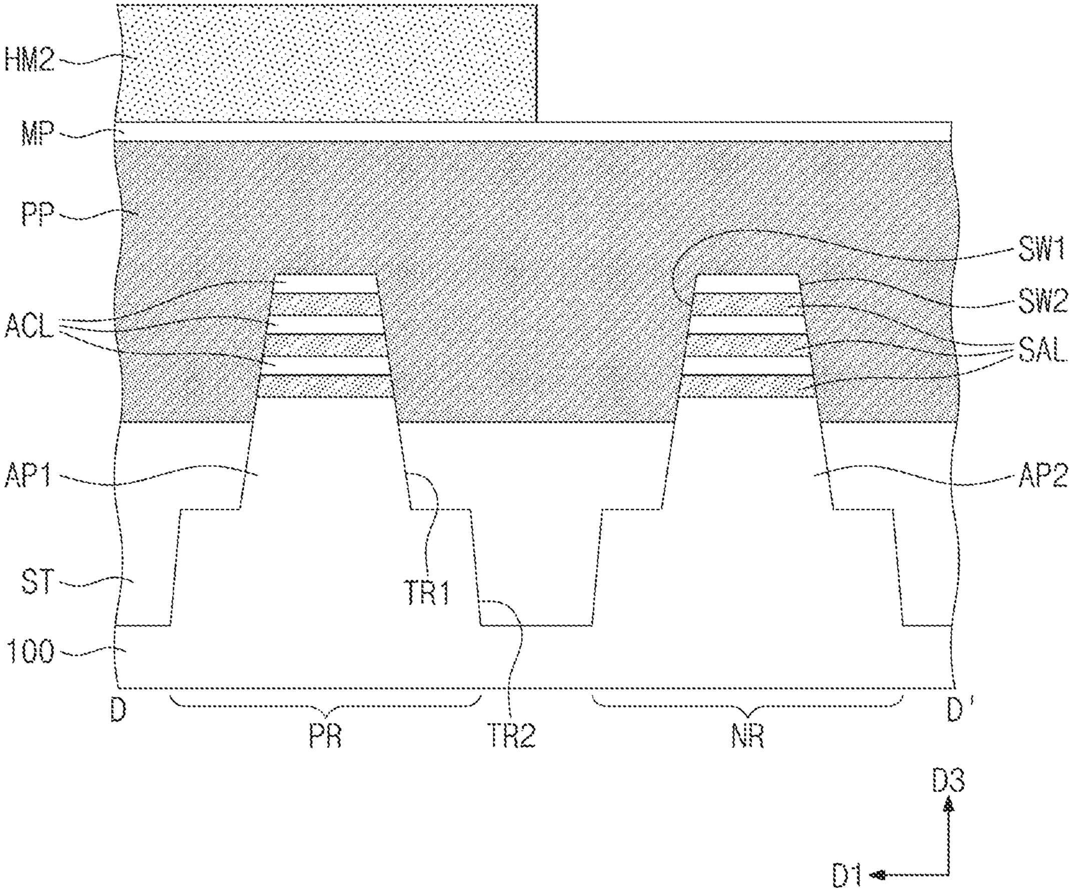

Referring to FIGS. 12A and 12B, the first mask pattern HM1 may be removed, and then, a third spacer layer SL3 may be formed. The third spacer layer SL3 may be formed of or include at least one of SiCN, SiCON, SiON, or SiN. Next, a second mask pattern HM2 may be formed to cover the PMOSFET region PR, and an etching process may be performed to form the second recesses RS2 in an upper portion of the second active pattern AP2. The second recesses RS2 in the upper portion of the second active pattern AP2 may be formed by substantially the same method as that for the first recesses RS1. Accordingly, the second fence spacer SS2 including the first and second fence portions SF1 and SF2 may be formed. The third spacer layer SL3 on the NMOSFET region NR may be removed during the formation of the second recesses RS2.

Figure 13A:
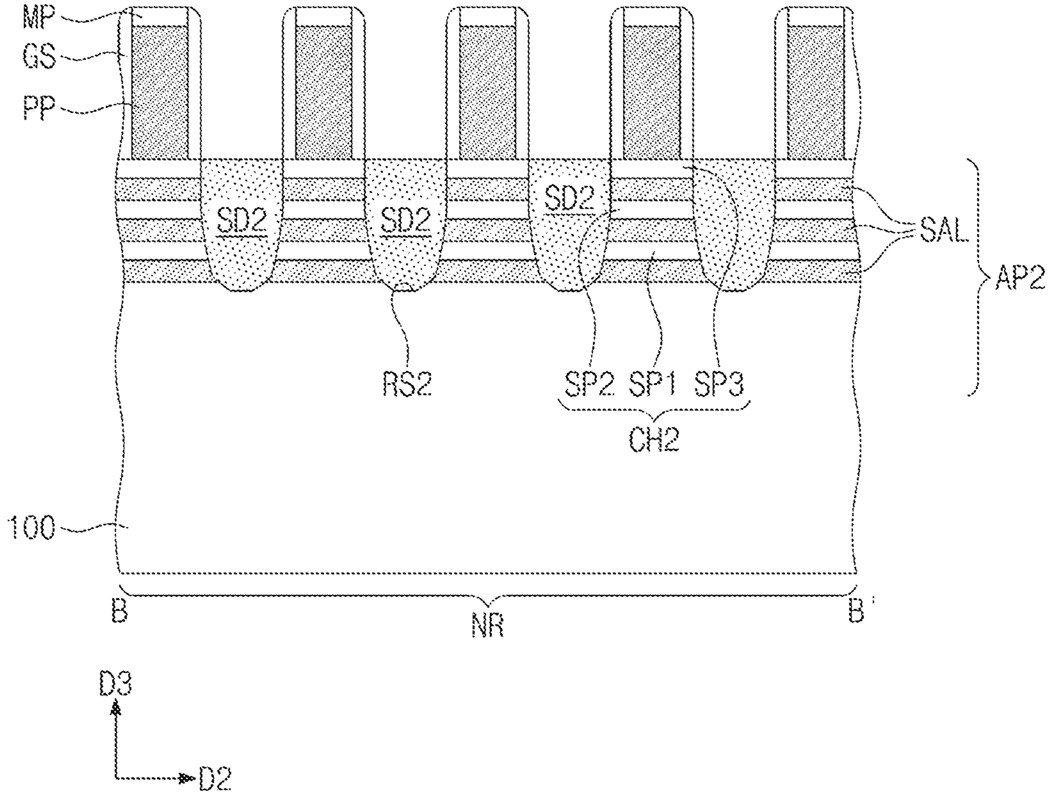
Figure 13B:
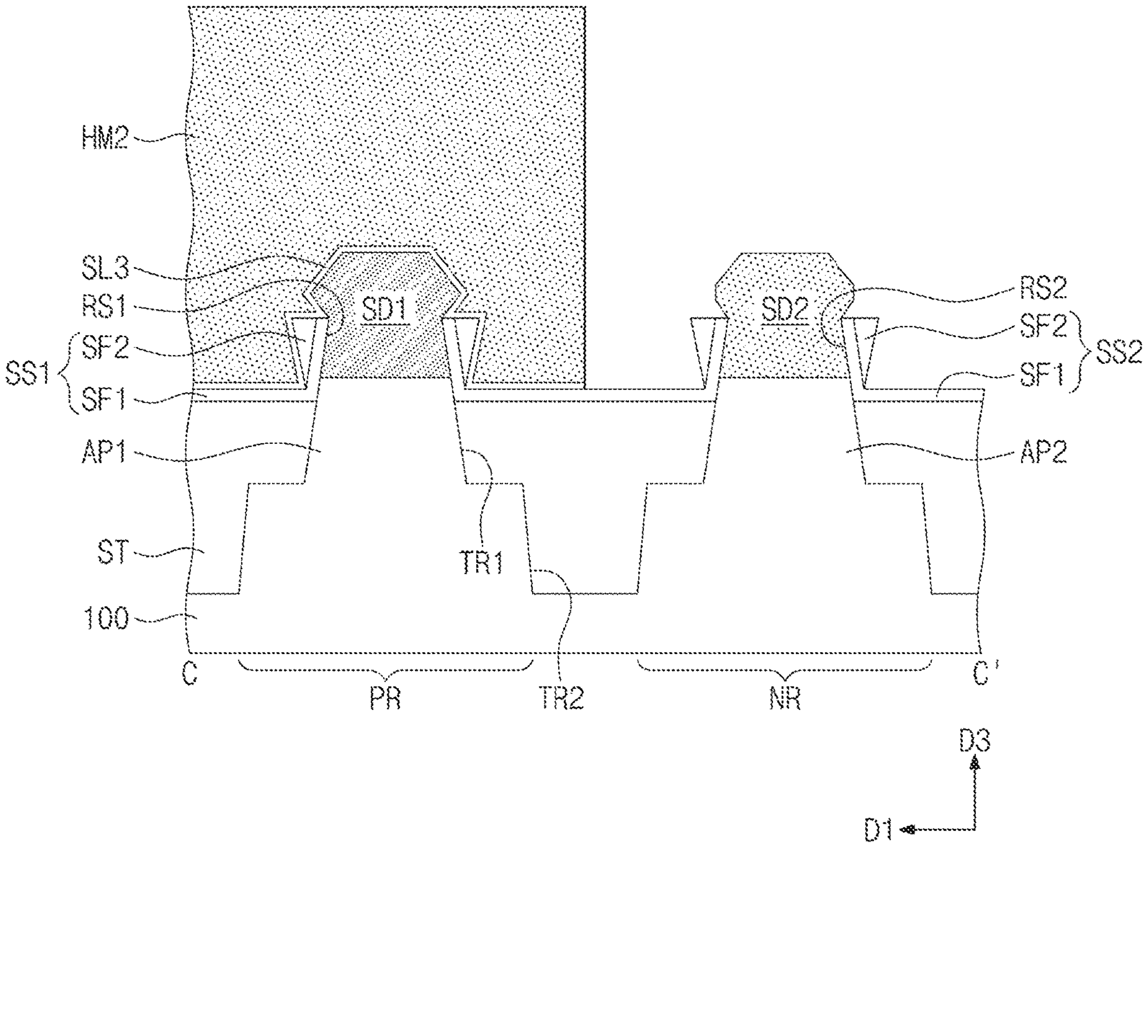

Referring to FIGS. 13A and 13B, the second source/drain pattern SD2 may be formed by a selective epitaxial growth process, in which an inner surface of the second recess RS2 is used as a seed layer. As an example, the second source/drain pattern SD2 may be formed of or include the same semiconductor material (e.g., Si) as the substrate 100. The second source/drain pattern SD2 may be doped to have a second conductivity type (e.g., n-type). The lateral growth of the second source/drain pattern SD2 may be restricted by the second fence spacer SS2 in the second recesses RS2. However, the lateral growth of the second source/drain pattern SD2 may not be restricted in a region above the top surface of the second fence spacer SS2, and thus, the second source/drain pattern SD2 may have an increased width in the first direction D1.

Referring to FIGS. 14A to 14D, the second mask pattern HM2 may be removed, and then, the first interlayer insulating layer 110 may be formed to cover the first and second source/drain patterns SD1 and SD2, the hard mask patterns MP, and the gate spacers GS. In an embodiment, the first interlayer insulating layer 110 may be formed of or include silicon oxide.

The first interlayer insulating layer 110 may be planarized to expose top surfaces of the sacrificial gate patterns PP. The planarization of the first interlayer insulating layer 110 may be performed by an etch-back or chemical mechanical polishing (CMP) process. All of the hard mask patterns MP may be removed during the planarization process. As a result, the first interlayer insulating layer 110 may have a top surface that is substantially coplanar with the top surfaces of the sacrificial gate patterns PP and the top surfaces of the gate spacers GS.

Figure 14A:
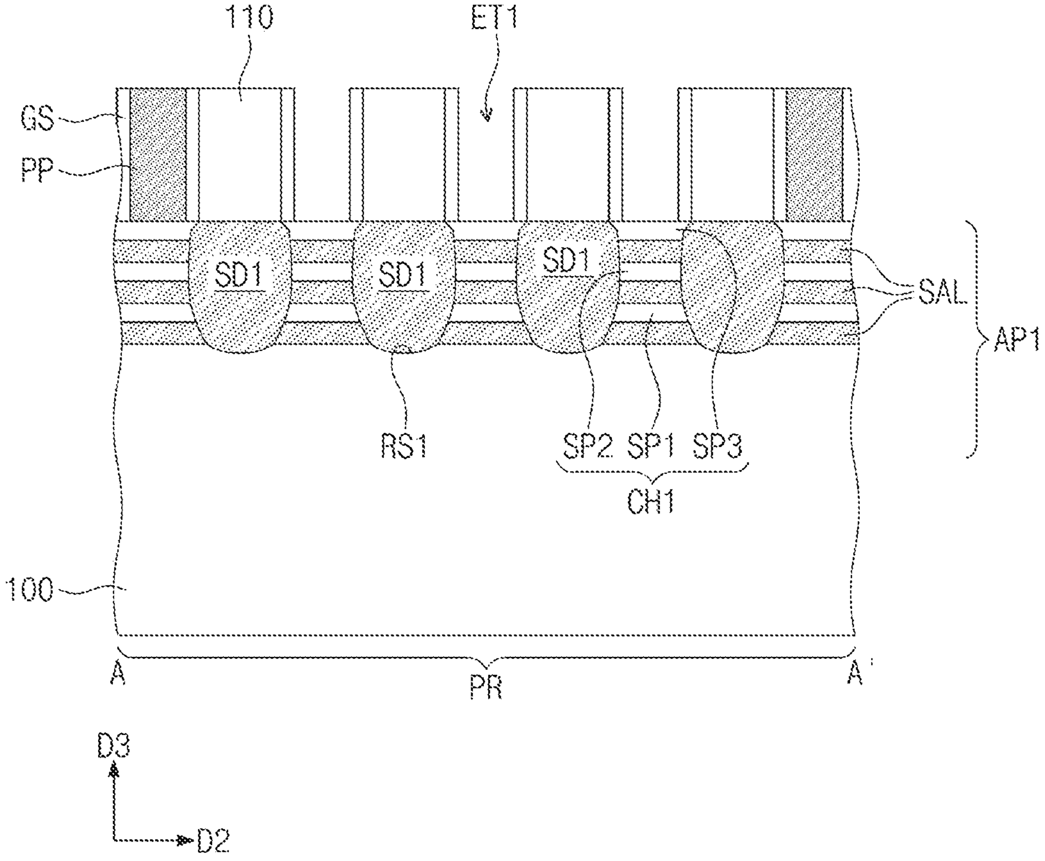
Figure 14B:
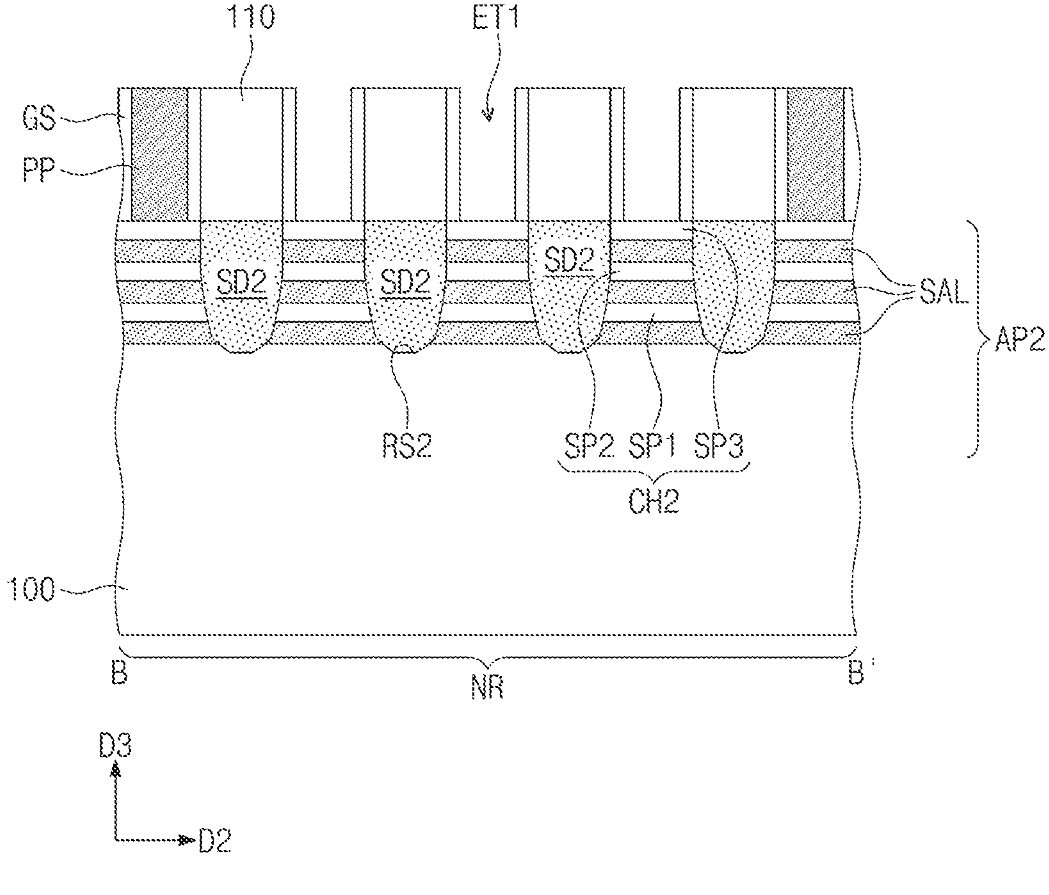
Figure 14C:
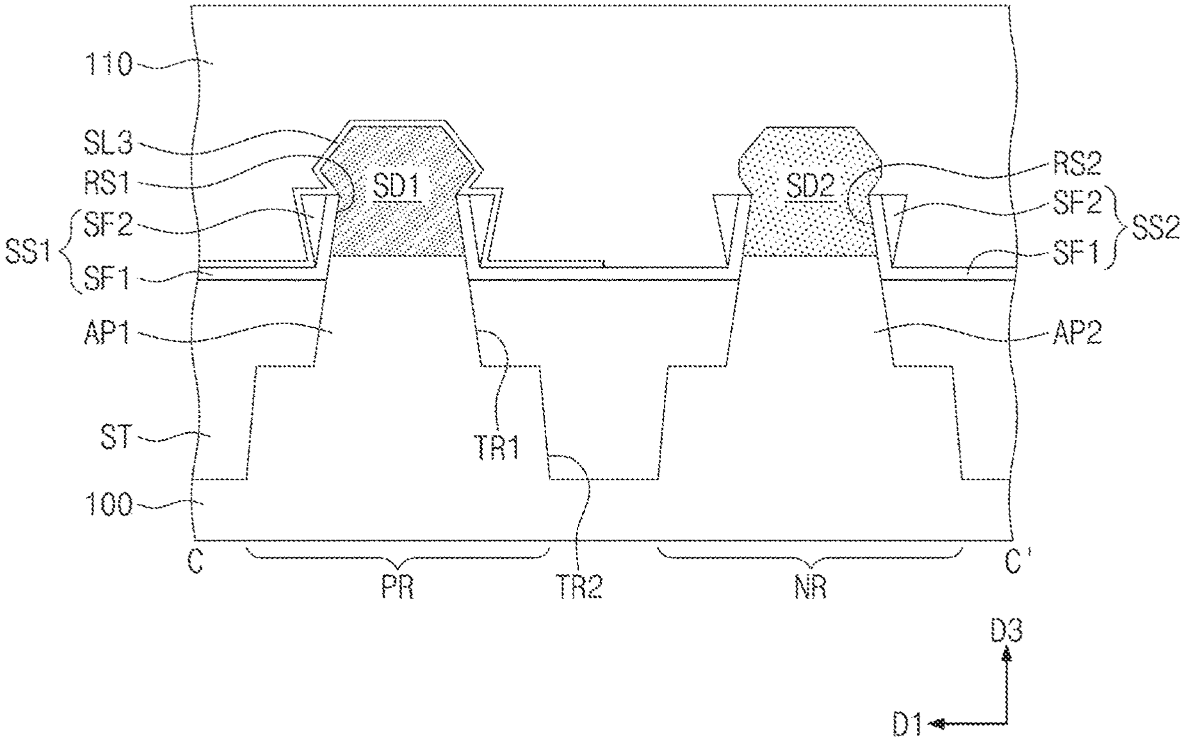
Figure 14D:
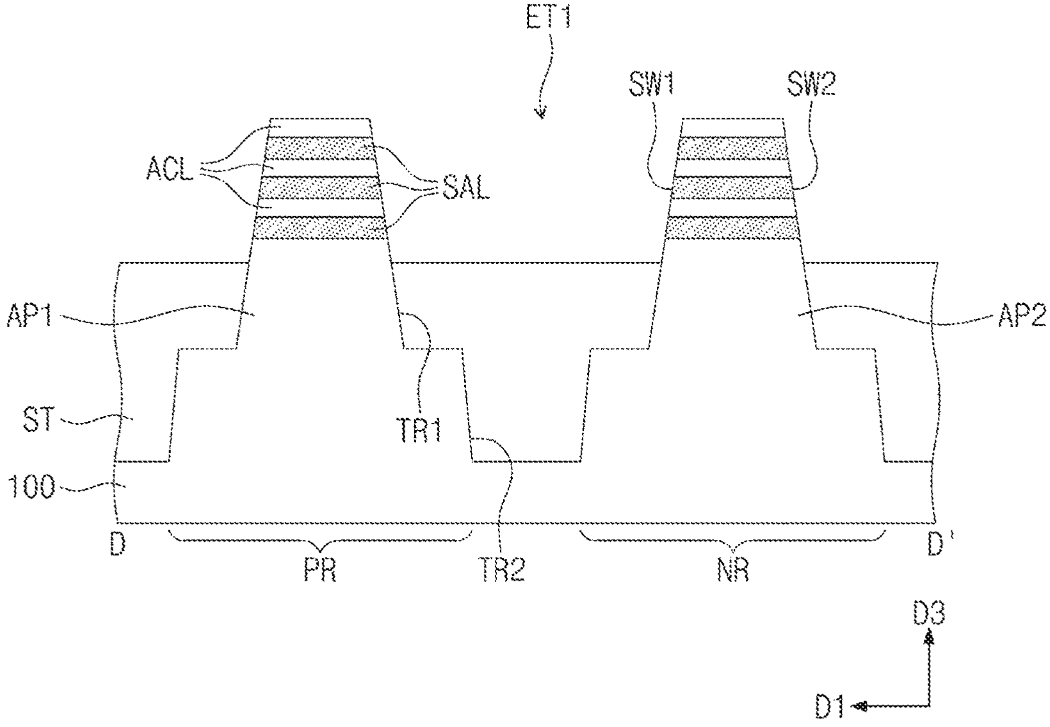
Figure 15A:
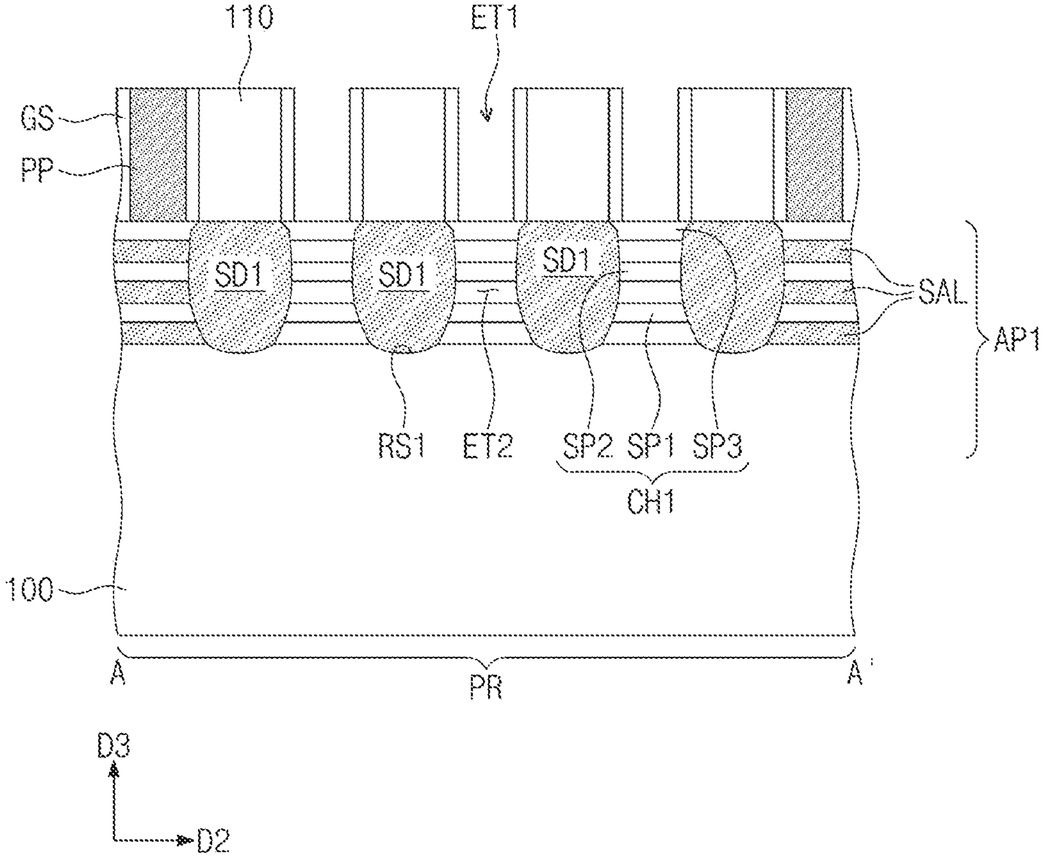
Figure 15B:
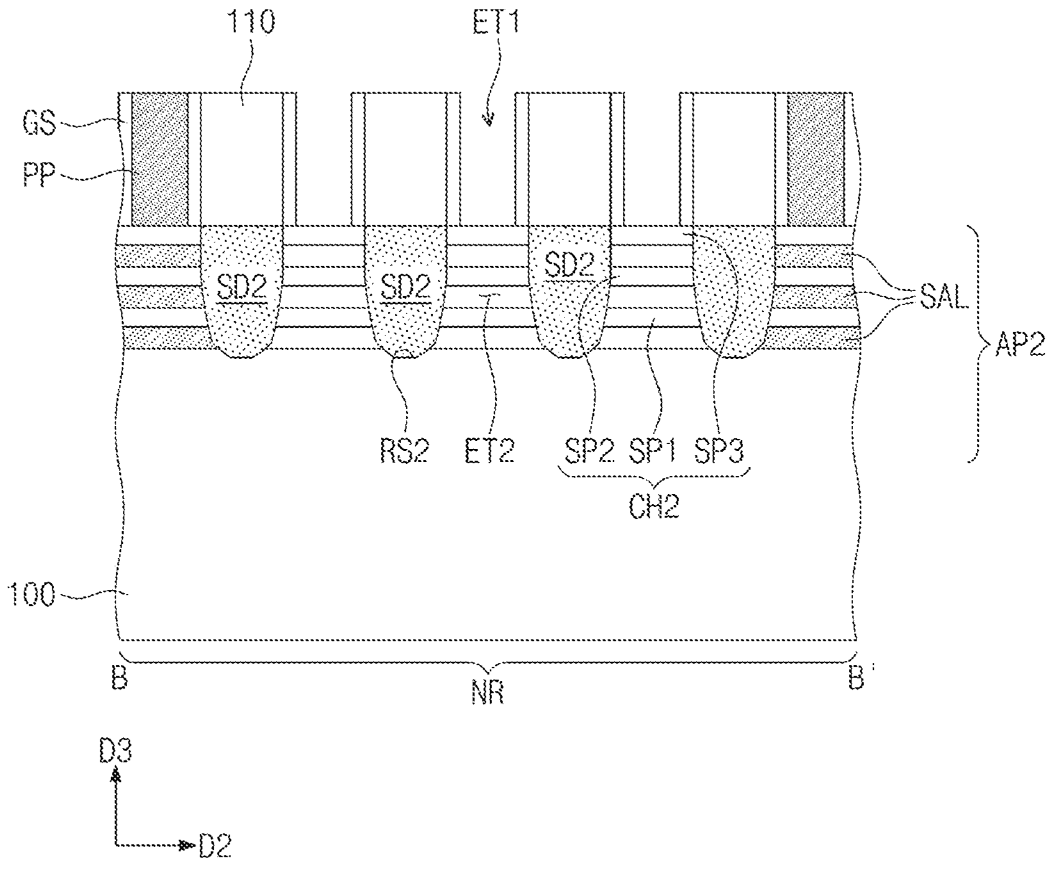
Figure 15C:
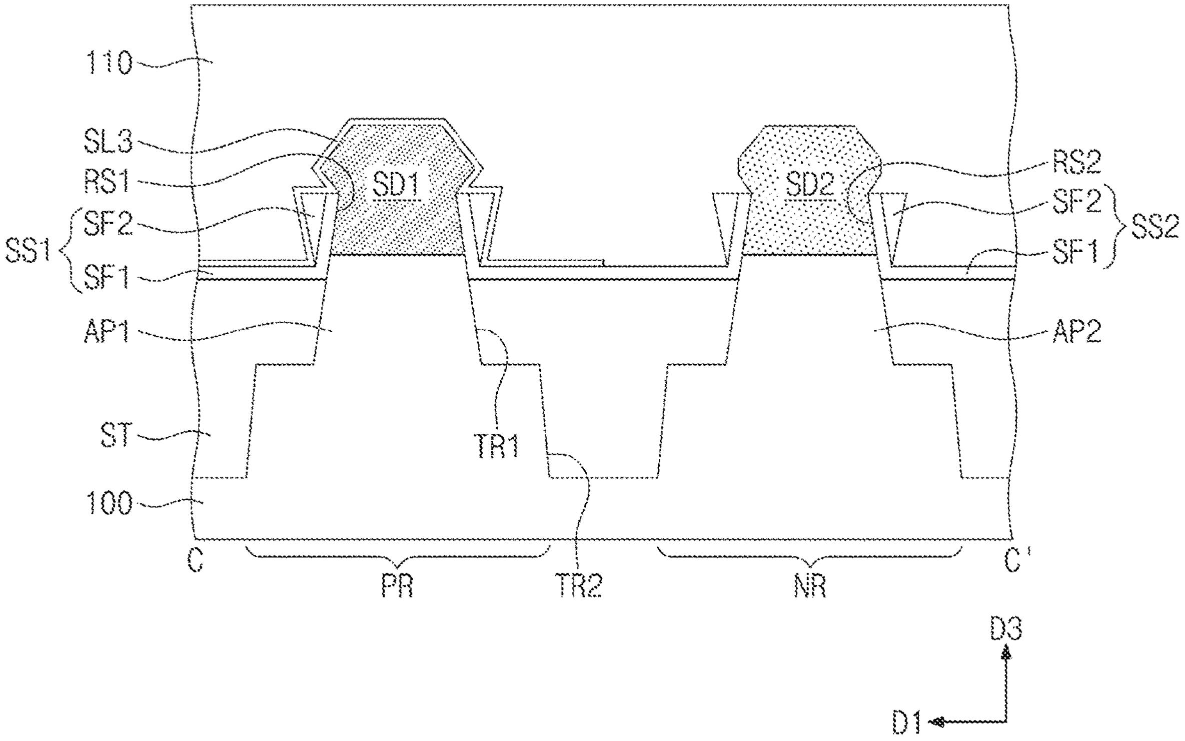
Figure 15D:
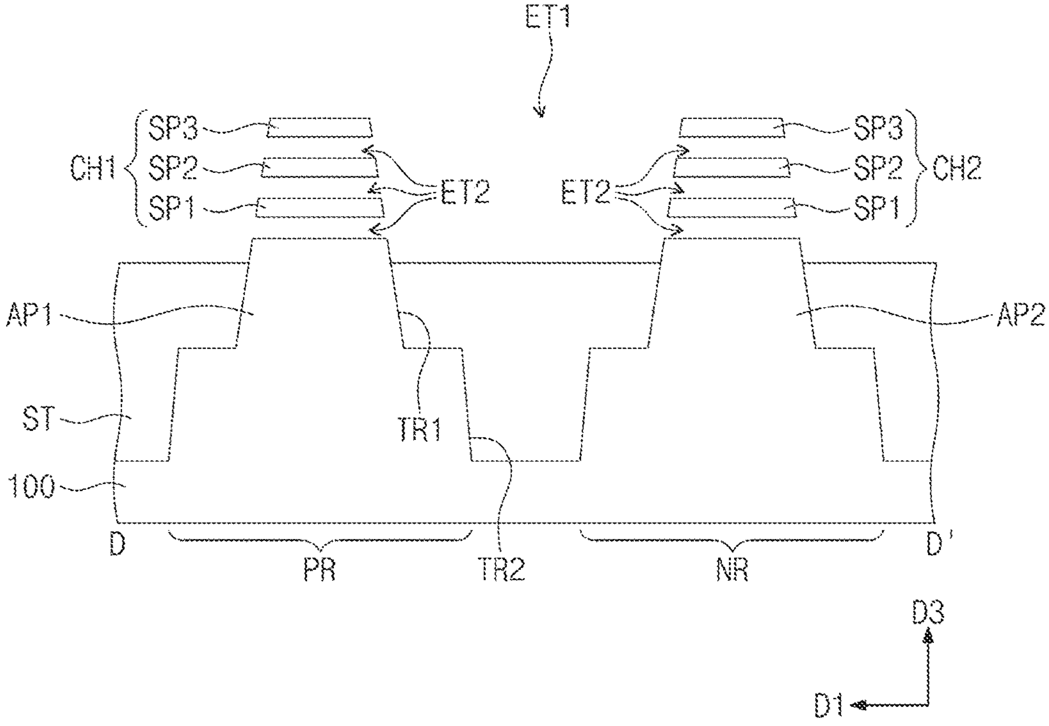
Figure 16A:
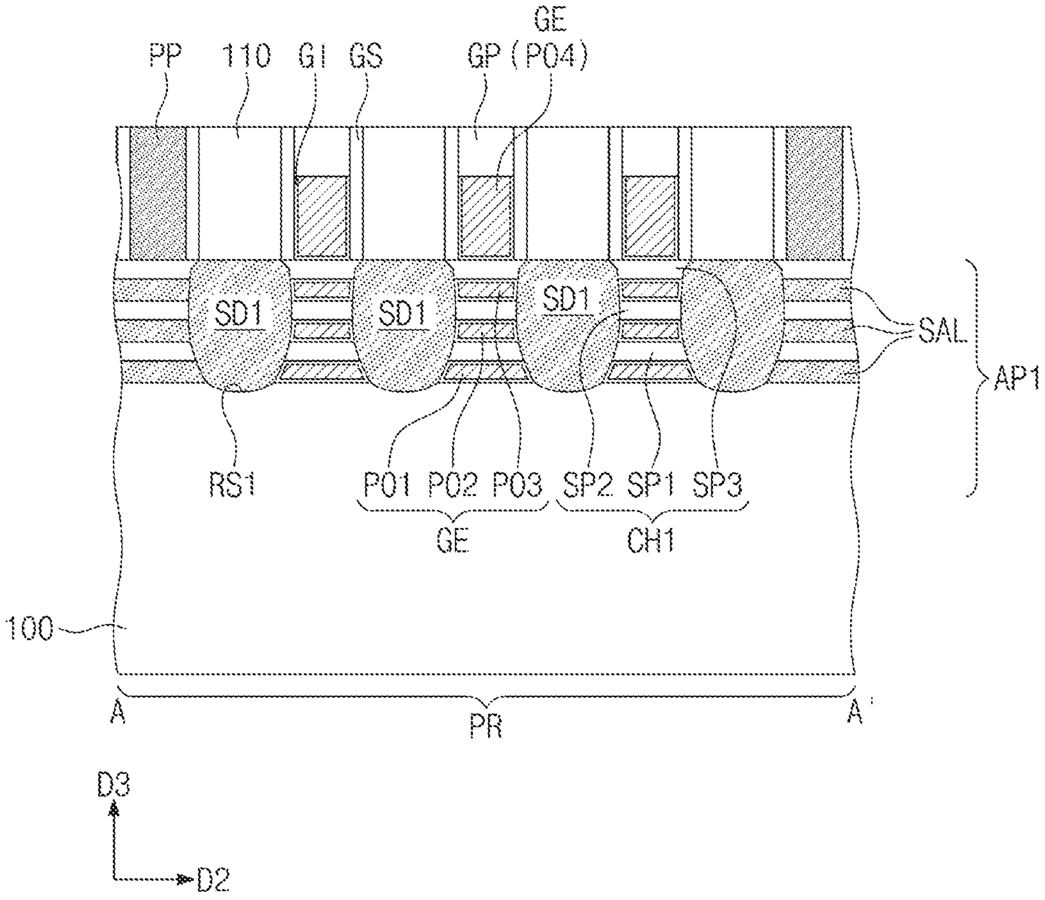
Figure 16B:
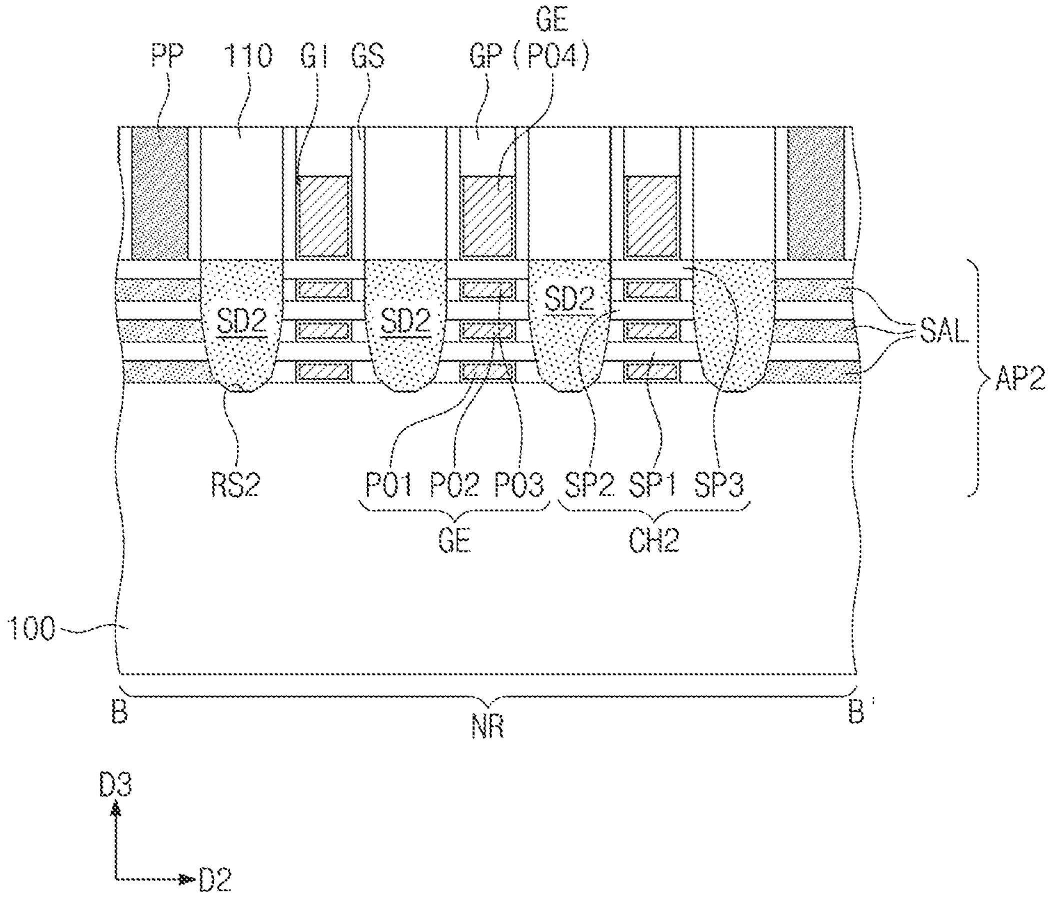
Figure 16C:
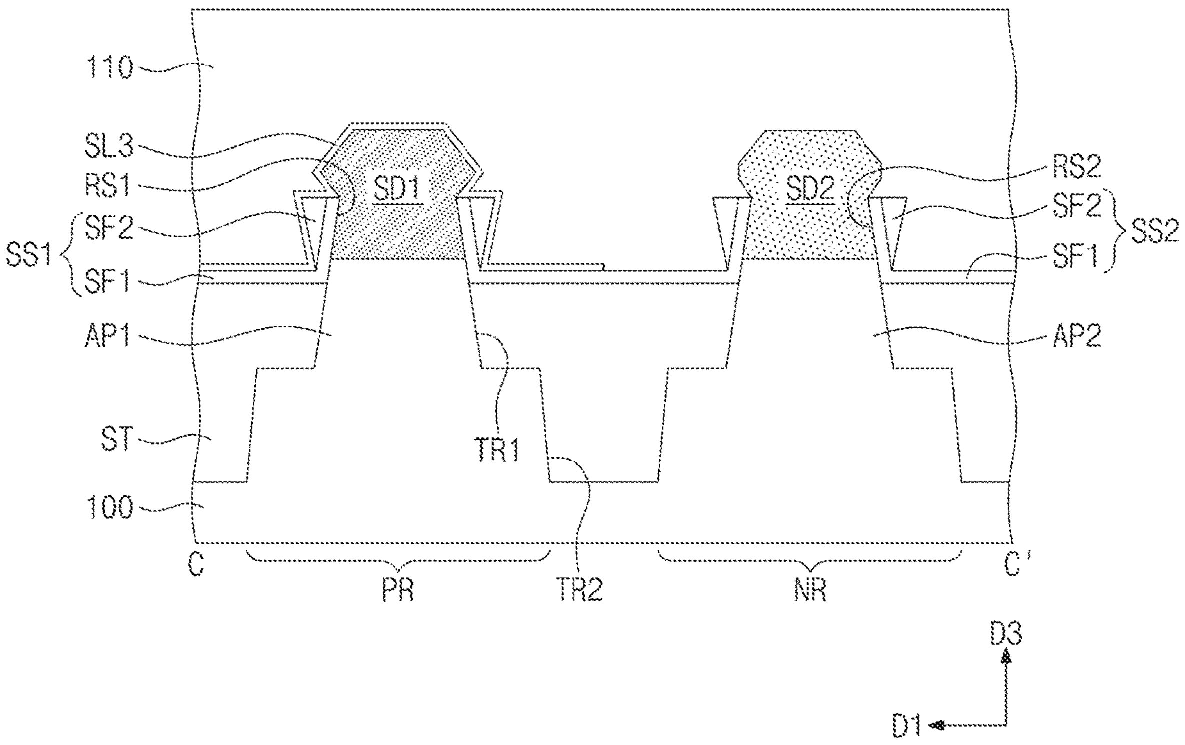
Figure 16D:
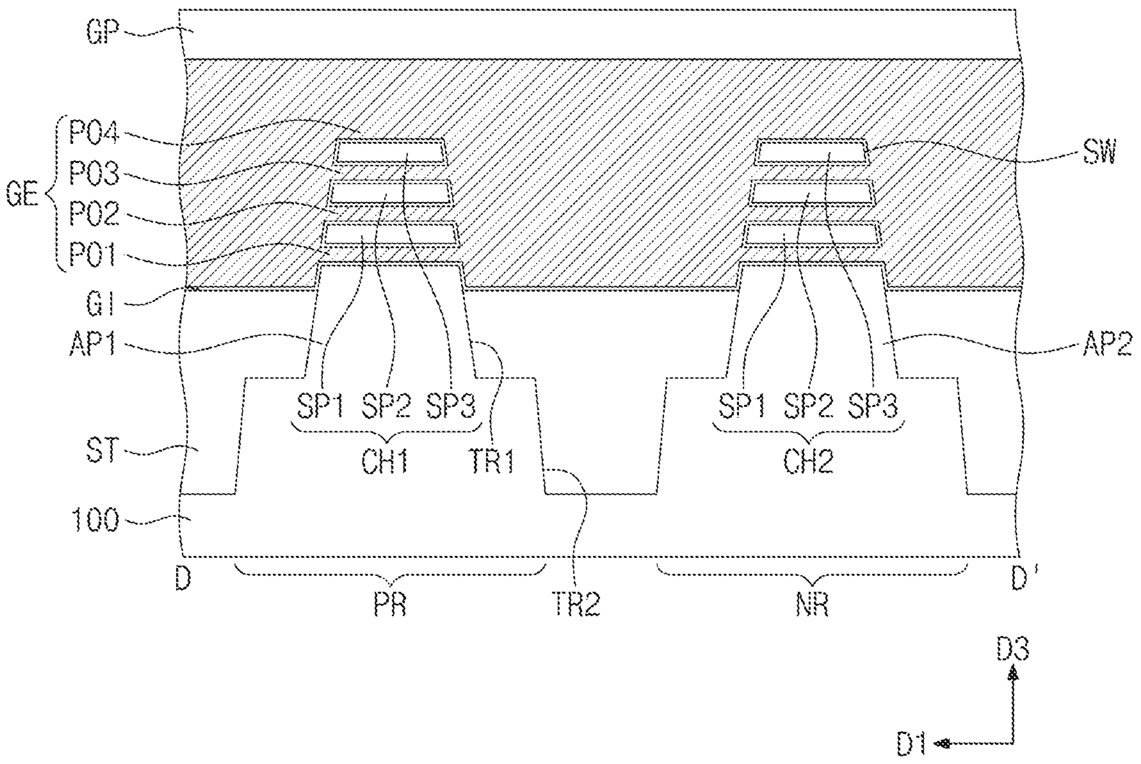

In an embodiment, the exposed sacrificial gate patterns PP may be selectively removed. As a result of the removal of the sacrificial gate pattern PP, first empty spaces ET1 exposing the first and second active patterns AP1 and AP2 may be formed, as shown in FIG. 14D. In an embodiment, portions of the sacrificial gate patterns PP may not be removed. For example, the sacrificial gate pattern PP near a cell border may not be removed. In detail, the sacrificial gate patterns PP, which may not be removed, may be left or may remain by forming a mask layer on the same. As a result of the removal of the sacrificial gate pattern PP, the first and second active patterns AP1 and AP2 may be exposed through the first empty space ET1.

Referring to FIGS. 15A to 15D, the sacrificial layers SAL exposed through the first empty space ET1 may be selectively removed. For example, referring back to FIG. 14D, the sacrificial layers SAL of each of the first and second active patterns AP1 and AP2 may be exposed to the outside through the first empty space ET1. The sacrificial layers SAL may be selectively removed by an etching process of selectively etching the sacrificial layers SAL (i.e., preventing or suppressing the first to third semiconductor patterns SP1, SP2, and SP3 from being etched).

The etching process may be chosen to exhibit a high etch rate for a material (e.g., SiGe) having a relatively high germanium concentration. For example, the etching process may have a high etch rate for silicon-germanium whose germanium concentration is higher than 10 at %. Since the sacrificial layers SAL are selectively removed, only the first to third semiconductor patterns SP1, SP2, and SP3 may be left on each of the first and second active patterns AP1 and AP2. That is, second empty spaces ET2 may be formed as the removal of the sacrificial layers SAL. The second empty spaces ET2 may be formed between the first to third semiconductor patterns SP1, SP2, and SP3.

Referring to FIGS. 16A to 16D, the gate insulating layer GI may be conformally formed in the first and second empty spaces ET1 and ET2. In detail, an interface layer may be formed on an exposed surface of each of the first to third semiconductor patterns SP1, SP2, and SP3. The interface layer may be formed using a thermal oxidation process. A high-k dielectric layer may be conformally formed on the interface layer. Thereafter, the gate electrode GE may be formed in the first and second empty spaces ET1 and ET2. The gate electrode GE may include the first to third portions PO1, PO2, and PO3 filling the second empty spaces ET2. The gate electrode GE may further include the fourth portion PO4 filling the first empty space ET1. The gate capping pattern GP may be formed on the gate electrode GE.

In an embodiment, the insulating patterns IP may be formed on the NMOSFET region NR, before the formation of the gate insulating layer GI. The insulating pattern IP may be formed to partially fill the second empty space ET2. In this case, the gate electrode GE on the NMOSFET region NR may be spaced apart from the second source/drain pattern SD2 with the insulating pattern IP interposed therebetween.

Referring back to FIGS. 1 and 2A to 2D, the second interlayer insulating layer 120 may be formed on the first interlayer insulating layer 110. The second interlayer insulating layer 120 may include a silicon oxide layer. The active contacts AC, which are electrically connected to the first and second source/drain patterns SD1 and SD2, may be formed to penetrate the second interlayer insulating layer 120 and the first interlayer insulating layer 110. The gate contact GC, which is electrically connected to the gate electrode GE, may be formed to penetrate the second interlayer insulating layer 120 and the gate capping pattern GP.

A pair of dividing structures DB may be formed at both sides of the logic cell LC. The dividing structure DB may be formed to penetrate the second interlayer insulating layer 120, the remaining sacrificial gate pattern PP, and an upper portion of the active pattern AP1 or AP2 below the sacrificial gate pattern PP. The dividing structure DB may be formed of or include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

According to an embodiment of the inventive concept, the fence spacers SS1 and SS2, which are thicker than the gate spacer GS, may extend to a greater height along side surfaces SW1, SW2 of the active regions AP1, AP2 as compared to some conventional spacers, which may be largely removed by etching processes for forming recesses RS1, RS2 to grow the source/drain patterns SD1, SD2. Due to this structure, the fence spacers SS1 and SS2 may suppress lateral growth of the source/drain patterns SD1 and SD2. Accordingly, it may be possible to reduce the largest widths WM1 and WM2 of the first and second source/drain patterns SD1 and SD2. In addition, the gate spacer GS may be maintained to a thickness that is smaller than the thicknesses of the fence spacers SS1 and SS2, and it may be possible to secure a space for the growth of the first and second source/drain patterns SD1 and SD2 between the gate electrodes GE and to increase an integration density of the semiconductor device.

Figure 17:
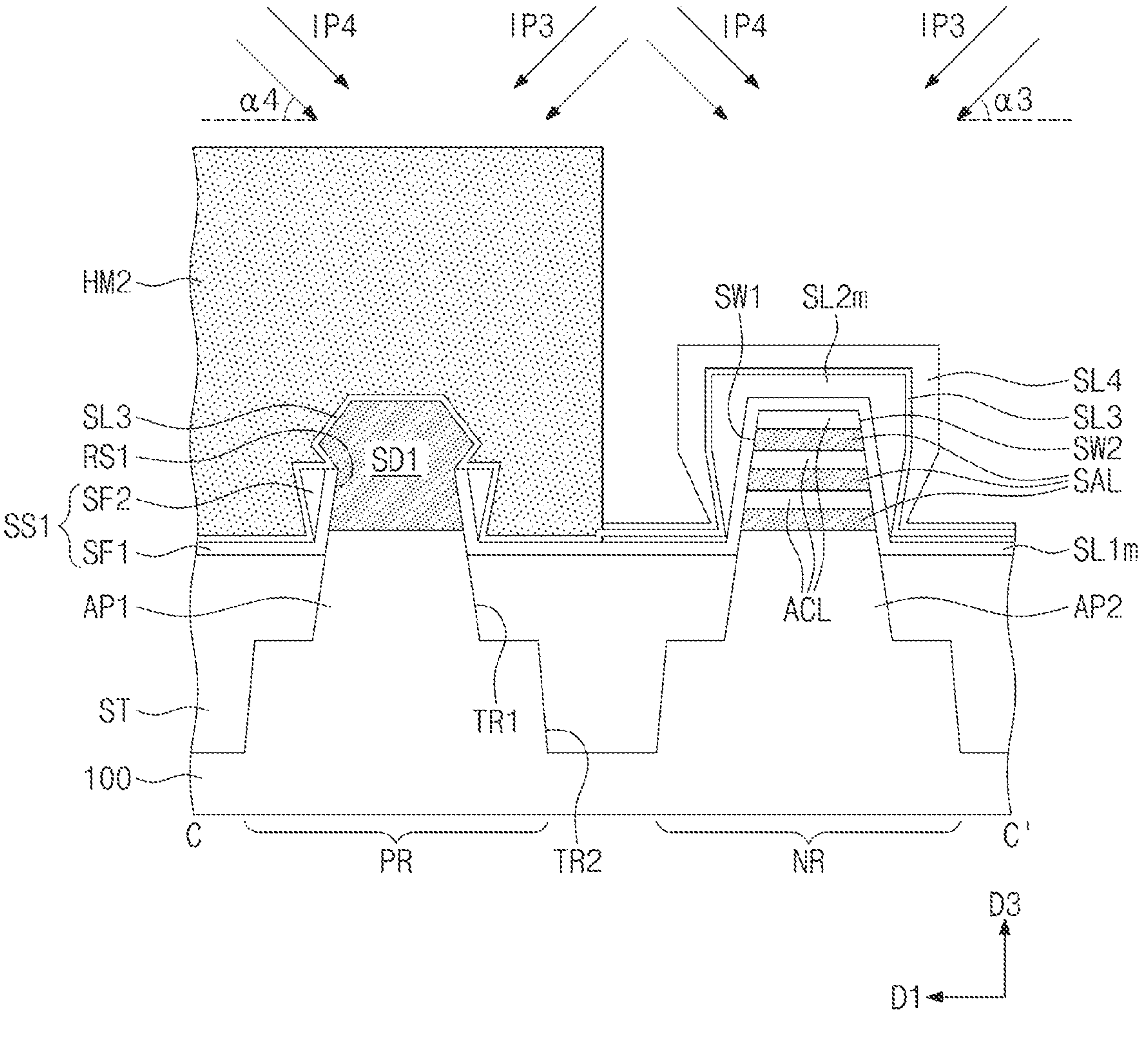
FIGS. 17, 18, and 19 are sectional views, which are taken along the line C-C' of FIG. 1 to illustrate a semiconductor device according to an embodiment of the inventive concept and a method of fabricating the same.
Figure 18:
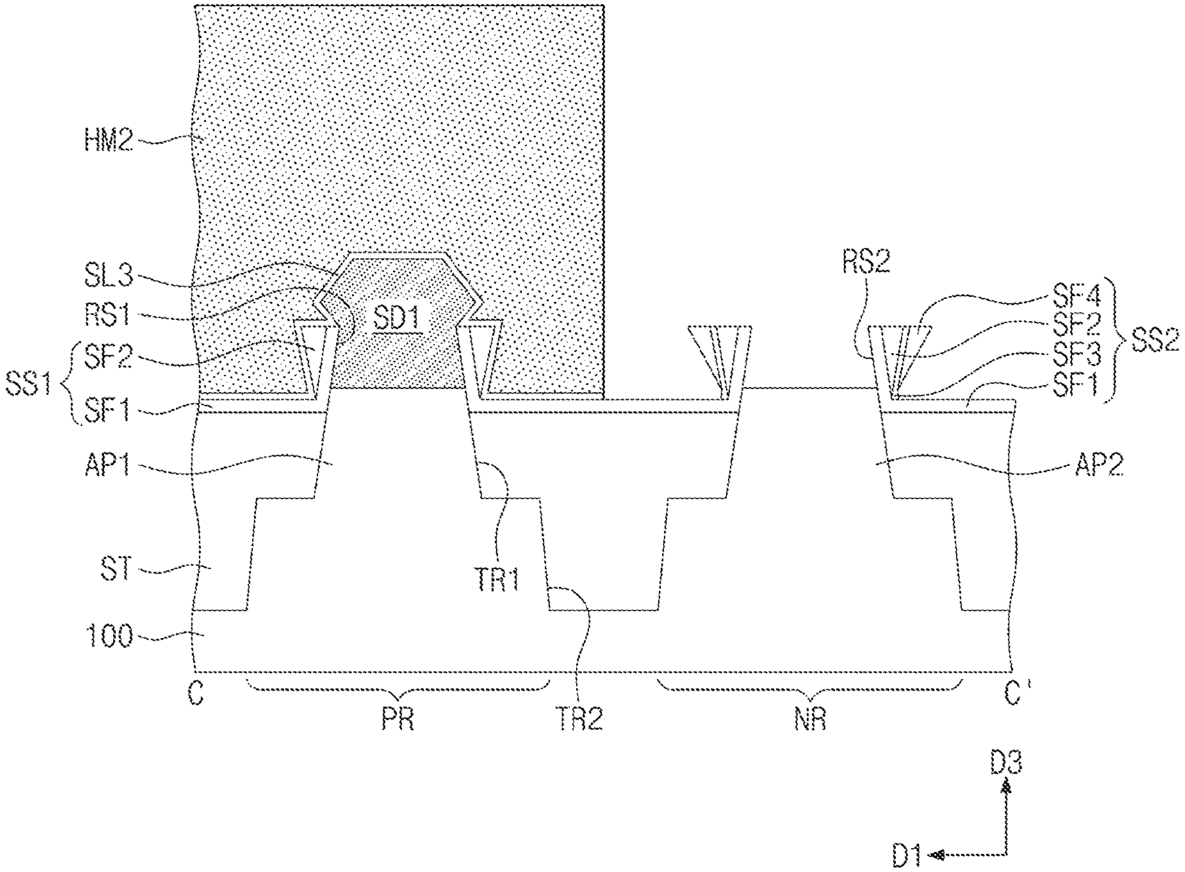
Figure 19:
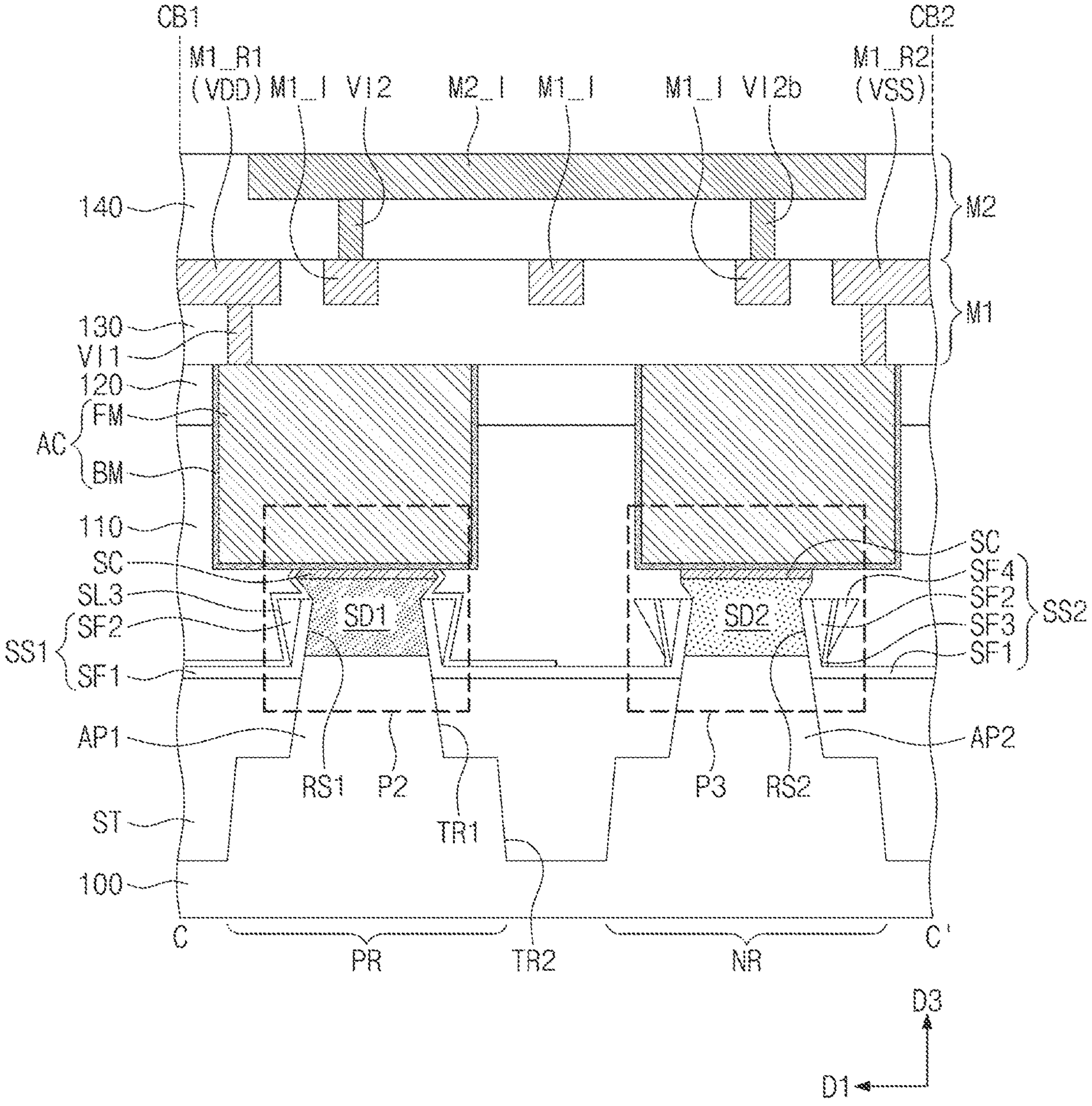
Figure 20A:
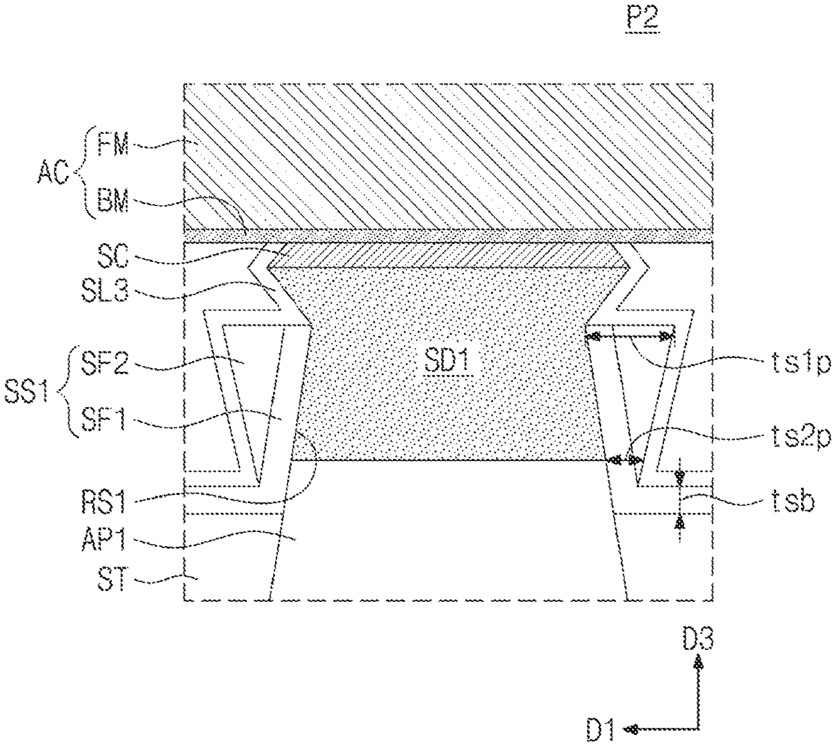
FIGS. 20A and 20B are enlarged sectional views illustrating portions P2 and P3 of FIG. 19.
Figure 20B:
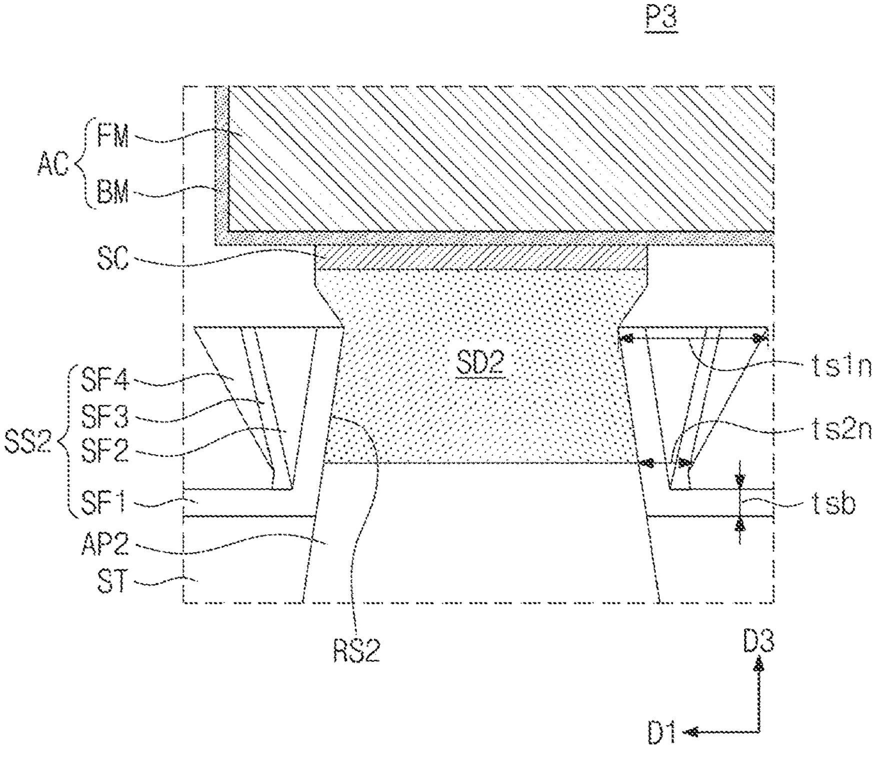

FIGS. 17 to 19 are sectional views, which are taken along the line C-C' of FIG. 1 to illustrate a semiconductor device according to an embodiment of the inventive concept and a method of fabricating the same. FIGS. 20A and 20B are enlarged sectional views illustrating portions P2 and P3 of FIG. 19. For concise description, a previously described element may be identified by the same reference number without repeating description thereof.

Referring to FIG. 17, when the process described with reference to FIGS. 11A and 11B is finished, the first mask pattern HM1 may be removed, and then, the third spacer layer SL3 may be formed. Thereafter, the second mask pattern HM2 may be formed to cover the PMOSFET region PR.

A fourth spacer layer SL4 may be formed on the NMOSFET region NR, which is exposed to the outside, to cover the third spacer layer SL3. The fourth spacer layer SL4 may be formed in a manner that is similar to the formation of the second spacer layer SL2 described with reference to FIGS. 8 and 9A to 9C. For example, the fourth spacer layer SL4 may be formed by a directional deposition process. However, the deposition thickness of the fourth spacer layer SL4 may be smaller than that of the second spacer layer SL2.

In an embodiment, the directional deposition process may include a third deposition process IP3, which is performed in the first direction D1, and a fourth deposition process IP4, which is performed in a direction opposite to the first direction D1. The third and fourth deposition processes IP3 and IP4 may be sequentially performed in a listed order or in a reversed order. The third deposition process IP3 may be performed at a third angle $\alpha 3$ relative to the top surface of the substrate 100, and the fourth deposition process IP4 may be performed at a fourth angle $\alpha 4$ relative to the top surface of the substrate 100. In some embodiments, the third angle $\alpha 3$ and the fourth angle $\alpha 4$ may be equal to each other, but in other embodiments, they may be different from each other. As a result of the third deposition process IP3, an insulating layer may be formed on the second side surface SW2 to have a relatively large thickness. As a result of the fourth deposition process IP4, an insulating layer may be formed on the first side surface SW1 to have a relatively large thickness. Similar to the second spacer layer SL2 described with reference to FIG. 9B, the fourth spacer layer SL4 may be thinly formed on the side surfaces of the sacrificial gate patterns PP, which are formed on the NMOSFET region NR. The fourth spacer layer SL4 may be formed after the formation of the second mask pattern HM2, as described above, but in an embodiment, the fourth spacer layer SL4 may be formed before the formation of the second mask pattern HM2.

Referring to FIG. 18, an etching process may be performed to form the second recesses RS2 in an upper portion of the second active pattern AP2. Accordingly, the second fence spacer SS2 may be formed to include not only the first fence portion SF1 and the second fence portion SF2 but also a third fence portion SF3 and a fourth fence portion SF4. The third fence portion SF3 may be formed from the third spacer layer SL3, and the fourth fence portion SF4 may be formed from the fourth spacer layer SL4.

Referring to FIGS. 19, 20A, and 20B, the processes described with reference to FIGS. 13A to 16D may be performed, and then, the processes described with reference to FIGS. 2A to 2D may be performed to finish a process of forming the logic cell LC. The first fence spacer SS1 may have the same structure as that described with reference to FIG. 3B, whereas the second fence spacer SS2 may be formed to have an increased upper width, compared with the structure described with reference to FIG. 3C. As a result, the first and second fence spacers SS1 and SS2 may have different structures from each other, for example, due to the presence of fewer or more fence portions SF3, SF4.

In more detail, the first fence spacer SS1 may include the first and second fence portions SF1 and SF2 and may have an upper thickness $ts1p$ at its upper portion and a lower thickness $ts2p$, which is smaller than the upper thickness $ts1p$, at its lower portion. The second fence spacer SS2 may include first to fourth fence portions SF1-SF4 and may have an upper thickness $ts1n$ at its upper portion and a lower thickness $ts2n$, which is smaller than the upper thickness $ts1n$, at its lower portion. The upper thickness $ts1n$ of the second fence spacer SS2 may be greater than the upper thickness $ts1p$ of the first fence spacer SS1. As an example, the upper thickness $ts1n$ of the second fence spacer SS2 may be about 1.2 to 1.6 times the upper thickness $ts1p$ of the first fence spacer SS1. The thickness tsb of the bottom portion of the first fence portion SF1 may be substantially the same value, at the first and second fence spacers SS1 and SS2. The thickness tg of the gate spacer GS may be substantially equal to that in the structure described with reference to FIG. 3A and may be smaller than the thicknesses of the first and second fence spacers SS1 and SS2.

Figure 21A:
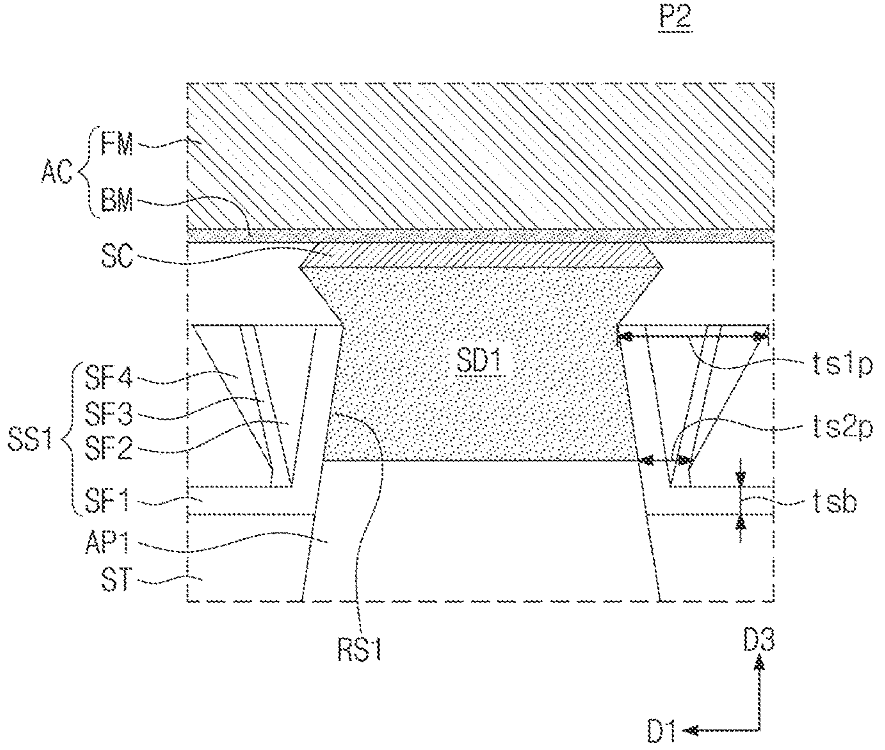
FIGS. 21A and 21B are enlarged sectional views illustrating portions (e.g., P2 and P3 of FIG. 19) of a semiconductor device according to an embodiment of the inventive concept.
Figure 21B:
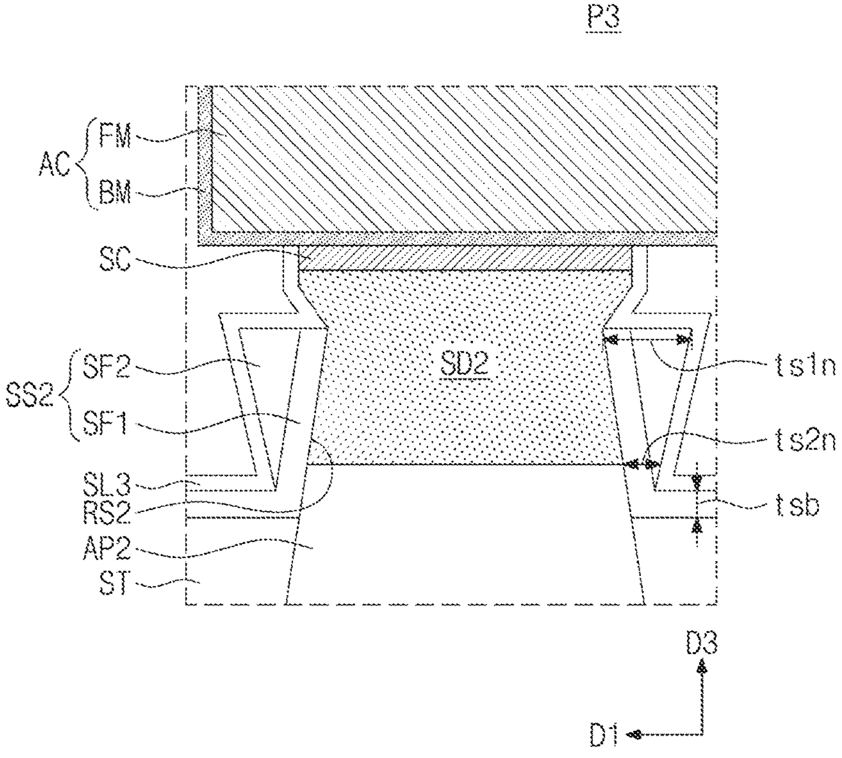

FIGS. 21A and 21B are enlarged sectional views illustrating portions (e.g., P2 and P3 of FIG. 19) of a semiconductor device according to an embodiment of the inventive concept.

Referring to FIGS. 21A and 21B, the first and second fence spacers SS1 and SS2 according to the present embodiment may have a structure, which is formed when the second fence spacer SS2 is formed in advance before the formation of the first fence spacer SS1 in the fabrication process described with reference to FIGS. 2A to 16D. In other words, the first mask pattern HM1 may be formed to cover the PMOSFET region PR, after the process of FIGS. 9A to 9C, and then, the second recesses RS2 and the second source/drain pattern SD2 may be formed. Thereafter, the second mask pattern HM2 may be formed to cover the NMOSFET region NR, and then, the first recesses RS1 and the first source/drain pattern SD1 may be formed.

The directional deposition process of the fourth spacer layer SL4 described with reference to FIGS. 17 to 19 may be performed before the formation of the first recesses RS1. As a result, the first fence spacer SS1 may be formed to include the first to fourth fence portions SF1-SF4. Since the fourth spacer layer SL4 is not formed in the NMOSFET region NR, the second fence spacer SS2 may be formed to include the first and second fence portions SF1 and SF2 but not the third and fourth fence portions SF3 and SF4. In addition, since the second source/drain pattern SD2 is formed after the formation of the first source/drain pattern SD1, the third spacer layer SL3 covering the second source/drain pattern SD2 may be locally formed in the NMOSFET region NR, in contrast to the structure illustrated in FIGS. 3B and 3C.

Figure 22:
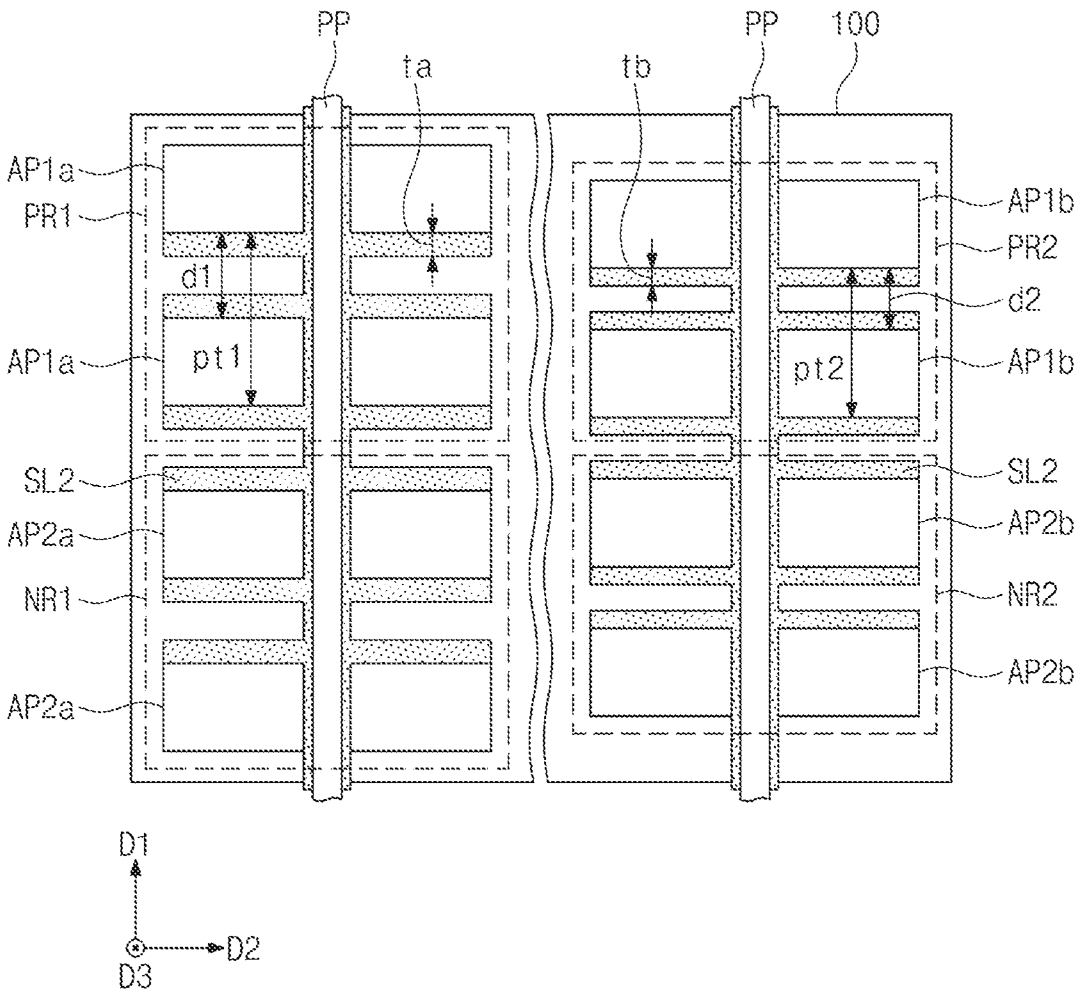
FIG. 22 is a plan view illustrating a semiconductor device according to an embodiment of the inventive concept.
Figure 23A:
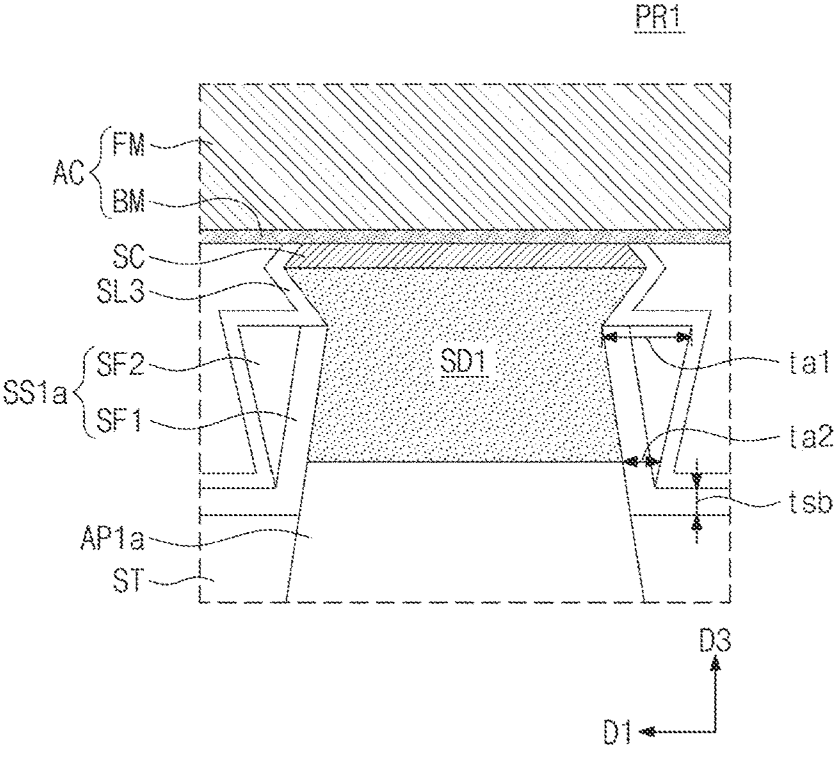
FIG. 23A is an enlarged sectional view illustrating a first PMOSFET region PR1 of FIG. 22.
Figure 23B:
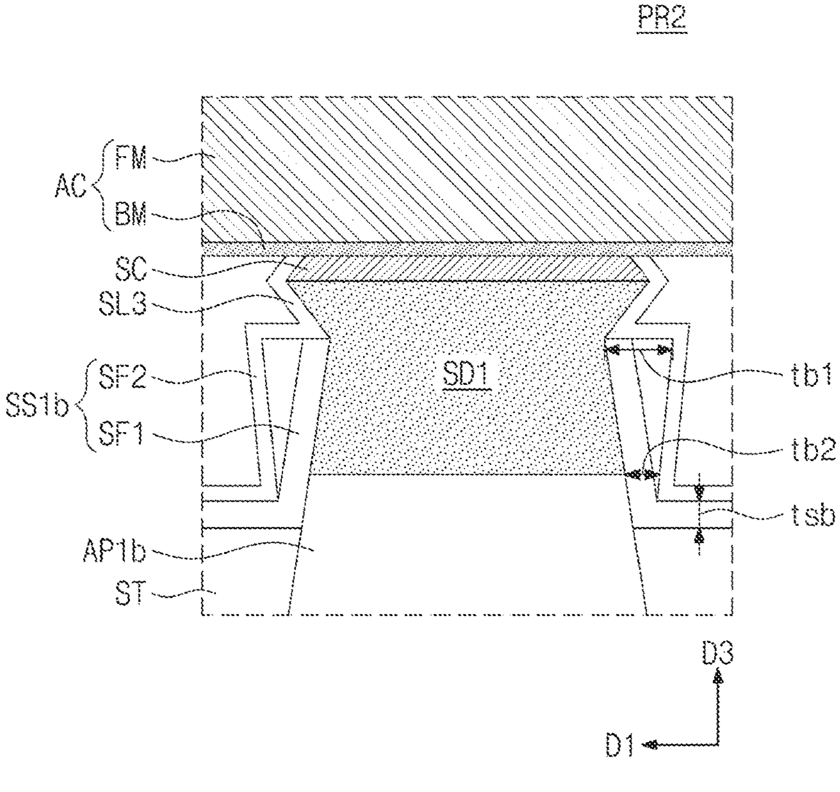
FIG. 23B is an enlarged sectional view illustrating a second PMOSFET region PR2 of FIG. 22.

FIG. 22 is a plan view illustrating a semiconductor device according to an embodiment of the inventive concept. FIG. 23A is an enlarged sectional view illustrating a first PMOS- FET region PR1 of FIG. 22. FIG. 23B is an enlarged sectional view illustrating a second PMOSFET region PR2 of FIG. 22.

FIG. 22 is a plan view illustrating the semiconductor device, when a fabrication process is at the stage shown in FIG. 8. In the present embodiment, the semiconductor device may include a first PMOSFET region PR1 and a second PMOSFET region PR2, which are arranged in the second direction D2, and a first NMOSFET region NR1 and a second NMOSFET region NR2, which are arranged in the second direction D2. Active patterns AP1*a* and AP2*a*, which are provided in a region (hereinafter, a first region) including the first PMOSFET region PR1 and the first NMOSFET region NR1, may be arranged a first pitch pt1 in the first direction D1. A distance between the active patterns AP1*a* and AP2*a* in the first region may be a first distance d1.

Active patterns AP1*b* and AP2*b*, which are provided in a region (hereinafter, a second region) including the second PMOSFET region PR2 and the second NMOSFET region NR2, may be arranged with a second pitch pt2 in the first direction D1. A distance between the active patterns AP1*b* and AP2*b* in the second region may be a second distance d2. The second pitch pt2 may be smaller than the first pitch pt1. Similarly, the second distance d2 may be smaller than the first distance d1. That is, the second region may be a region, in which the active patterns having a pitch smaller than the first region are provided.

In the directional deposition process of the second spacer layer SL2 described with reference to FIGS. 8 and 9A to 9C, a deposition thickness of the second spacer layer SL2 may vary depending on the pitch of the active patterns. For example, in the case where the pitch of the active patterns is small, the afore-described shielding effect may be enhanced, and in this case, the thickness of the second spacer layer SL2 deposited on the side surfaces may be smaller than that in a large-pitch region. That is, as shown in FIG. 22, a thickness ta of the second spacer layer SL2 formed in the first region may be greater than a thickness tb of the second spacer layer SL2 formed in the second region.

In detail, a 1a-th fence spacer SS1*a* of FIG. 23A, which is formed in the first PMOSFET region PR1, may be thicker than a 1b-th fence spacer SS1*b* of FIG. 23B, which is formed in the second PMOSFET region PR2. An upper thickness ta1 of the 1a-th fence spacer SS1*a* may be greater than an upper thickness tb1 of the 1b-th fence spacer SS1*b*. A lower thickness ta2 of the 1a-th fence spacer SS1*a* may be greater than a lower thickness tb2 of the 1b-th fence spacer SS1*b*.

Figure 24A:
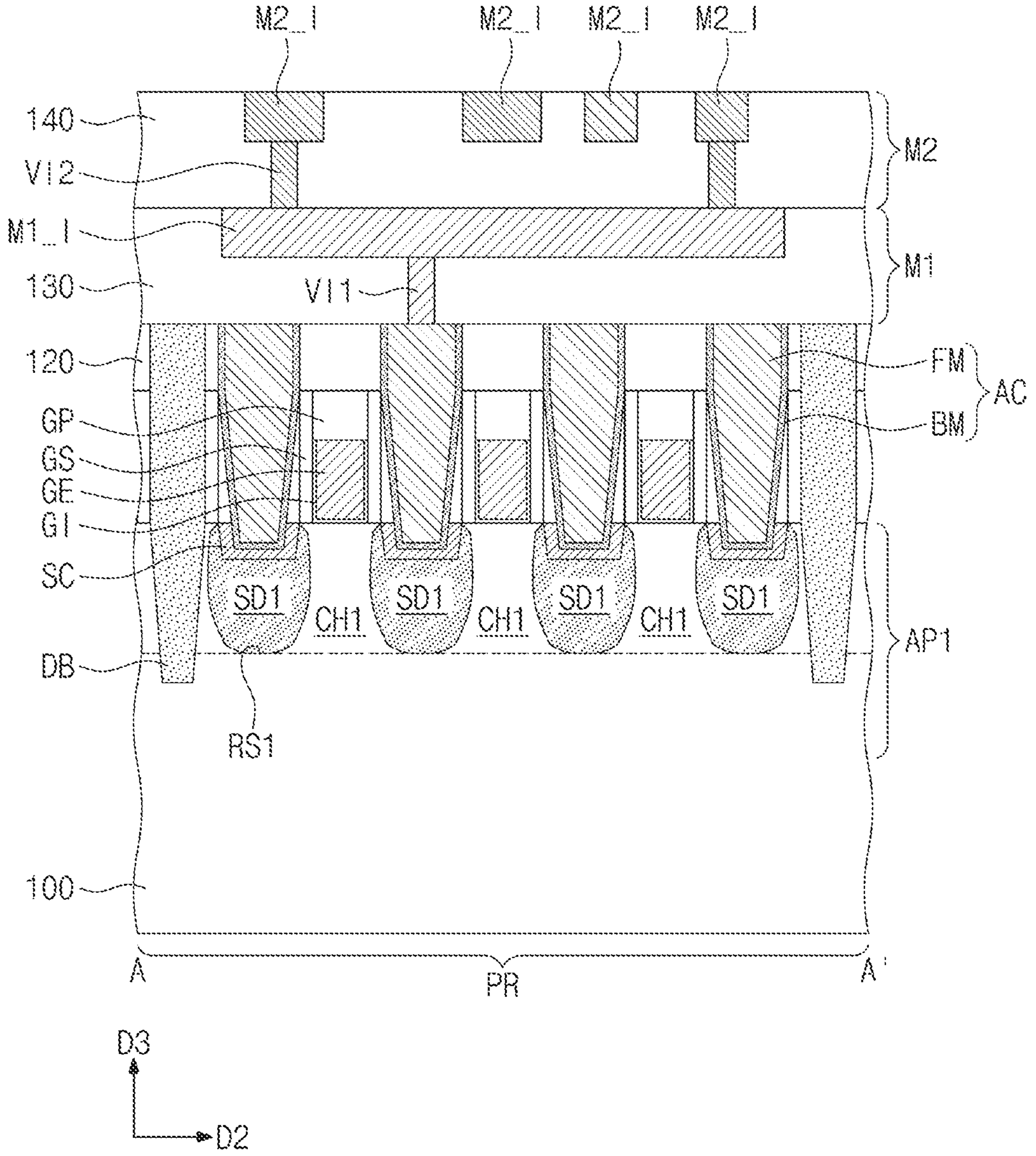
FIGS. 24A and 24B are sectional views, which are respectively taken along lines A-A' and B-B' of FIG. 1 to illustrate a semiconductor device according to an embodiment of the inventive concept.
Figure 24B:
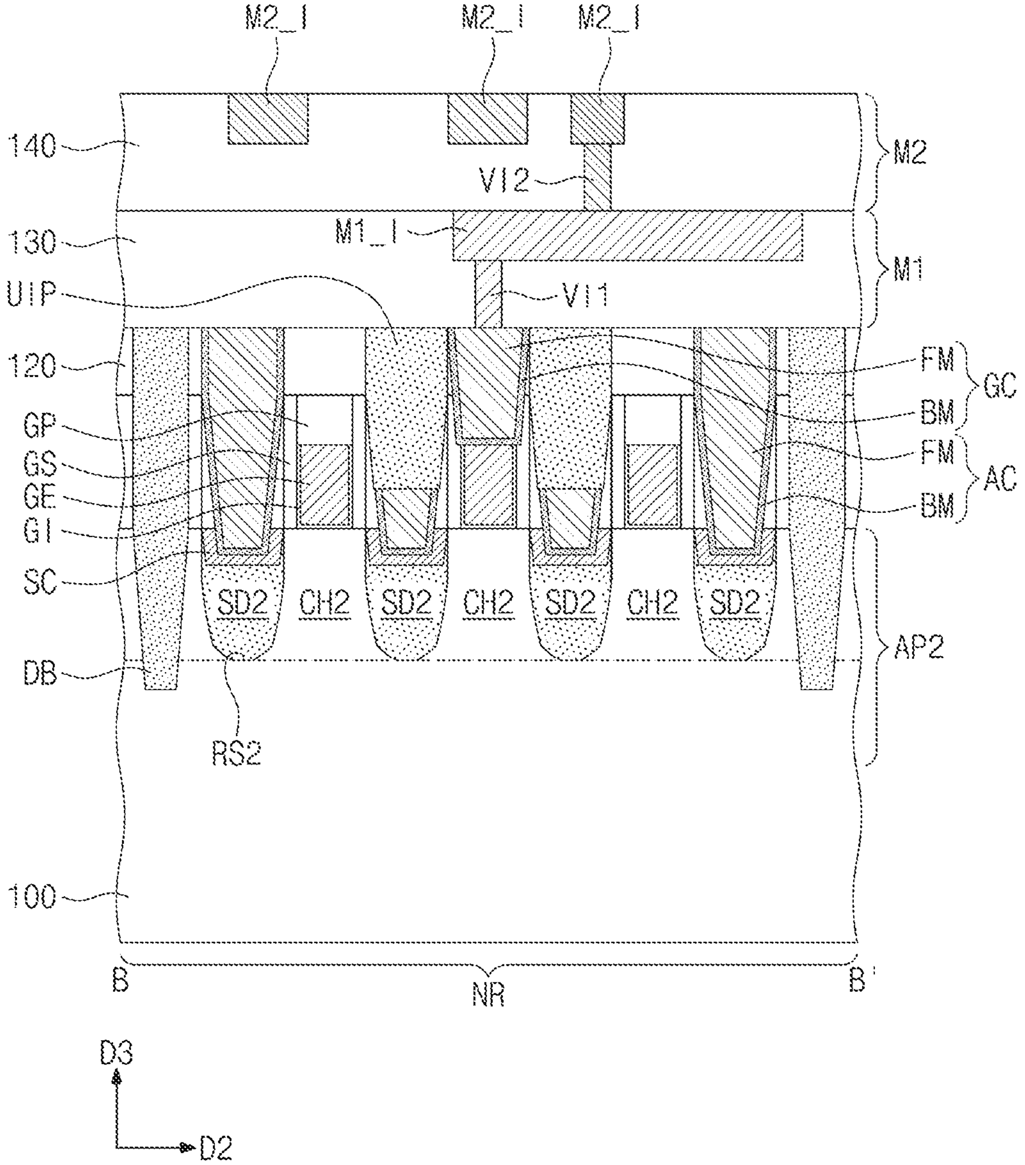

FIGS. 24A and 24B are sectional views, which are respectively taken along lines A-A' and B-B' of FIG. 1 to illustrate a semiconductor device according to an embodiment of the inventive concept.

According to the present embodiments, the first active pattern AP1 may include the first channel pattern CH1, which is a fin-shaped pattern protruding from the substrate 100. The second active pattern AP2 may include the second channel pattern CH2 which is a fin-shaped pattern protruding from the substrate 100. The first and second channel patterns CH1 and CH2 may be semiconductor patterns, which are formed from an upper portion of the substrate 100, and may be connected to the substrate 100. Each of the gate electrodes GE may extend along protruding top surfaces of the first and second channel patterns CH1 and CH2.

The first source/drain patterns SD1 may be provided in the first recesses RS1 between the first channel patterns CH1. The second source/drain patterns SD2 may be provided in the second recesses RS2 between the second channel pattern CH2. Other elements may be configured to have substantially the same features as those described with reference to FIGS. 2A to 2D.

In a method of fabricating a semiconductor device according to an embodiment of the inventive concept, fence spacers, which are used to suppress lateral growth of source/drain patterns, may be formed to have a relatively large thickness and large height, and thus, it may be possible to prevent the source/drain patterns from being unintentionally connected to each other. In addition, the thickness of the gate spacers may be maintained to be smaller than a thickness of fence spacers, and this may make it possible to increase an integration density of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   - forming active patterns extending in a second direction on a substrate;
   - forming sacrificial gate patterns crossing the active patterns and extending in a first direction;
   - forming a first spacer layer on side surfaces of the active patterns and side surfaces of the sacrificial gate patterns;
   - performing a first directional deposition process on the first spacer layer in the first direction and in a direction opposite to the first direction to form a second spacer layer on the first spacer layer;
   - removing portions of the active patterns that are exposed between the sacrificial gate patterns to form recesses between the sacrificial gate patterns;
   - forming source/drain patterns in the recesses; and
   - replacing the sacrificial gate patterns with gate electrodes.

2. The method of claim 1, wherein the first directional deposition process is an ion implantation directional deposition process, and the first directional deposition process comprises a first deposition process that is performed in the first direction, and a second deposition process that is performed in the direction opposite to the first direction.

3. The method of claim 2, wherein the first deposition process is performed at a first angle relative to a top surface of the substrate, and the second deposition process is performed at a second angle relative to the top surface of the substrate.

4. The method of claim 1, wherein:
   - the substrate comprises a first region and a second region;
   - the forming of the recesses comprises:
     - forming first recesses in the first region; and
     - forming second recesses in the second region;
   - the forming of the source/drain patterns in the recesses comprises:
     - forming first source/drain patterns in the first recesses; and
     - forming second source/drain patterns in the second recesses; and
   - the method further comprises forming a third spacer layer by performing a second directional deposition process between the forming of the first source/drain patterns and the forming of the second source/drain patterns.

5. The method of claim 1, wherein the second spacer layer is formed to be thicker on the side surfaces of the active patterns than on the side surfaces of the sacrificial gate patterns.

6. The method of claim 1, wherein the forming of the recesses comprises:

removing portions of the first spacer layer to form a gate spacer on side surfaces of the sacrificial gate patterns.

7. The method of claim 6, wherein the forming of the recesses further comprises:

removing the second spacer layer from the side surfaces of the sacrificial gate patterns.

8. The method of claim 6, wherein the forming of the recesses comprises:

removing portions of the first spacer layer and the second spacer layer to form a fence spacer defining the recesses between the sacrificial gate patterns.

9. The method of claim 8, wherein the fence spacer comprises:

a first fence spacer formed from the first spacer layer; and a second fence spacer formed from the second spacer layer.

10. The method of claim 8, wherein the source/drain patterns are formed by a selective epitaxial growth process.

11. The method of claim 10, wherein the source/drain patterns are formed using inner surfaces of the recesses as seed layers.

12. The method of claim 8, wherein top surfaces of the source/drain patterns are higher than a top surface of the fence spacer.

13. A method of fabricating a semiconductor device, comprising:

forming active patterns extending in a second direction on a substrate, the substrate comprising a first region and a second region;

forming sacrificial gate patterns crossing the active patterns and extending in a first direction;

forming a first spacer layer on side surfaces of the active patterns and side surfaces of the sacrificial gate patterns;

performing a first directional deposition process on the first spacer layer in the first direction and in a direction opposite to the first direction to form a second spacer layer on the first spacer layer;

removing portions of the active patterns that are exposed between the sacrificial gate patterns to form recesses between the sacrificial gate patterns;

forming source/drain patterns in the recesses; and replacing the sacrificial gate patterns with gate electrodes, wherein forming of the recesses comprises:

forming first recesses in the first region; and forming second recesses in the second region, wherein the forming of the source/drain patterns in the recesses comprises:

forming first source/drain patterns in the first recesses; and forming second source/drain patterns in the second recesses, and wherein the method further comprises forming a third spacer layer by performing a second directional deposition process between the forming of the first source/drain patterns and the forming of the second source/drain patterns.

14. The method of claim 13, wherein the first directional deposition process is an ion implantation directional deposition process, and the first directional deposition process comprises a first deposition process that is performed in the first direction, and a second deposition process that is performed in the direction opposite to the first direction.

15. The method of claim 14, wherein the first deposition process is performed at a first angle relative to a top surface of the substrate, and the second deposition process is performed at a second angle relative to the top surface of the substrate.

16. The method of claim 13, wherein the second spacer layer is formed to be thicker on the side surfaces of the active patterns than on the side surfaces of the sacrificial gate patterns.

17. The method of claim 13 wherein the forming of the recesses comprises:

removing portions of the first spacer layer to form a gate spacer on side surfaces of the sacrificial gate patterns.

18. The method of claim 17, wherein the forming of the recesses further comprises:

removing the second spacer layer from the side surfaces of the sacrificial gate patterns.

19. The method of claim 17, wherein the forming of the recesses comprises:

removing portions of the first spacer layer and the second spacer layer to form a fence spacer defining the recesses between the sacrificial gate patterns.

20. The method of claim 19, wherein the fence spacer comprises:

a first fence spacer formed from the first spacer layer; and a second fence spacer formed from the second spacer layer.

* * * * *